(12) United States Patent
Miyauchi et al.

(10) Patent No.: US 12,108,180 B2
(45) Date of Patent: Oct. 1, 2024

(54) SOLID-STATE IMAGING DEVICE, METHOD FOR MANUFACTURING SOLID-STATE IMAGING DEVICE, AND ELECTRONIC APPARATUS

(71) Applicant: Brillnics Singapore Pte. Ltd., Singapore (SG)

(72) Inventors: Ken Miyauchi, Tokyo (JP); Kazuya Mori, Tokyo (JP)

(73) Assignee: BRILLNICS SINGAPORE PTE. LTD., Singapore (SG)

( * ) Notice: Subject to any disclaimer, the term of this patent is extended or adjusted under 35 U.S.C. 154(b) by 111 days.

(21) Appl. No.: 17/916,418

(22) PCT Filed: Mar. 30, 2021

(86) PCT No.: PCT/JP2021/013633
§ 371 (c)(1),
(2) Date: Sep. 30, 2022

(87) PCT Pub. No.: WO2021/201000
PCT Pub. Date: Oct. 7, 2021

(65) Prior Publication Data
US 2023/0156369 A1    May 18, 2023

(30) Foreign Application Priority Data
Mar. 30, 2020  (JP) ................. 2020-060221

(51) Int. Cl.
*H01L 27/146* (2006.01)
*H04N 25/771* (2023.01)
(Continued)

(52) U.S. Cl.
CPC ..... *H04N 25/771* (2023.01); *H01L 27/14634* (2013.01); *H04N 25/78* (2023.01); *H04N 25/79* (2023.01)

(58) Field of Classification Search
CPC ...... H04N 25/771; H04N 25/78; H04N 25/79; H01L 27/14609; H01L 27/14634; H01L 27/14641; H01L 27/14643
See application file for complete search history.

(56) References Cited

U.S. PATENT DOCUMENTS

| | | | |
|---|---|---|---|
| 2002/0109160 A1* | 8/2002 | Mabuchi | H01L 27/14812 257/E27.152 |
| 2006/0175536 A1* | 8/2006 | Kim | H01L 27/14603 348/E3.018 |
| 2019/0020839 A1* | 1/2019 | Velichko | H04N 25/771 |

FOREIGN PATENT DOCUMENTS

| | | |
|---|---|---|
| JP | 2006-302970 A | 11/2006 |
| JP | 2007-81033 A | 3/2007 |
| JP | 2018-93392 A | 6/2018 |

* cited by examiner

*Primary Examiner* — Lin Ye
*Assistant Examiner* — Chriss S Yoder, III
(74) *Attorney, Agent, or Firm* — Pillsbury Winthrop Shaw

(57) ABSTRACT

A source follower element is adjacent to a first lateral part of a floating diffusion in a first direction orthogonal to the first lateral part, a reset element is adjacent to a second lateral part of the floating diffusion in the first direction, and the floating diffusion and the source follower element are connected through a wiring. Some of the photoelectric conversion elements are adjacent to each other in a second direction and spaced away from each other with a first spacing therebetween that allows at least the source follower element and the reset element to be formed therein. Some of the photoelectric conversion elements are adjacent to each other in the first direction and spaced away from each other with a second spacing therebetween that is less than the first spacing.

13 Claims, 31 Drawing Sheets

(51) Int. Cl.
*H04N 25/78* (2023.01)
*H04N 25/79* (2023.01)

| Layout | FD node cap (NCAP) | Wiring cap (WCAP) | Total cap (TCAP) | Pixel size (PSZ) |
|---|---|---|---|---|
| Present Invention | 0.5 | 0.5 | 1 | 1.5 μm |
| 1st Comparative Example | 1 | 0.5 | 1.5 | 2 μm |
| 2nd Comparative Example | 0.5 | 1 | 1.5 | 1.5 μm |

Fig. 14

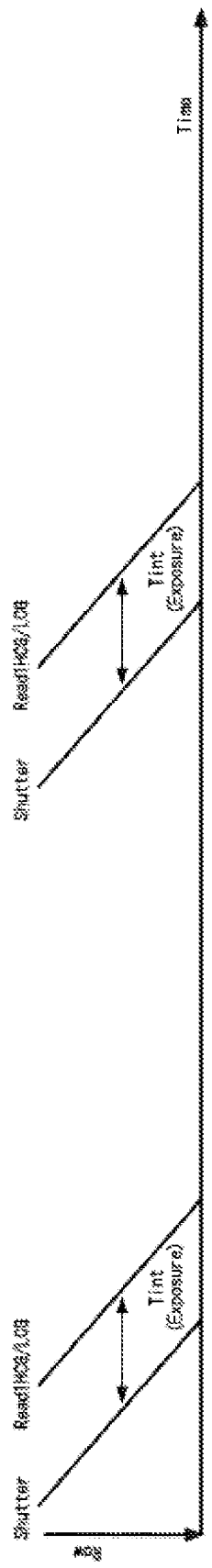

SOLID-STATE IMAGING DEVICE, METHOD FOR MANUFACTURING SOLID-STATE IMAGING DEVICE, AND ELECTRONIC APPARATUS

RELATED PATENT APPLICATIONS

This application is the U.S. National Phase Application of PCT/JP2021/13633, filed on Mar. 30, 2021, which claims the benefit of priority from Japanese Patent Application Serial No. 2020-060221 (filed on Mar. 30, 2020), the contents of which are incorporated herein by reference in entirety.

TECHNICAL FIELD

The present invention relates to a solid-state imaging device, a method for manufacturing a solid-state imaging device, and an electronic apparatus.

BACKGROUND

Solid-state imaging devices (image sensors) including photoelectric conversion elements for detecting light and generating charges are embodied as CMOS (complementary metal oxide semiconductor) image sensors, which have been in practical use. The CMOS image sensors have been widely applied as parts of various types of electronic apparatuses such as digital cameras, video cameras, surveillance cameras, medical endoscopes, personal computers (PCs), mobile phones and other portable terminals (mobile devices).

The CMOS image sensor includes, for each pixel, a photodiode (a photoelectric conversion element) and a floating diffusion (FD) amplifier having a floating diffusion (FD). The mainstream design of the reading operation in the CMOS image sensor is a column parallel output processing of selecting one of the rows in the pixel array and reading the pixels in the selected row simultaneously in the column output direction.

Each pixel of the CMOS image sensor generally includes, for one photodiode for example, four active elements: a transfer transistor serving as a transfer element, a reset transistor serving as a reset element, a source follower transistor serving as a source follower element (an amplification element), and a selection transistor serving as a selection element.

In recent years, the increase in number of pixels in the CMOS image sensors lead to an enhanced demand for a reduction in size of the pixels. To deal with this demand, multiple-pixel sharing technique has been proposed, according to which one floating diffusion FD, one reset transistor, one source follower transistor and one selection transistor are shared between a plurality of pairs of a photodiode and a transfer transistor.

FIG. 1 is a circuit diagram showing an example of the pixels of a CMOS image sensor having a two-pixel sharing configuration in which one floating diffusion FD, one reset transistor, one source follower transistor, and one selection transistor are shared by two sets of a photodiode and a transfer transistor (see, for example, Patent Literature 1).

A sharing pixel PXL1 shown in FIG. 1 includes, for example, a first photodiode PD0, which serves as a first photoelectric conversion element, and a second photodiode PD1, which serves as a second photoelectric conversion element. In the sharing pixel PXL1, the first and second photodiodes PD0 and PD1 share a floating diffusion FD, which serves as an output node.

The first and second photodiodes PD0 and PD1 perform photoelectric conversion to generate charges and store the generated charges in an integration period. A first transfer transistor TG0-Tr is connected between the storage part of the first photodiode PD0 and the floating diffusion FD. A second transfer transistor TG1-Tr is connected between the storage part of the second photodiode PD1 and the floating diffusion FD.

The sharing pixel PXL1 includes, for one floating diffusion FD serving as the output node, one reset transistor RST-Tr serving as a reset element, one source follower transistor SF-Tr serving as a source follower element, and one selection transistor SEL-Tr serving as a selection element.

FIG. 2 is a simplified plan view showing a two-pixel sharing scheme, specifically showing, as an example, how two sets of a photodiode and a transfer transistor, one floating diffusion FD, one reset transistor, one source follower transistor, and one selection transistor are arranged.

The sharing pixel PXL1 has a rectangular region RCT1 where the elements are formed. The rectangular region RCT1 can be divided into a central region CTAR1 positioned in the center, and a first region FSAR1 and a second region SCAR1 sandwiching the central region CTAR1 therebetween (in the Y direction).

In the central region CTAR1, the floating diffusion FD is formed in the X- and Y-direction-wise central portion thereof, the reset transistor RST-Tr is formed on the right side of the floating diffusion FD in the X direction, and the source follower transistor SF-Tr and the selection transistor SEL-Tr are formed on the left side of the floating diffusion FD in the X direction. The relative positions represented by the terms such as left and right can be only example and modified in any other manners than the illustrated example.

The first photodiode PD0 and the first transfer transistor TG0-Tr are adjacent to each other in the first region FSAR1. As shown in the example of FIG. 2, the first transfer transistor TG0-Tr is shaped like a rectangle, arranged closer to the central region CTAR1, and connected to the floating diffusion FD.

In the second region SCAR1, the second photodiode PD1 and the second transfer transistor TG1-Tr are formed. As shown in the example of FIG. 2, the second transfer transistor TG1-Tr is arranged closer to the central region CTAR1 and connected to the floating diffusion FD.

The configuration shown in FIGS. 1 and 2 enables two pixels to share their pixel components, so that the photodiode PD per pixel can have a maximized size. This can contribute to reduce the size of the pixels while the sensitivity and full well capacity remain unchanged.

FIG. 3 is a circuit diagram showing an example of the pixels of a CMOS image sensor pixel having a four-pixel sharing configuration in which one floating diffusion FD, one reset transistor, one source follower transistor, and one selection transistor are shared by four sets of a photodiode and a transfer transistor (see, for example, Patent Literature 2).

A sharing pixel PXL2 shown in FIG. 3 includes, in addition to the components of the pixel PXL1 shown in FIG. 1, a third photodiode PD2, which serves as a third photoelectric conversion element, and a fourth photodiode PD3, which serves as a fourth photoelectric conversion element. More specifically, in the sharing pixel PXL2, the first, second, third and fourth photodiodes PD0, PD1, PD2 and PD3 share a floating diffusion FD, which serves as an output node.

The first, second, third and fourth photodiodes PD0, PD1, PD2 and PD3 perform photoelectric conversion to generate charges and store the generated charges in the respective integration periods. A first transfer transistor TG0-Tr is connected between the storage part of the first photodiode PD0 and the floating diffusion FD. A second transfer transistor TG1-Tr is connected between the storage part of the second photodiode PD1 and the floating diffusion FD. A third transfer transistor TG2-Tr is connected between the storage part of the third photodiode PD2 and the floating diffusion FD. A fourth transfer transistor TG3-Tr is connected between the storage part of the fourth photodiode PD3 and the floating diffusion FD.

FIG. 4 is a simplified plan view showing a first example of the four-pixel sharing configuration, based on the same concept as the configuration shown in FIG. 2, specifically showing how four sets of a photodiode and a transfer transistor, one floating diffusion FD, one reset transistor, one source follower transistor, and one selection transistor are arranged.

The sharing pixel PXL2 has a rectangular region RCT2 where the elements are formed. The rectangular region RCT2 can be divided into a central region CTAR2 positioned in the center, and a first region FSAR2 and a second region SCAR2 sandwiching the central region CTAR2 therebetween (in the Y direction).

In the central region CTAR2, the floating diffusion FD is formed in the X- and Y-direction-wise central portion thereof, the reset transistor RST-Tr is formed on the right side of the floating diffusion FD in the X direction, and the source follower transistor SF-Tr and the selection transistor SEL-Tr are formed on the left side of the floating diffusion FD in the X direction. The relative positions represented by the terms such as left and right can be only example and modified in any other manners than the illustrated example.

In the first region FSAR2, the first photodiode PD0, the first transfer transistor TG0-Tr, the third photodiode PD2 and the third transfer transistor TG2-Tr are adjacent to each other. In the example shown in FIG. 4, the first photodiode PD0 and the first transfer transistor TG0-Tr are formed in the left part (left half) of the first region FSAR2, and the third photodiode PD2 and the third transfer transistor TG2-Tr are formed in the right part (right half) of the first region FSAR2. The first and third transfer transistors TG0-Tr and TG2-Tr are shaped like a rectangle, arranged closer to the central region CTAR2 and connected to the floating diffusion FD.

In the second region SCAR2, the second photodiode PD1, the second transfer transistor TG1-Tr, the fourth photodiode PD3 and the fourth transfer transistor TG3-Tr are adjacent to each other. In the example shown in FIG. 4, the second photodiode PD1 and the second transfer transistor TG1-Tr are formed in the left part (left half) of the second region SCAR2, and the fourth photodiode PD3 and the fourth transfer transistor TG3-Tr are formed in the right part (right half) of the second region SCAR2. The second and fourth transfer transistors TG1-Tr and TG3-Tr are shaped like a rectangle, arranged closer to the central region CTAR2, and connected to the floating diffusion FD.

The configuration shown in FIGS. 3 and 4 enables four pixels to share their pixel components, so that the photodiode PD per pixel can have a maximized size. This can contribute to reduce the size of the pixels while the sensitivity and full well capacity remain unchanged.

FIG. 5 is a simplified plan view showing a second example of the four-pixel sharing, specifically showing how the four sets of a photodiode and a transfer transistor, one floating diffusion FD, one reset transistor, one source follower transistor, and one selection transistor are arranged.

A sharing pixel PXL3 shown in FIG. 5 has a configuration relating to a modification example of the four-pixel sharing, with eight pixels sharing two floating diffusions FD (see, for example, Patent Literature 3). The sharing pixel PXL3 shown in FIG. 5 has, in comparison with the four-pixel sharing configuration shown in FIG. 4, a first light receiving region RLT1 and a second light receiving region RLT2 where four photodiodes PD0 to PD3 and transfer transistors TG0-Tr to TG3-Tr are formed.

The sharing pixel PXL3 further includes a first group of transistor GTR1 and a second group of transistors GTR2. The first group of transistors GTR1 includes a source follower transistor SF Tr and a selection transistor SEL-Tr. The second group of transistors GTR2 includes a reset transistors RST1-Tr and a dummy reset transistor RST2-Tr.

Although one reset transistor RST-Tr is sufficient, the second group of transistors GTR2 includes the dummy reset transistor RST2-Tr to allow the first and second groups of transistors GTR1 and GTR2 have symmetry in layout.

In the sharing pixel PXL3 with the above configuration, symmetry is exhibited between the arrangement of the first light receiving region RLT1 and the first group of transistors GTR1 and the arrangement of the second light receiving region RLT2 and the second group of transistors GTR2, with the floating diffusion FD being positioned at the optical center. This can contribute to reduce variability in sensitivity (output) characteristics between pixels of the same color.

RELEVANT REFERENCES

List of Relevant Patent Literature

Patent Literature 1: Japanese Patent Application Publication No. 2007-81033
Patent Literature 2: Japanese Patent Application Publication No. 2006-302970
Patent Literature 3: Japanese Patent Application Publication No. 2018-93392

SUMMARY

In the above-described sharing pixel PXL1 of the two-pixel sharing configuration, two pixels share their pixel components, so that the photodiode PD per pixel can have a maximized size. This can contribute to reduce the size of the pixels while the sensitivity and full well capacity remain unchanged.

The sharing pixel PXL1 shown in FIG. 2, however, achieves only limited success in reducing the size of the pixels since the number of elements per sharing pixel is greater than in the sharing pixels PXL2 and PXL3 having the four-pixel sharing configuration.

The above-described sharing pixel PXL2 of the four-pixel sharing configuration enables four pixels to share their pixel components, so that the photodiode PD per pixel can have a maximized size. This can contribute to reduce the size of the pixels while the sensitivity and full well capacity remain unchanged.

In the sharing pixel PXL2 in FIG. 4, however, the floating diffusion FD has a large area. This disadvantageously increases the capacitance of the floating diffusion FD, which lowers the conversion gain and increases the noise.

In the sharing pixel PXL3 shown in FIG. 5, for example, the photodiodes PD are radially arranged around the floating diffusion FD. If the photodiodes PD are arranged around the diffusion layer portion of the floating diffusion FD as shown in FIG. 5, the reset transistor RST-Tr cannot be adjacently placed. This requires that the diffusion layer portion of the floating diffusion FD be additionally provided in regions other than the center, for example, in the pixel separation region or at the edge of the pixels, to allow connection to be established through wiring. This in turn increases the junction capacitance and the wiring capacitance for electrical connection, which disadvantageously increases the capacitance (Cfd) of the FD node, reduces the conversion gain and causes the noise characteristics to drop.

Generally, the signal (overflow charges) exceeding the charges that can be stored on a certain photodiode PD may flow into adjacent pixels, which can result in mixing of charges (causing a false signal). To prevent this, the overflow charges from the certain photodiode are guided to flow into the connected floating diffusion FD before leaking out into adjacent pixels. When this configuration is applied, a false signal may be generated while the charges in the floating diffusion FD are being read out if charges leak into the floating diffusion from the pixels with which the certain photodiode shares the floating diffusion FD. For example, in the case of the Bayer array, if overflow charges of the G signal leak out while the R signal is being read out, the charges may mix together at the floating diffusion FD serving as an output node.

An object of the present invention is to provide a solid-state imaging device, a method for manufacturing a solid-state imaging device and an electronic apparatus that are capable of not only reducing the size of the pixels while the sensitivity and full well capacity remain unchanged but also preventing an increase in junction capacitance and wiring capacitance and an increase in the capacitance of the floating diffusion serving as an output node, to prevent a drop in conversion gain and eventually achieve improved noise characteristics. In addition, an object of the present invention is to provide a solid-state imaging device, a method for manufacturing a solid-state imaging device and an electronic apparatus that are capable of not only reducing the size of the pixels while the sensitivity and full well capacity remain unchanged but also preventing an increase in junction capacitance and wiring capacitance and an increase in the capacitance of the floating diffusion serving as an output node, to prevent a drop in conversion gain and eventually achieve improved noise characteristics, and also preventing the charges of different pixels from mixing together at the floating diffusion.

A first aspect of the present invention provides a solid-state imaging device including a pixel part having sharing pixels arranged therein, where each sharing pixel is configured to perform photoelectric conversion. The each sharing pixel has: at least three photoelectric conversion elements for storing therein, in an integration period, charges generated by photoelectric conversion; a plurality of transfer elements for individually transferring, in a transfer period following the integration period, the charges stored in the photoelectric conversion elements; a floating diffusion serving as an output node to which the charges stored in each of the photoelectric conversion elements are transferred through a corresponding one of the transfer elements; a reset element for resetting, in a reset period, the floating diffusion to a predetermined potential; and a source follower element serving as an output buffer part for converting the charges in the floating diffusion into a voltage signal at a level determined by an amount of the charges and outputting the voltage signal. One floating diffusion and one source follower element are shared between the photoelectric conversion elements and between the transfer elements, the floating diffusion is arranged at a center of an element formation region, and the photoelectric conversion elements are radially arranged around the floating diffusion, the floating diffusion has a first lateral part and a second lateral part facing each other, the source follower element is adjacent to the first lateral part of the floating diffusion in a first direction orthogonal to the first lateral part, and the reset element is adjacent to the second lateral part of the floating diffusion in the first direction, the floating diffusion and the source follower element are connected together via a wiring, any ones of the photoelectric conversion elements that are adjacent to each other in a second direction are spaced away from each other with a first spacing therebetween that allows at least the source follower element and the reset element to be formed, any ones of the photoelectric conversion elements that are adjacent to each other in the first direction are spaced away from each other with a second spacing therebetween that is less than the first spacing, and the transfer elements are provided to establish connection between (i) first-lateral-part edges of the floating diffusion at which the first lateral part terminates in the second direction and (ii) first edges of the photoelectric conversion elements facing the first-lateral-part edges, and between (I) second-lateral-part edges of the floating diffusion at which the second lateral part terminates in the second direction and (II) first edges of the photoelectric conversion elements facing the second-lateral-part edges.

A second aspect of the present invention provides a method for manufacturing a solid-state imaging device including a pixel part having sharing pixels arranged therein, where each sharing pixel is configured to perform photoelectric conversion. The each sharing pixel includes: at least three photoelectric conversion elements for storing therein, in an integration period, charges generated by photoelectric conversion; a plurality of transfer elements for individually transferring, in a transfer period following the integration period, the charges stored in the photoelectric conversion elements; a floating diffusion serving as an output node to which the charges stored in each of the photoelectric conversion elements are transferred through a corresponding one of the transfer elements; a reset element for resetting, in a reset period, the floating diffusion to a predetermined potential; and a source follower element serving as an output buffer part for converting the charges in the floating diffusion into a voltage signal at a level determined by an amount of the charges and outputting the voltage signal. One floating diffusion and one source follower element are shared between the photoelectric conversion elements and between the transfer elements, and the floating diffusion is arranged at a center of an element formation region, and the photoelectric conversion elements are radially arranged around the floating diffusion. The floating diffusion has a first lateral part and a second lateral part facing each other, the source follower element is adjacent to the first lateral part of the floating diffusion in a first direction orthogonal to the first lateral part, and the reset element is adjacent to the second lateral part of the floating diffusion in the first direction, the floating diffusion and the source follower element are connected together via a wiring, any ones of the photoelectric conversion elements that are adjacent to each other in a second direction are spaced away from each other with a first spacing therebetween that allows at least the source follower element and the reset element to be formed, any ones of the photoelectric conversion elements that are adjacent to each other in the first direction are spaced away from each other with a second spacing therebetween that is less than the first spacing, and the transfer elements are provided to establish connection between (i) first-lateral-part edges of the floating diffusion at which the first lateral part terminates in the second direction and (ii) first edges of the photoelectric conversion elements facing the first-lateral-part edges, and between (I) second-lateral-part edges of the floating diffusion at which the second lateral part terminates in the second direction and (II) first edges of the photoelectric conversion elements facing the second-lateral-part edges.

A third aspect of the present invention provides an electronic apparatus including a solid-state imaging device, and an optical system for forming a subject image on the solid-state imaging device. The solid-state imaging device includes a pixel part having sharing pixels arranged therein, where each sharing pixel is configured to perform photoelectric conversion. The each sharing pixel has: at least three photoelectric conversion elements for storing therein, in an integration period, charges generated by photoelectric conversion; a plurality of transfer elements for individually transferring, in a transfer period following the integration period, the charges stored in the photoelectric conversion elements; a floating diffusion serving as an output node to which the charges stored in each of the photoelectric conversion elements are transferred through a corresponding one of the transfer elements; a reset element for resetting, in a reset period, the floating diffusion to a predetermined potential; and a source follower element serving as an output buffer part for converting the charges in the floating diffusion into a voltage signal at a level determined by an amount of the charges and outputting the voltage signal. One floating diffusion and one source follower element are shared between the photoelectric conversion elements and between the transfer elements, the floating diffusion is arranged at a center of an element formation region, and the photoelectric conversion elements are radially arranged around the floating diffusion, the floating diffusion has a first lateral part and a second lateral part facing each other, the source follower element is adjacent to the first lateral part of the floating diffusion in a first direction orthogonal to the first lateral part, and the reset element is adjacent to the second lateral part of the floating diffusion in the first direction, the floating diffusion and the source follower element are connected together via a wiring, any ones of the photoelectric conversion elements that are adjacent to each other in a second direction are spaced away from each other with a first spacing therebetween that allows at least the source follower element and the reset element to be formed, any ones of the photoelectric conversion elements that are adjacent to each other in the first direction are spaced away from each other with a second spacing therebetween that is less than the first spacing, and the transfer elements are provided to establish connection between (i) first-lateral-part edges of the floating diffusion at which the first lateral part terminates in the second direction and (ii) first edges of the photoelectric conversion elements facing the first-lateral-part edges, and between (I) second-lateral-part edges of the floating diffusion at which the second lateral part terminates in the second direction and (II) first edges of the photoelectric conversion elements facing the second-lateral-part edges.

Advantageous Effects

The present invention can not only reduce the size of the pixels while the sensitivity and full well capacity remain unchanged but also prevent an increase in junction capacitance and wiring capacitance and an increase in the capacitance of the floating diffusion serving as an output node, to prevent a drop in conversion gain and eventually achieve improved noise characteristics. In addition, the present invention can not only reduce the size of the pixels while the sensitivity and full well capacity remain unchanged but also prevent an increase in junction capacitance and wiring capacitance and an increase in the capacitance of the floating diffusion serving as an output node, to prevent a drop in conversion gain and eventually achieve improved noise characteristics, and also prevent the charges of different pixels from mixing together at the floating diffusion.

BRIEF DESCRIPTION OF THE DRAWINGS

FIG. 14 is a table showing the FD node capacitance, wiring capacitance, their total capacitance, and size of the pixels observed when the layout of the solid-state imaging device relating to the first embodiment of the present invention, the layout of the first comparative example and the layout of the second comparative example are applied.

FIGS. 23A, 23B and 23C show example timing charts to illustrate a rolling shutter read-out operation.

DESCRIPTION OF THE PREFERRED EMBODIMENTS

Embodiments of the present invention will be hereinafter described with reference to the drawings.

First Embodiment

Figure 6:
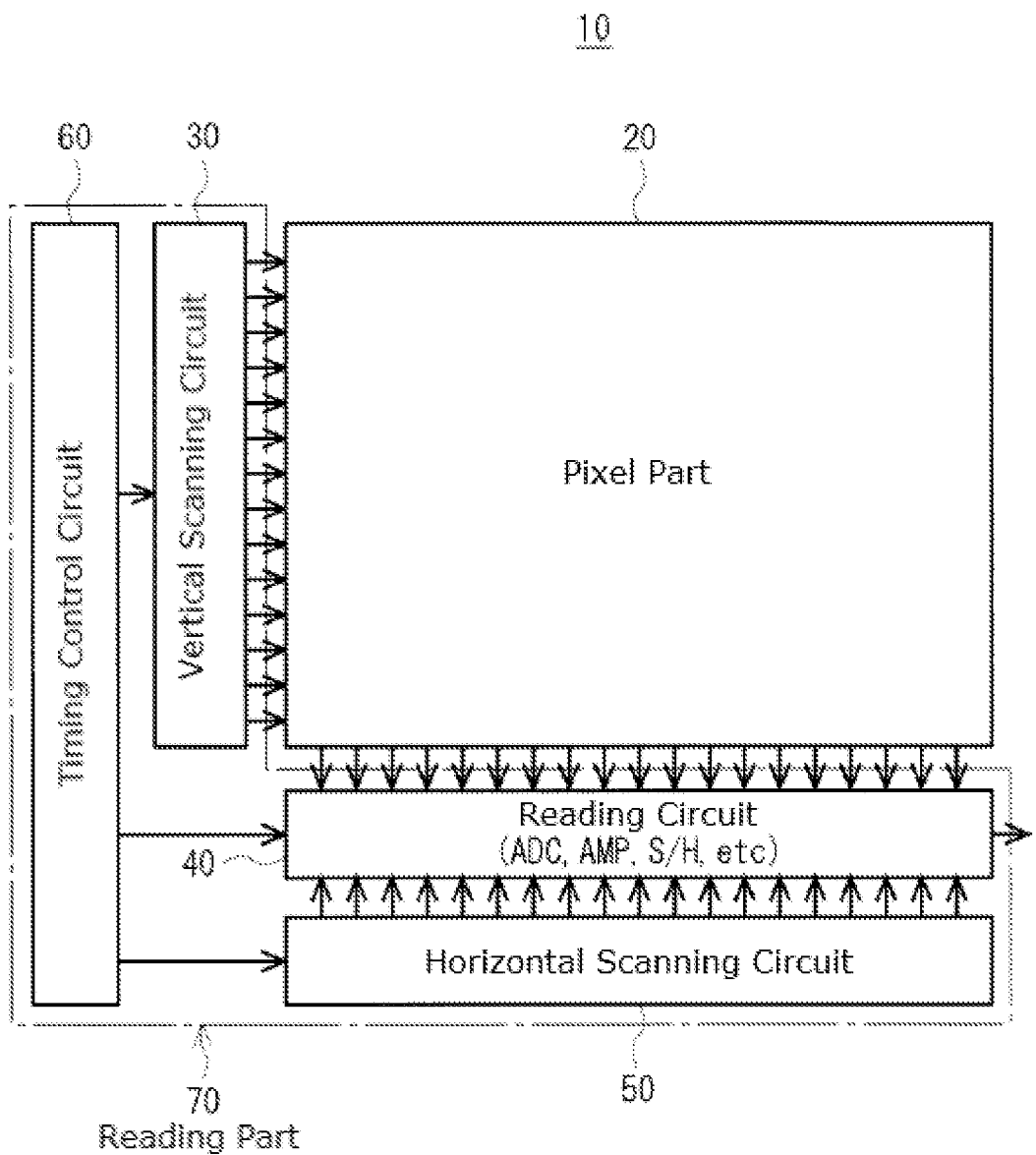
FIG. 6 is a block diagram showing an example configuration of a solid-state imaging device according to a first embodiment of the present invention.

FIG. 6 is a block diagram showing an example configuration of a solid-state imaging device relating to a first embodiment of the present invention. In this embodiment, a solid-state imaging device 10 is constituted by, for example, a CMOS image sensor.

As shown in FIG. 6, the solid-state imaging device 10 is constituted mainly by a pixel part 20 serving as an image capturing part, a vertical scanning circuit (a row scanning circuit) 30, a reading circuit (a column reading circuit) 40, a horizontal scanning circuit (a column scanning circuit) 50, and a timing control circuit 60. Among these components, for example, the vertical scanning circuit 30, the reading circuit 40, the horizontal scanning circuit 50, and the timing control circuit 60 constitute a reading part 70 for reading out pixel signals.

According to the first embodiment, the solid-state imaging device 10 has pixels (or the pixel part 20) arranged in a matrix pattern in the pixel part 20, as will be described in detail below. The pixels are configured such that at least three (in the present embodiment, four) photoelectric conversion elements (photodiodes) and transfer elements (transfer transistors) share one floating diffusion FD serving as an output node and one source follower element (source follower transistor) constituting an output buffer. The floating diffusion is placed at the center of the element formation area of the sharing pixel, and the photoelectric conversion elements are arranged radially (to form a square in the present embodiment) around the floating diffusion FD.

The sharing pixel of the solid-state imaging device 10 relating to the present embodiment has the following characteristic features to not only reduce the size of the pixels while the sensitivity and full well capacity remain unchanged but also prevent an increase in junction capacitance and wiring capacitance, preventing an increase in capacitance of the floating diffusion serving as an output node to prevent a drop in conversion gain, and eventually achieve improved noise characteristics. More specifically, the floating diffusion FD is shaped like a quadrilateral with all angles being 90 degrees (a rectangle in the present example) that has a first lateral part SDP1 and a second lateral part SDP2, which are opposite to each other, when seen from above, as described below. In the central part CTR of the element formation area, the source follower element is adjacent to the first lateral part SDP1 of the floating diffusion FD10 in a first direction (for example, an X direction) orthogonal to the first lateral part SDP1, a reset element is adjacent to the second lateral part SDP2 of the floating diffusion FD10 in the first direction, and the floating diffusion FD10 and the source follower element are connected through wiring.

Some of the photoelectric conversion elements are adjacent to each other in a second direction (for example, in a Y direction) and spaced away from each other with a first spacing D1 therebetween that allows at least the source follower element and the reset element (MOS transistor) to be formed therein. Some of the photoelectric conversion elements are adjacent to each other in the first direction and arranged with a second spacing D2 therebetween, which is less than the first spacing D1. Between (i) first-lateral-part edges SDT11 and SDT12, at which the first lateral part SDP1 of the floating diffusion FD10 terminates in the second direction, and (ii) first edges ED111 and ED112 of the photoelectric conversion elements facing the first-lateral-part edges SDT11 and SDT12, and between (I) second-lateral-part edges SDT21 and SDT22, at which the second lateral part SDP2 of the floating diffusion FD terminates in the second direction, and (II) first edges ED121 and ED122 of the photoelectric conversion elements facing the second-lateral-part edges SDT21 and SDT22, the respective corresponding transfer elements are provided for establishing connection. Each transfer element extends to bridge a corresponding one of the first- and second-lateral-part edges of the floating diffusion FD and a corresponding one of the photoelectric conversion elements.

The solid-state imaging device 10 may be configured to be capable of operating in a global shutter mode.

The following first outlines the configurations and functions of the parts of the solid-state imaging device 10, and then describes the configuration of the pinned photodiodes (PPD) and example arrangement of the elements in the sharing pixel.

<Configurations of Pixel Part 20 and Sharing Pixel PXL20>

Figure 7:
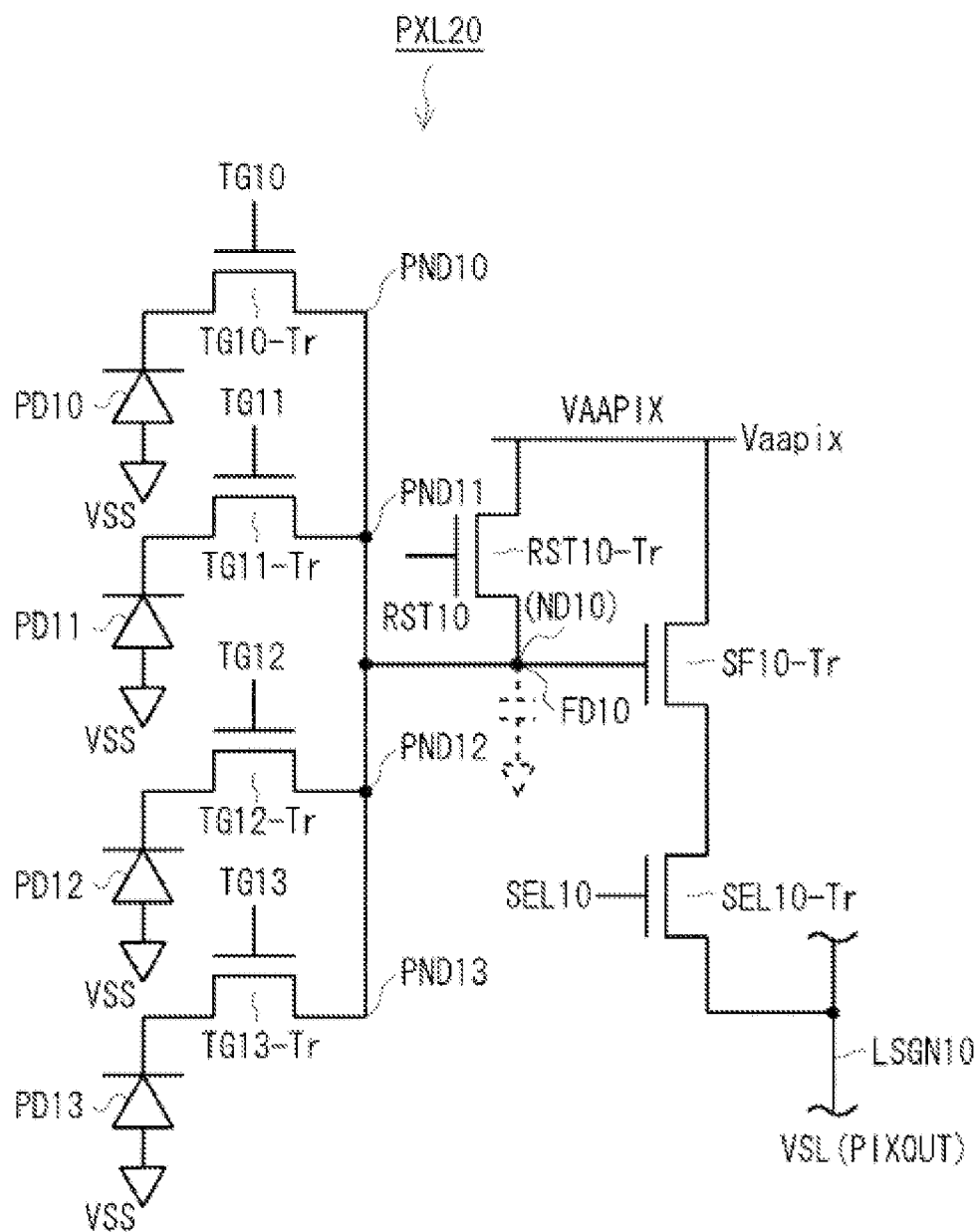
FIG. 7 is a circuit diagram showing an example of a sharing pixel of the solid-state imaging device relating to the first embodiment of the present invention.

FIG. 7 is a circuit diagram showing an example of the sharing pixel of the solid-state imaging device relating to the first embodiment of the present invention.

A sharing pixel PXL20 shown in FIG. 7 includes, for example, a first photodiode PD10, which is a first photoelectric conversion element, a second photodiode PD11, which is a second photoelectric conversion element, a third photodiode PD12, which is a third photoelectric conversion element, and a fourth photodiode PD13, which is a fourth photoelectric conversion element. In the sharing pixel PXL20, the first, second, third and fourth photodiodes PD10, PD11, PD12 and PD13 share a floating diffusion FD10, which serves as an output node ND10.

The first, second, third and fourth photodiodes PD10, PD11, PD12 and PD13 perform photoelectric conversion to generate charges and store the generated charges in the respective integration periods. A first transfer transistor TG10-Tr is connected between a storage part PND10 of the first photodiode PD10 and the floating diffusion FD10. A second transfer transistor TG11-Tr is connected between a storage part PND11 of the second photodiode PD11 and the floating diffusion FD10. A third transfer transistor TG12-Tr is connected between a storage part PND12 of the third photodiode PD12 and the floating diffusion FD10. A fourth transfer transistor TG13-Tr is connected between a storage part PND13 of the fourth photodiode PD13 and the floating diffusion FD10.

The sharing pixel PXL20 further includes, for one floating diffusion FD10 serving as an output node ND10, one reset transistor RST10-Tr serving as a reset element, one source follower transistor SF10-Tr serving as a source follower element, and one selection transistor SEL10-Tr serving as a selecting element.

The first, second, third and fourth photodiodes PD10, PD11, PD12 and PD13 generate signal charges (electrons) in an amount determined by the amount of the incident light and stores the same. Description will be hereinafter given of a case where the signal charges are electrons and each transistor is an n-type transistor. However, it is also possible that the signal charges are holes or each transistor is a p-type transistor.

The photodiodes (PDs) in the sharing pixel PXL20 are pinned photodiodes (PPDs). On a substrate surface for forming the photodiodes (PDs), there is a surface level due to dangling bonds or other defects, and therefore, a lot of charges (dark current) are generated due to heat energy, so that signals fail to be read out correctly. In the case of a pinned photodiode (PPD), a charge storage part of the photodiode (PD) is buried in the substrate to reduce mixing of the dark current into signals.

The first transfer transistor TG10-Tr of the sharing pixel PXL20 is connected between the first photodiode PD10 and the floating diffusion FD10 and controlled by a control signal TG10 applied to the gate thereof through a control line. The first transfer transistor TG10-Tr remains selected and in the conduction state during a transfer period PT in which the control signal TG10 is at the high (H) level, to transfer to the floating diffusion FD10 the charges (electrons) produced by the photoelectric conversion and then stored in the first photodiode PD10. After the first photodiode PD10 and the floating diffusion FD10 are reset to a predetermined reset potential, the first transfer transistor TG10-Tr enters the non-conduction state with the control signal TG10 being set at the low (L) level, and the first photodiode PD10 enters an integration period PI. Under these circumstances, if the intensity of the incident light is very high (the amount of the incident light is very large), the charges above the full well capacity overflow into the floating diffusion FD10 as overflow charges through the overflow path under the first transfer transistor TG10-Tr.

The second transfer transistor TG11-Tr of the sharing pixel PXL20 is connected between the second photodiode PD11 and the floating diffusion FD10 and controlled by a control signal TG11 applied to the gate thereof through a control line. The second transfer transistor TG11-Tr remains selected and in the conduction state during a transfer period PT in which the control signal TG11 is at the high (H) level, to transfer to the floating diffusion FD10 the charges (electrons) produced by the photoelectric conversion and then stored in the second photodiode PD11. After the second photodiode PD11 and the floating diffusion FD10 are reset to a predetermined reset potential, the second transfer transistor TG11-Tr enters the non-conduction state with the control signal TG11 being set at the low (L) level, and the second photodiode PD11 enters an integration period PI. Under these circumstances, if the intensity of the incident light is very high (the amount of the incident light is very large), the charges above the full well capacity overflow into the floating diffusion FD10 as overflow charges through the overflow path under the second transfer transistor TG11-Tr.

The third transfer transistor TG12-Tr of the sharing pixel PXL20 is connected between the third photodiode PD12 and the floating diffusion FD10 and controlled by a control signal TG12 applied to the gate thereof through a control line. The third transfer transistor TG12-Tr remains selected and in the conduction state during a transfer period PT in which the control signal TG12 is at the high (H) level, to transfer to the floating diffusion FD10 the charges (electrons) produced by the photoelectric conversion and then stored in the third photodiode PD12. After the third photodiode PD12 and the floating diffusion FD10 are reset to a predetermined reset potential, the third transfer transistor TG12-Tr enters the non-conduction state with the control signal TG12 being set at the low (L) level, and the third photodiode PD12 enters an integration period PI. Under these circumstances, if the intensity of the incident light is very high (the amount of the incident light is very large), the charges above the full well capacity overflow into the floating diffusion FD10 as overflow charges through the overflow path under the third transfer transistor TG12-Tr.

The fourth transfer transistor TG13-Tr of the sharing pixel PXL20 is connected between the fourth photodiode PD13 and the floating diffusion FD10 and controlled by a control signal TG13 applied to the gate thereof through a control line. The fourth transfer transistor TG13-Tr remains selected and in the conduction state during a transfer period PT in which the control signal TG13 is at the high (H) level, to transfer to the floating diffusion FD10 the charges (electrons) produced by the photoelectric conversion and then stored in the fourth photodiode PD13. After the fourth photodiode PD13 and the floating diffusion FD10 are reset to a predetermined reset potential, the fourth transfer transistor TG13-Tr enters the non-conduction state with the control signal TG13 being set at the low (L) level, and the fourth photodiode PD13 enters an integration period PI. Under these circumstances, if the intensity of the incident light is very high (the amount of the incident light is very large), the charges above the full well capacity overflow into the floating diffusion FD10 as overflow charges through the overflow path under the fourth transfer transistor TG13-Tr.

The reset transistor RST10-Tr is connected between a power supply line Vaapix of power supply voltage VAAPIX and the floating diffusion FD10 and controlled by a control signal RST10 applied to the gate thereof through a control line. The reset transistor RST10-Tr remains selected and in the conduction state during a reset period in which the control signal RST10 is at the H level, to reset the floating diffusion FD10 to the potential of the power supply line Vaapix of the power supply voltage VAAPIX.

The source follower transistor SF10-Tr and the selection transistor SEL10-Tr are connected in series between the power supply line Vaapix and a vertical signal line LSGN10. The gate of the source follower transistor SF10-Tr is connected to the floating diffusion FD10, and the selection transistor SEL10-Tr is controlled through a control signal SEL10. The source follower transistor SF10-Tr serving as a source follower element is connected at the source thereof to the selection transistor SEL10-Tr, at the drain thereof to the power supply line Vaapix, and at the gate thereof to the floating diffusion FD10. The output node ND10 constituting an output buffer part is connected to the vertical signal line LSGN10 via the selection transistor SEL10-Tr. The selection transistor SEL10-Tr remains selected and in the conduction state during a period in which the control signal SEL10 is at the H level. In this way, the source follower transistor SF10-Tr outputs, to the vertical signal line LSGN10, a read-out signal VSL (PIXOUT) of a column output, which is obtained by converting the charges of the floating diffusion FD10 with a gain into a voltage signal. These operations are performed simultaneously and in parallel for pixels in each row since, for example, the gates of the transfer transistors TG10-Tr, the reset transistors RST10-Tr, and the selection transistors SEL10-Tr in each row are connected to each other.

The vertical scanning circuit 30 drives the pixels in shutter and read-out rows through the row-scanning control lines under the control of the timing control circuit 60. Further, the vertical scanning circuit 30 outputs, according to address signals, row selection signals indicating row addresses of the read-out rows from which signals are to be read out and the shutter rows in which the charges accumulated in the photodiodes PD are reset.

As described above, in a normal pixel reading operation, the vertical scanning circuit 30 drives the pixels in such a manner that shutter scan is followed by reading scan.

The reading circuit 40 includes a plurality of column signal processing circuits (not shown) arranged corresponding to the column outputs of the pixel part 20, and the reading circuit 40 may be configured such that the plurality of column signal processing circuits can perform column parallel processing.

The reading circuit 40 may include a correlated double sampling (CDS) circuit, an analog-to-digital converter (ADC), an amplifier (AMP), a sample-and-hold (S/H) circuit, and the like.

Figure 8A:
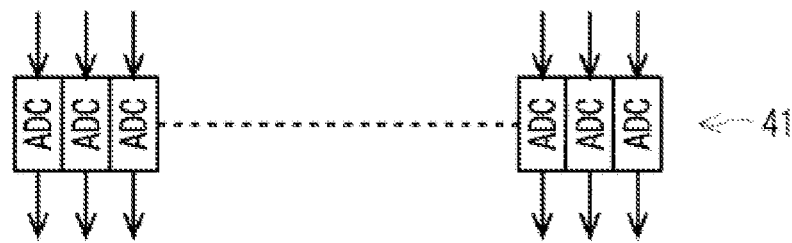
FIGS. 8A, 8B and 8C illustrate examples of the configuration of a reading system of a column output from a pixel part of the solid-state imaging device according to the embodiment of the present invention.
Figure 8B:
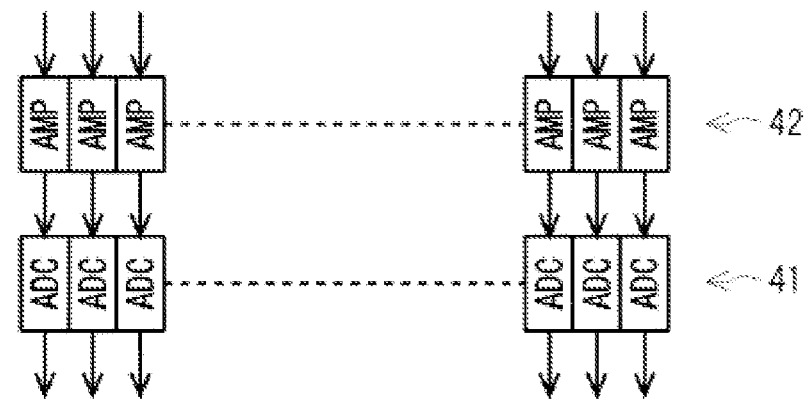
Figure 8C:
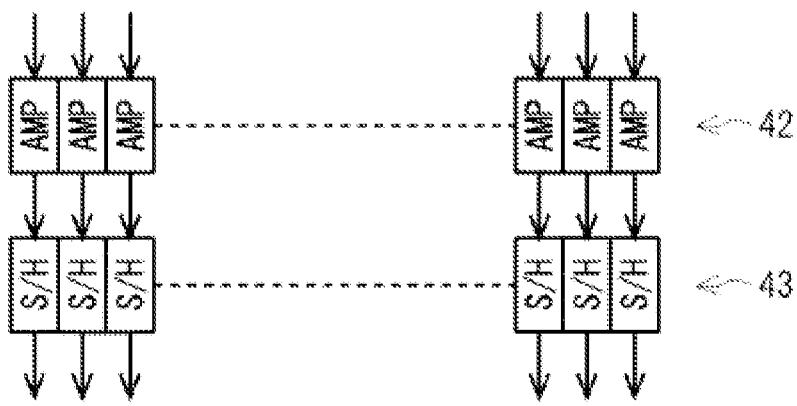

As mentioned above, as shown in FIG. 8A, for example, the reading circuit 40 may include ADCs 41 for converting the read-out signals VSL output from the respective columns of the pixel part 20 into digital signals. Alternatively, as shown in FIG. 8B, for example, the reading circuit 40 may include amplifiers (AMPs) 42 for amplifying the read-out signals VSL output from the respective columns of the pixel part 20. As yet another alternative, as shown in FIG. 8C, for example, the reading circuit 40 may include sample-and-hold (S/H) circuits 43 for sampling/holding the read-out signals VSL output from the respective columns of the pixel part 20.

The horizontal scanning circuit 50 scans the signals processed in the plurality of column signal processing circuits of the reading circuit 40 such as ADCs, transfers the signals in a horizontal direction, and outputs the signals to a signal processing circuit (not shown).

The timing control circuit 60 generates timing signals required for signal processing in the pixel part 20, the vertical scanning circuit 30, the reading circuit 40, the horizontal scanning circuit 50, and the like.

The above description has described the configurations and functions of the parts of the solid-state imaging device 10 relating to the first embodiment. The following now describes, as an example, the specific configuration of the pinned photodiodes PPD serving as the photoelectric conversion parts relating to the first embodiment and how the pixels are arranged.

<Specific Configuration of Pinned Photodiodes PDs>

Figure 9:
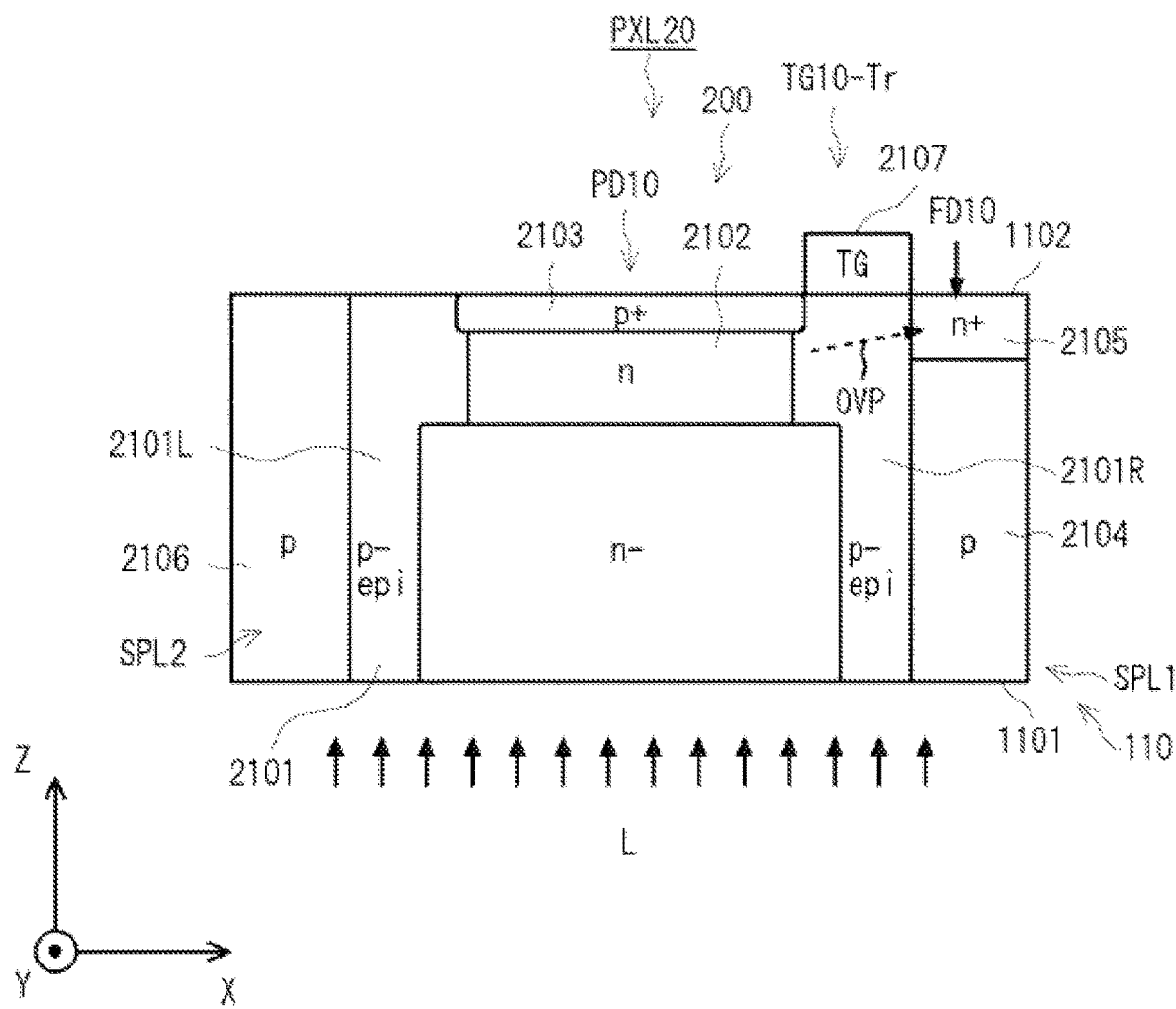
FIG. 9 is a simplified sectional view showing an example configuration of the main part of the sharing pixel of the solid-state imaging device relating to the first embodiment of the present invention, or a charge integrating and transferring system including a pinned photodiode and a transfer transistor.

The following now describes, as an example, the specific configuration of the pinned photodiodes PD constituting the sharing pixel PXL20 of the solid-state imaging device 10 relating to the first embodiment with reference to FIG. 9.

FIG. 9 is a simplified sectional view showing an example configuration of the main part of the sharing pixel PXL20 of the solid-state imaging device relating to the first embodiment of the present invention, or a charge integrating and transferring system including the pinned photodiodes PD and transfer transistors. In the following, a reference number 200 indicates the pinned photodiode (PPD) portion.

The sharing pixel PXL20 is formed in a substrate (in the present example, a first substrate 110) having a first substrate surface 1101 (for example, back surface) irradiated with light L and a second substrate surface 1102 that opposes the first substrate surface 1101 and defined by a separation layer SPL. The sharing pixel PXL20 relating to the present embodiment shown in FIG. 9 includes, for example, the first photodiode PD10, the first transfer transistor TG10-Tr, the floating diffusion FD10, and the separation layer SPL, and also includes a color filter part and a microlens, which are not shown.

Although a back-illuminated pixel is shown as an example in FIG. 9, the present invention may be applied to a front-illuminated pixel.

<Configuration of Photodiode>

The first photodiode PD10 includes a semiconductor layer of a first conductivity type (in the present embodiment, the n type) (in the present embodiment, the n layer) 2102 that is buried in an epitaxial layer (p-epi) 2101 of a second conductivity type (in the present embodiment, the p-type) in the semiconductor substrate having the first substrate surface 1101 and the second substrate surface 1102 opposing the first substrate surface 1101. The first photodiode PD10 is capable of photoelectrically convert the received light and storing charges. On the respective lateral portions of the first photodiode PD10 in the direction orthogonal to the normal to the substrate (the X direction), namely, on either side in the drawing, separation layers SPL (SPL1, SPL2) of the second conductivity type (in the present embodiment, the p type) are formed with epitaxial layers (p-epi) 2101R and 2101L sandwiched therebetween.

In the first photodiode PD10 shown in FIG. 9, the n layer (the first-conductivity-type semiconductor layer) 2102 has a p+ layer 2103 formed thereon on the second substrate surface 1102 side. A color filter part is formed on the light incidence surface of the epitaxial layer (p-epi) 2101, and a microlens is further formed on the light incidence surface of the color filter part such that the microlens can appropriately concentrate the light on the first photodiode PD10.

<Configuration of Separation Layer in X direction (Column Direction)>

An n+ layer 2105 serving as the floating diffusion FD10 is formed on the p-type separation layer 2104 (SPL1) on the second substrate surface 1102 side, which is arranged on the right side in the X direction (column direction) in FIG. 9. On the left side in the X direction (column direction) of FIG. 9, a p-type separation layer 2106 (SPL2) is formed. A gate electrode 2107 of the first transfer transistor TG10-Tr is formed on the epitaxial layer (p-epi) 2101R on the second substrate surface 1102 side with a gate insulator sandwiched therebetween. Under the first transfer transistor TG10-Tr, an overflow path OVP is formed extending from the first photodiode PD10 to the floating diffusion FD10. The potential of the overflow path OVP can also be controlled through gate control, for example.

The sharing pixel PXL20 relating to the first embodiment includes four PDs, one FD and other elements arranged characteristically in the following manner, to not only reduce the size of the pixels while the sensitivity and full well capacity remain unchanged but also prevent an increase in junction capacitance and wiring capacitance and prevent an increase in the capacitance of the floating diffusion FD10 serving as an output node to prevent a drop in conversion gain and eventually achieve improved noise characteristics.

(Example Arrangement of Four PDs and One FD in Sharing Pixel PXL20)

The following describes, as an example, how the four photodiodes PD10, PD11, PD12 and PD13, the four transfer transistors TG10-Tr, TG11-Tr, TG12-Tr and TG13-Tr, one floating diffusion FD10, one reset transistor RST10-Tr, one source follower transistor SF10-Tr, and one selection transistor SEL10-Tr are arranged in the sharing pixel PXL20. The relative positions of the elements represented by the terms such as left and right in the following description can be only example and modified in any other manners than the illustrated example.

Figure 10:
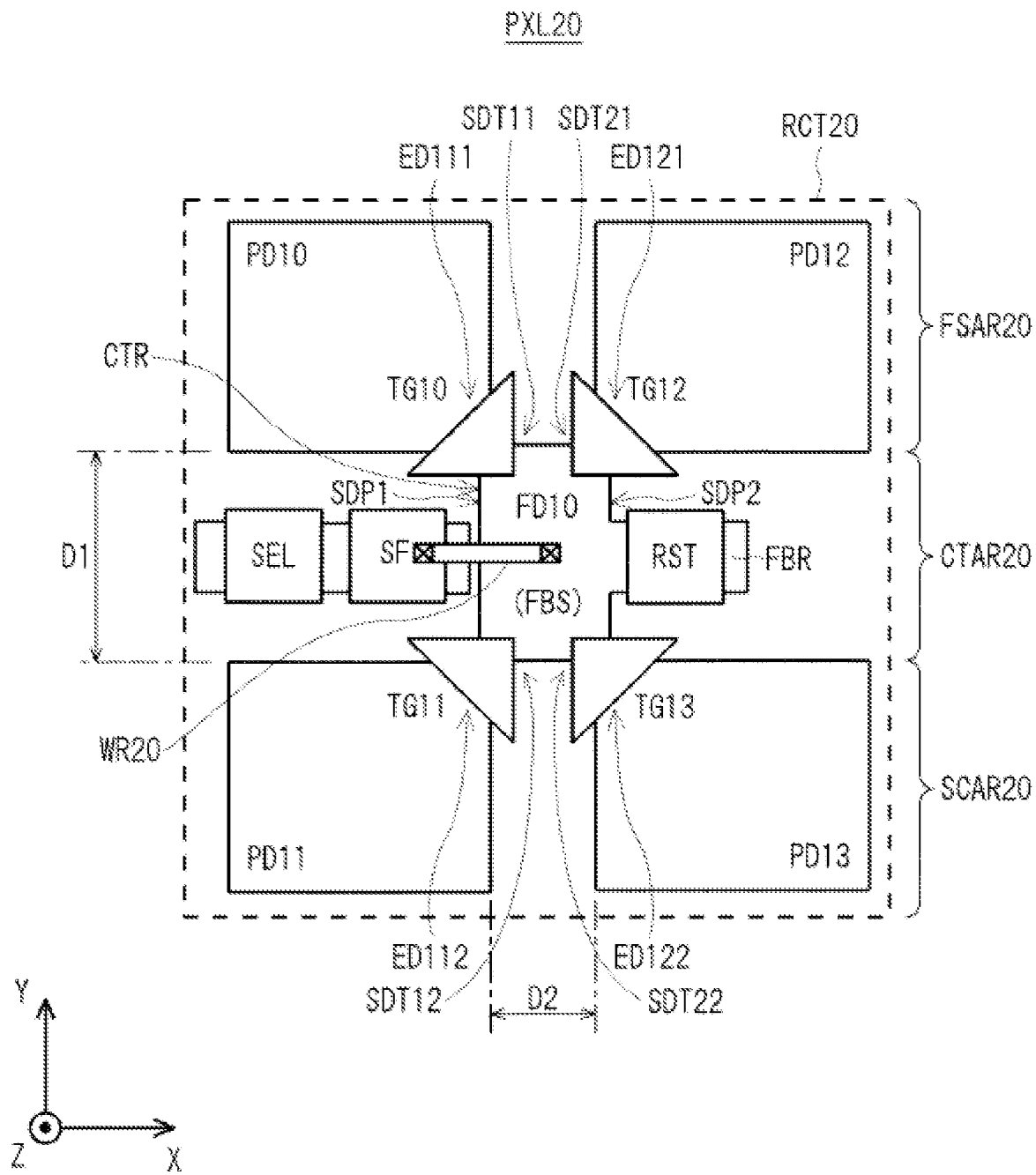
FIG. 10 is a simplified plan view showing, as an example, how four photodiodes, four transfer transistors, one floating diffusion FD, one reset transistor, one source follower transistor and one selection transistor are arranged in a sharing pixel relating to the first embodiment.

FIG. 10 is a simplified plan view showing, as an example, how the four photodiodes, four transfer transistors, one floating diffusion FD, one reset transistor, one source follower transistor and one selection transistor are arranged in the sharing pixel relating to the first embodiment.

The sharing pixel PXL20 has a rectangular region RCT20 where the elements are formed. The rectangular region RCT20 can be divided into a central region CTAR20 positioned in the center, and a first region FSAR20 and a second region SCAR20 sandwiching the central region CTAR20 therebetween (in the Y direction).

In the central region CTAR20, the floating diffusion FD10 is arranged in the X- and Y-direction-wise central portion thereof, the reset transistor RST10-Tr is arranged on the right side of the floating diffusion FD10 in the X direction, and the source follower transistor SF10-Tr and the selection transistor SEL10-Tr are arranged on the left side of the floating diffusion FD10 in the X direction.

The first photodiode PD10, the first transfer transistor TG10-Tr, the third photodiode PD12 and the third transfer transistor TG12-Tr are adjacent to each other in the X direction in the first region FSAR20. In the example shown in FIG. 10, the first photodiode PD10 and the first transfer transistor TG10-Tr are formed in the left part (left half) of the first region FSAR20, and the third photodiode PD12 and the third transfer transistor TG12-Tr are formed in the right part (right half) of the first region FSAR20. The first and third transfer transistors TG10-Tr and TG12-Tr are shaped like a triangle when seen from above, and formed near the central region CTAR20 such that they are connected to the floating diffusion FD10.

The second photodiode PD11, the second transfer transistor TG11-Tr, the fourth photodiode PD13 and the fourth transfer transistor TG13-Tr are adjacent to each other in the X direction in the second region SCAR20. In the example shown in FIG. 10, the second photodiode PD11 and the second transfer transistor TG11-Tr are formed in the left part (left half) of the second region SCAR20, and the fourth photodiode PD13 and the fourth transfer transistor TG13-Tr are formed in the right part (right half) of the second region SCAR20. The second and fourth transfer transistors TG11-Tr and TG13-Tr are shaped like a triangle when seen from above, and formed near the central region CTAR20 such that they are connected to the floating diffusion FD10.

In the sharing pixel PXL20 relating to the first embodiment, the floating diffusion FD10 has a diffusion layer, the core part FBS of which is shaped like a rectangle that has the first lateral part SDP1 and the second lateral part SDP2, which are opposite to each other, when seen from above. The core part FBS has a branch part FBR extending from the middle part of the second lateral part SDP2 in the X direction (to the right). The branch part FBR is formed to allow the reset transistor RST10-Tr to be formed. In other words, the floating diffusion FD10 is substantially T-shaped. In the central part CTR of the element formation area, the source follower transistor SF10-Tr is adjacent to the first lateral part SDP1 of the floating diffusion FD10 in the first direction (for example, the X direction) orthogonal to the first lateral part SDP1, and the reset transistor RST10-Tr is adjacent to the second lateral part SDP2 of the floating diffusion FD10 in the first direction. The floating diffusion FD10 and the source follower transistor SF10-Tr are connected together via a wiring WR20. The selection transistor SEL10-Tr is adjacent to the source follower transistor SF10-Tr, to be specific, on the left side in the X direction.

Some of the photodiodes are adjacent to each other in the second direction (e.g., in the Y direction). To be specific, the first photodiode PD10 and the second photodiode PD11, and the third photodiode PD12 and the fourth photodiode PD13, are spaced away from each other with the first spacing D1 therebetween that allows at least the source follower transistor SF10-Tr, the selection transistor SEL10-Tr, and the reset transistor RST10-Tr (MOS transistor) to be formed. Some of the photoelectric conversion elements are adjacent to each other in the first direction (in the X direction). To be specific, the first photodiode PD10 and the third photodiode PD12, and the second photodiode PD11 and the fourth photodiode PD13 are arranged with the second spacing D2, which is less than the first spacing D1 (D1>D2).

The first transfer transistor TG10-Tr is arranged (formed) to connect the first-lateral-part edge SDT11 (the upper left edge of the FD10 in FIG. 10), at which the first lateral part SDP1 of the floating diffusion FD10 terminates in the second direction (the Y direction), and the first edge (the lower right edge of the PD10 in FIG. 10) ED111 of the first photodiode PD10 that faces the first-lateral-part edge SDT11. Stated differently, the first transfer transistor TG10-Tr extends to bridge the first-lateral-part edge SDT11 of the floating diffusion FD10 and the first edge ED111 of the corresponding first photodiode PD10.

The second transfer transistor TG11-Tr is arranged (formed) to connect the first-lateral-part edge SDT12 (the lower left edge of the FD10 in FIG. 10), at which the first lateral part SDP1 of the floating diffusion FD10 terminates in the second direction (the Y direction), and the first edge (the upper right edge of the PD11 in FIG. 10) ED112 of the second photodiode PD11 that faces the first-lateral-part edge SDT12. Stated differently, the second transfer transistor TG11-Tr extends to bridge the first-lateral-part edge SDT12 of the floating diffusion FD10 and the first edge ED112 of the second photodiode PD11.

The third transfer transistor TG12-Tr is arranged (formed) to connect the second-lateral-part edge SDT21 (the upper right edge of the FD10 in FIG. 10), at which the second lateral part SDP2 of the floating diffusion FD10 terminates in the second direction (the Y direction), and the first edge (the lower left edge of the PD12 in FIG. 10) ED121 of the third photodiode PD12 that faces the second-lateral-part edge SDT21. Stated differently, the third transfer transistor TG12-Tr extends to bridge the second-lateral-part edge SDT21 of the floating diffusion FD10 and the first edge ED121 of the third photodiode PD12.

The fourth transfer transistor TG13-Tr is arranged (formed) to connect the second-lateral-part edge SDT22 (the lower right edge of the FD10 in FIG. 10), at which the second lateral part SDP2 of the floating diffusion FD10 terminates in the second direction (the Y direction), and the first edge (the upper left edge of the PD13 in FIG. 10) ED122 of the fourth photodiode PD13 that faces the second-lateral-part edge SDT22. Stated differently, the fourth transfer transistor TG13-Tr extends to bridge the second-lateral-part edge SDT22 of the floating diffusion FD10 and the first edge ED122 of the fourth photodiode PD13.

Figure 11:
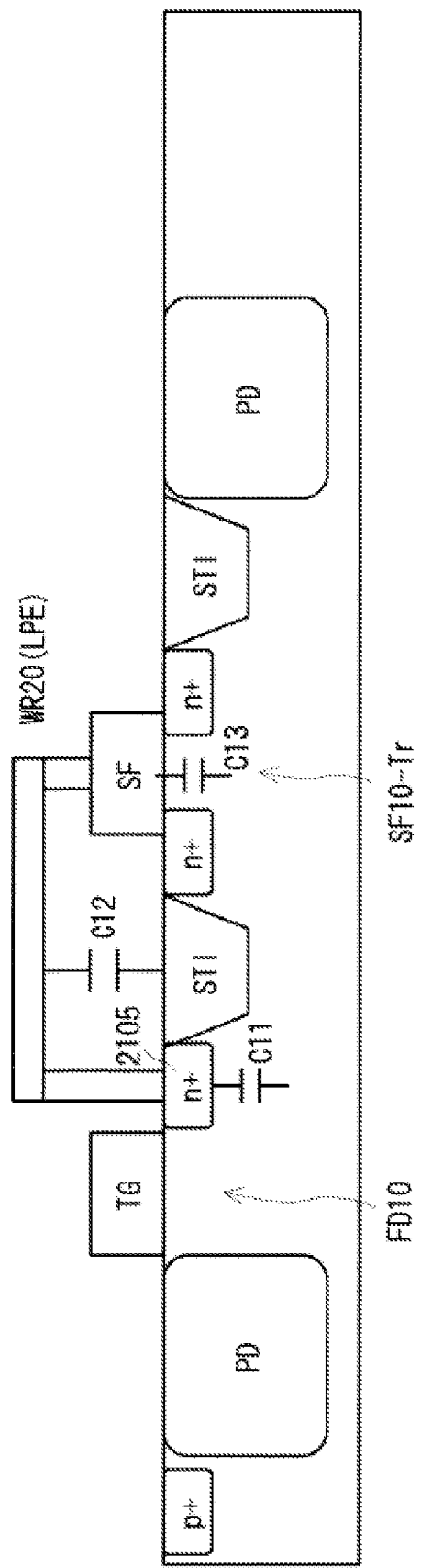
FIG. 11 is a simplified sectional view showing the main part of the sharing pixel relating to the first embodiment and used to illustrate additional capacitance components added to the capacitance of the floating diffusion.
Figure 12:
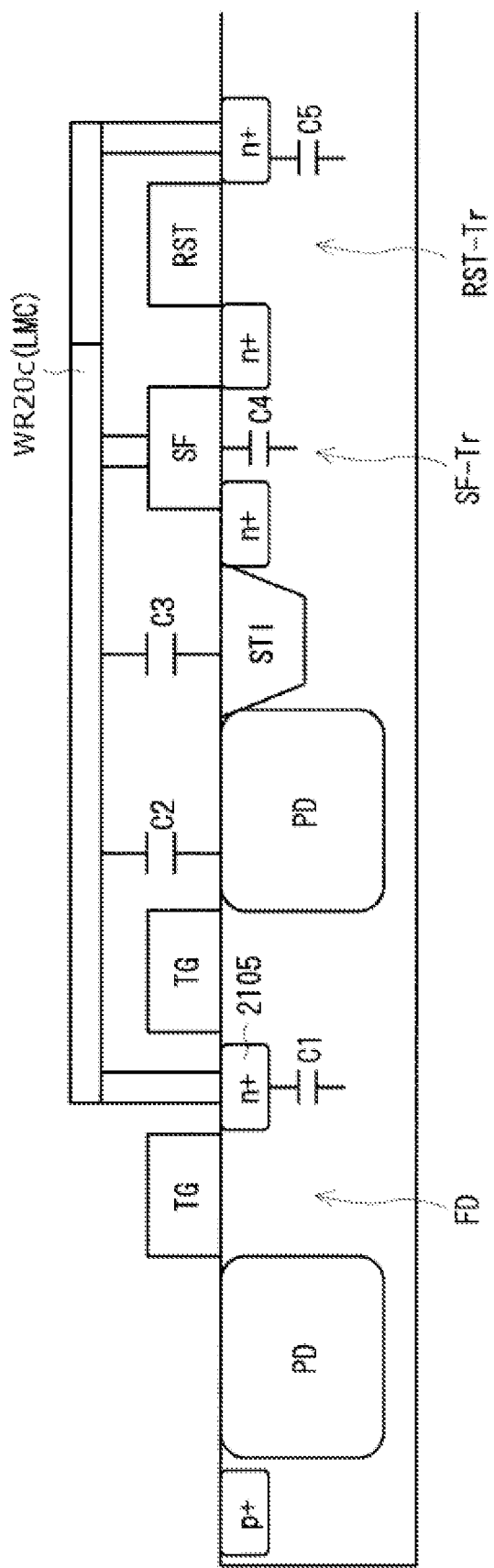
FIG. 12 is a simplified sectional view showing the main part of a sharing pixel of a comparative example that does not have the characteristic features of the sharing pixel relating to the first embodiment shown in FIG. 11, and used to illustrate additional capacitance components added to the capacitance of the floating diffusion.

FIG. 11 is a simplified sectional view showing the main part of the sharing pixel relating to the first embodiment and used to illustrate additional capacitance components added to the capacitance of the floating diffusion. FIG. 12 is a simplified sectional view showing the main part of a sharing pixel of a comparative example that does not have the characteristic features of the sharing pixel relating to the first embodiment shown in FIG. 11, and used to illustrate additional capacitance components added to the capacitance of the floating diffusion.

As described above, in the first embodiment, in the central part CTAR20 of the element formation area or between the photodiodes PD10 and PD11 and between the photodiodes PD12 and PD13, which are adjacent to each other in the Y direction, the source follower transistor SF10-Tr is adjacent to the first lateral part SDP1 of the floating diffusion FD10 in the first direction (for example, the X direction) orthogonal to the first lateral part SDP1, and the reset transistor RST10-Tr is adjacent to the second lateral part SDP2 of the floating diffusion FD10 in the first direction. The selection transistor SEL10-Tr is adjacent to the source follower transistor SF10-Tr, to be specific, on the left side in the X direction. As shown in FIG. 11, the floating diffusion FD10 and the source follower transistor SF10-Tr are connected together via the wiring WR20.

With the above-described configuration, the first embodiment can allow the wiring WR20, which is provided to connect the floating diffusion FD10 and the gate of the source follower transistor SF10-Tr, to be significantly shorter than in the comparative example shown in FIG. 12. In other words, in the comparative example shown in FIG. 12, the wiring length LMC of the wiring WR20c, which is connected to the floating diffusion FD10, extending from the source follower transistor SF10-Tr and the reset transistor RST-Tr is significantly greater than the wiring length LPE achieved by the arrangement relating to the present embodiment shown in FIG. 11. For this reason, the comparative example has such disadvantageous as an increase in the junction capacitance and the wiring capacitance for electrical connection, which disadvantageously increases the capacitance (Cfd) of the FD node, reduces the conversion gain and causes the noise characteristics to drop. In the comparative example shown in FIG. 12, the additional capacitance components include the junction capacitance C1 in the n+ diffusion layer 2015 forming the floating diffusion FD, the inter-wiring capacitance C2 between the wiring WR20c and the photodiode PD, the inter-wiring capacitance C3 between the wiring WR20c and the separation layer ST1, the gate capacitance C4 of the source follower transistor SF-Tr, and the junction capacitance C5 in the n+ diffusion layer of the reset transistor RST-Tr.

According to the arrangement relating to the first embodiment, on the other hand, the wiring length LPE of the wiring WR20, which is connected to the floating diffusion FD10, extending from the source follower transistor SF10-Tr and the reset transistor RST-Tr is significantly less than the wiring length LMC in the comparative example shown in FIG. 12. This means that the present example can advantageously reduce the junction capacitance and the wiring capacitance for electrical connection, which can reduce the capacitance (Cfd) of the FD node, increase the conversion gain and achieve improved noise characteristics. According to the arrangement relating to the present embodiment shown in FIG. 11, the additional capacitance components include the junction capacitance C11 in the n+ diffusion layer 2015 forming the floating diffusion FD, the inter-wiring capacitance C12 between the wiring WR20 and the separation layer ST1, and the gate capacitance C13 of the source follower transistor SF10-Tr.

In the first embodiment, the photodiodes are arranged around the floating diffusion FD10 to form a square (i.e., arranged radially). The first and second photodiodes PD10 and PD11, and the third and fourth photodiodes PD12 and PD13, which are adjacent to each other in the second direction (e.g., in the Y direction), are spaced away from each other with the first spacing D1 therebetween that allows at least the source follower transistor SF10-Tr, the selection transistor SEL10-Tr, and the reset transistor RST10-Tr (MOS transistor) to be formed. The first and third photodiodes PD10 and PD12, and the second and fourth photodiodes PD11 and PD13, which are adjacent to each other in the first direction (in the X direction) are spaced away from each other with the second spacing D2, which is less than the first spacing D1 (D1>D2).

Having the above-described configuration, the first embodiment can allow the core part FBS of the floating diffusion FD10 to be shaped like a narrow rectangle, thereby allowing the floating diffusion FD10 to have as small area as possible. This can advantageously result in reducing the capacitance of the floating diffusion FD10 reliably, increasing the conversion gain, and significantly reducing the noise.

In addition, since the floating diffusion FD10 has a reduced area, the size of the pixels can be reliably reduced.

Figure 1:
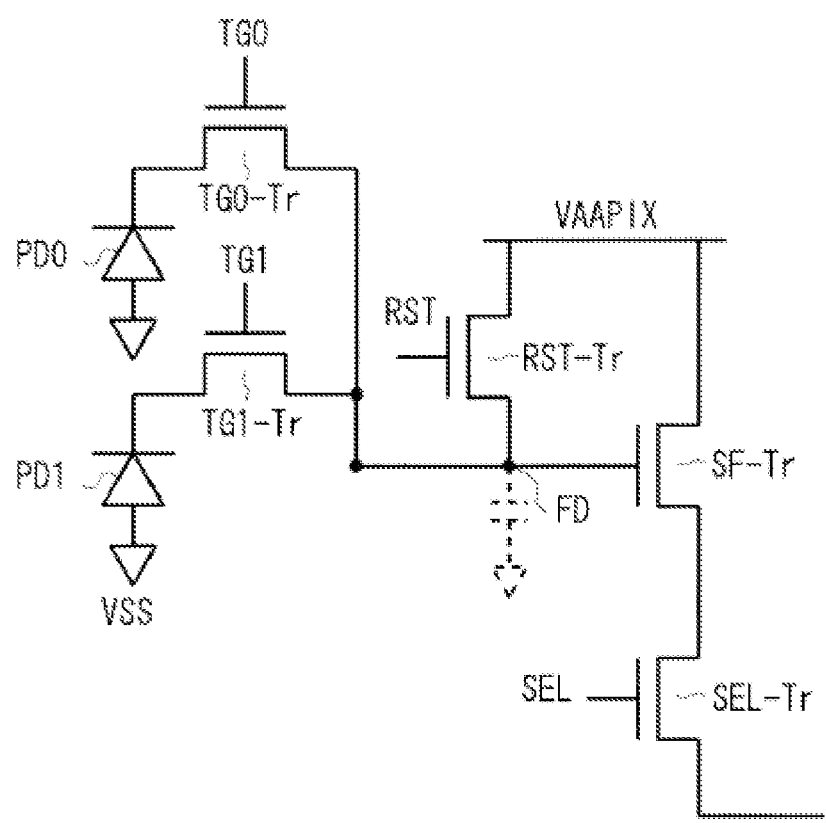
FIG. 1 is a circuit diagram showing an example of pixels of a CMOS image sensor having a two-pixel sharing configuration in which one floating diffusion FD, one reset transistor, one source follower transistor, and one selection transistor are shared by two sets of a photodiode and a transfer transistor.
Figure 2:
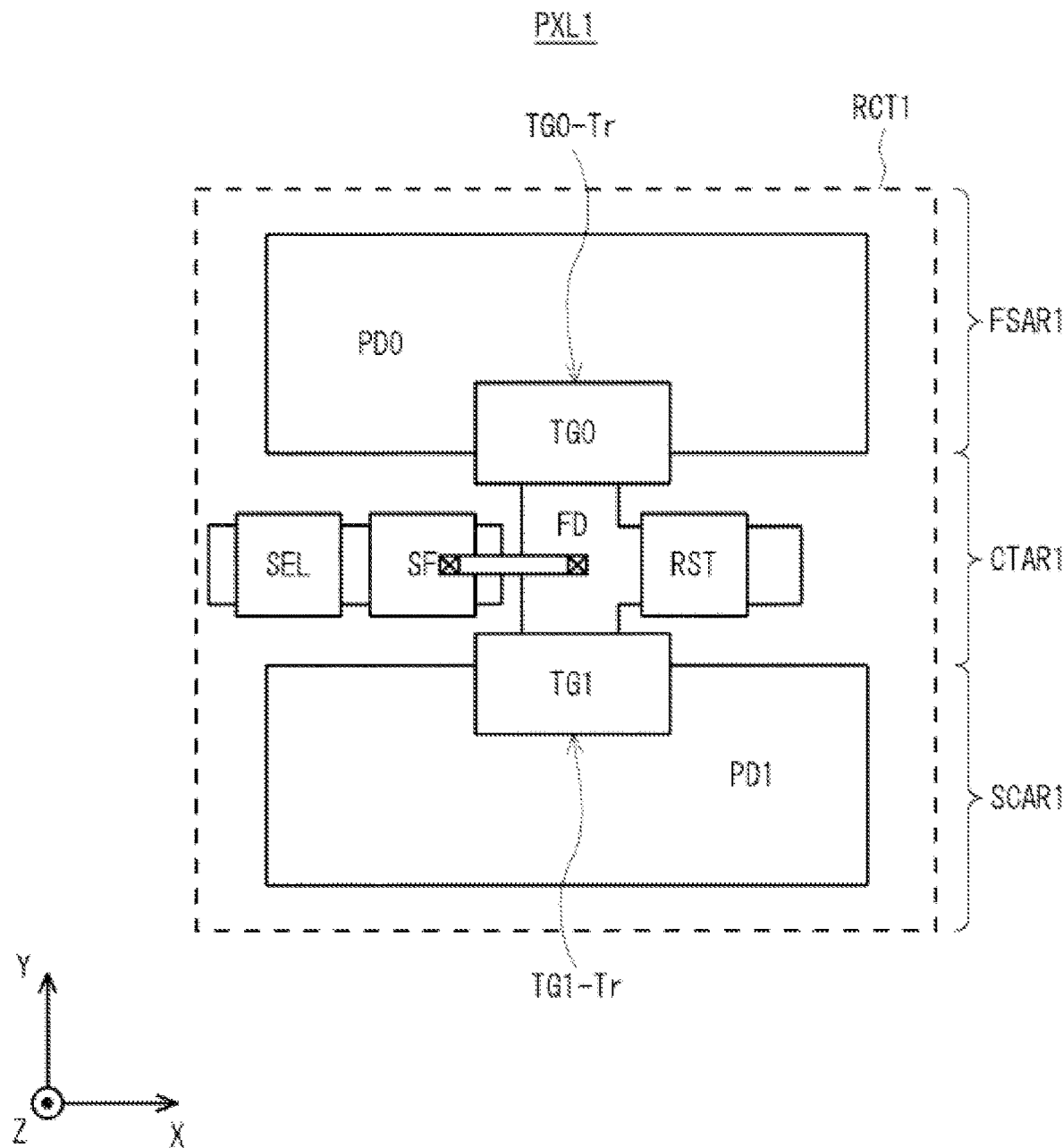
FIG. 2 is a simplified plan view showing a two-pixel sharing scheme, specifically showing, as an example, how two sets of a photodiode and a transfer transistor, one floating diffusion FD, one reset transistor, one source follower transistor, and one selection transistor are arranged.
Figure 3:
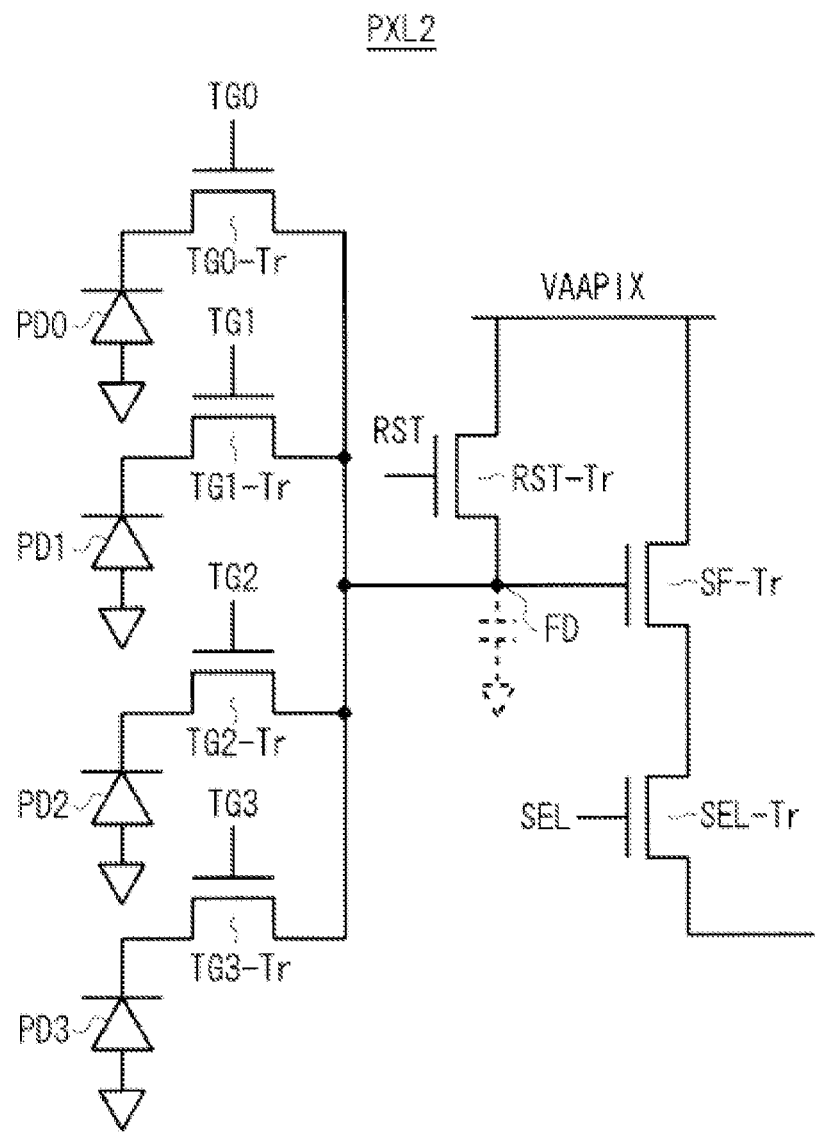
FIG. 3 is a circuit diagram showing an example of pixels of a CMOS image sensor having a four-pixel sharing configuration in which one floating diffusion FD, one reset transistor, one source follower transistor, and one selection transistor are shared by four sets of a photodiode and a transfer transistor.
Figure 4:
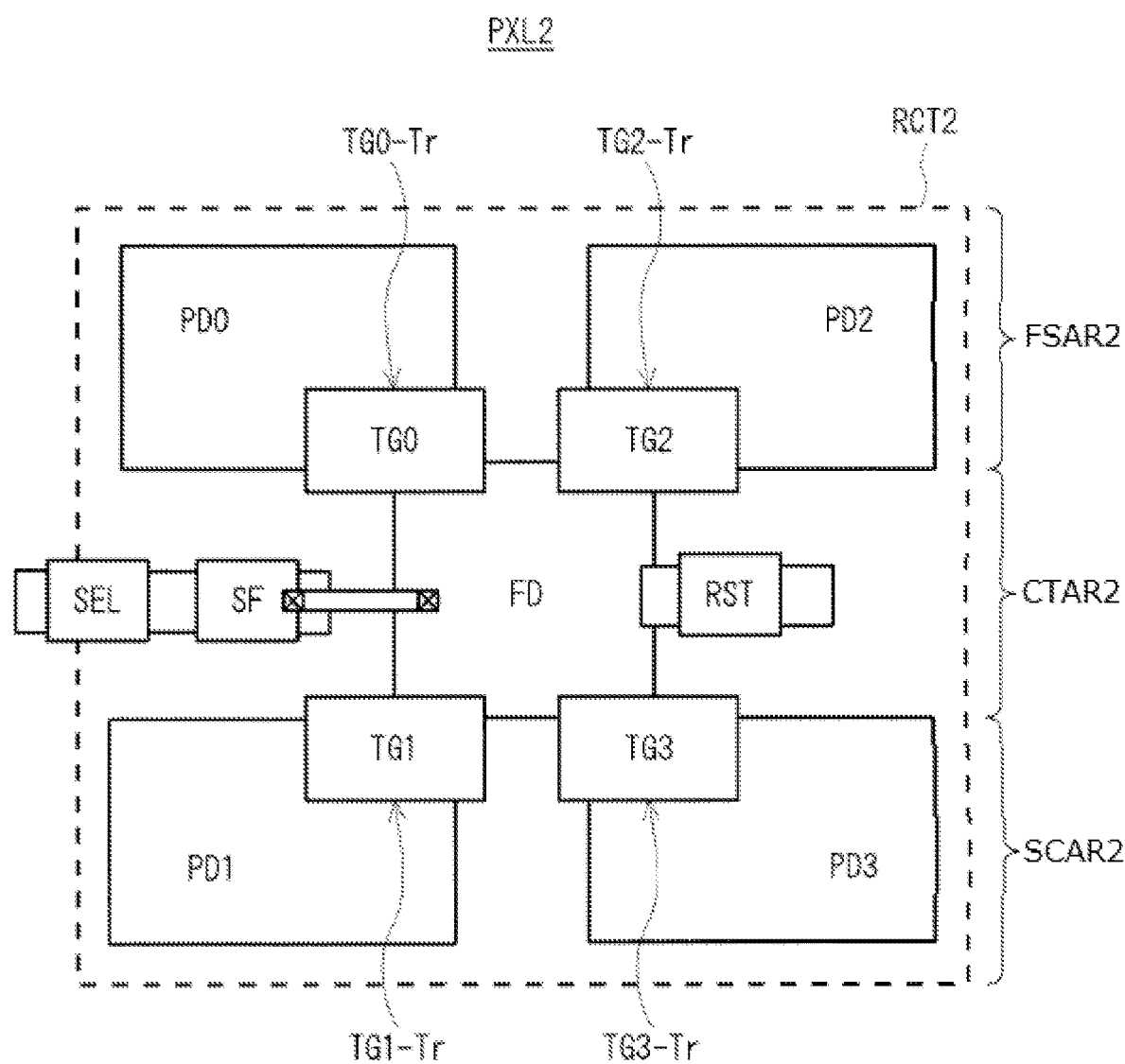
FIG. 4 is a simplified plan view showing a first example of a four-pixel sharing configuration, specifically showing how four sets of a photodiode and a transfer transistor, one floating diffusion FD, one reset transistor, one source follower transistor, and one selection transistor are arranged.
Figure 5:
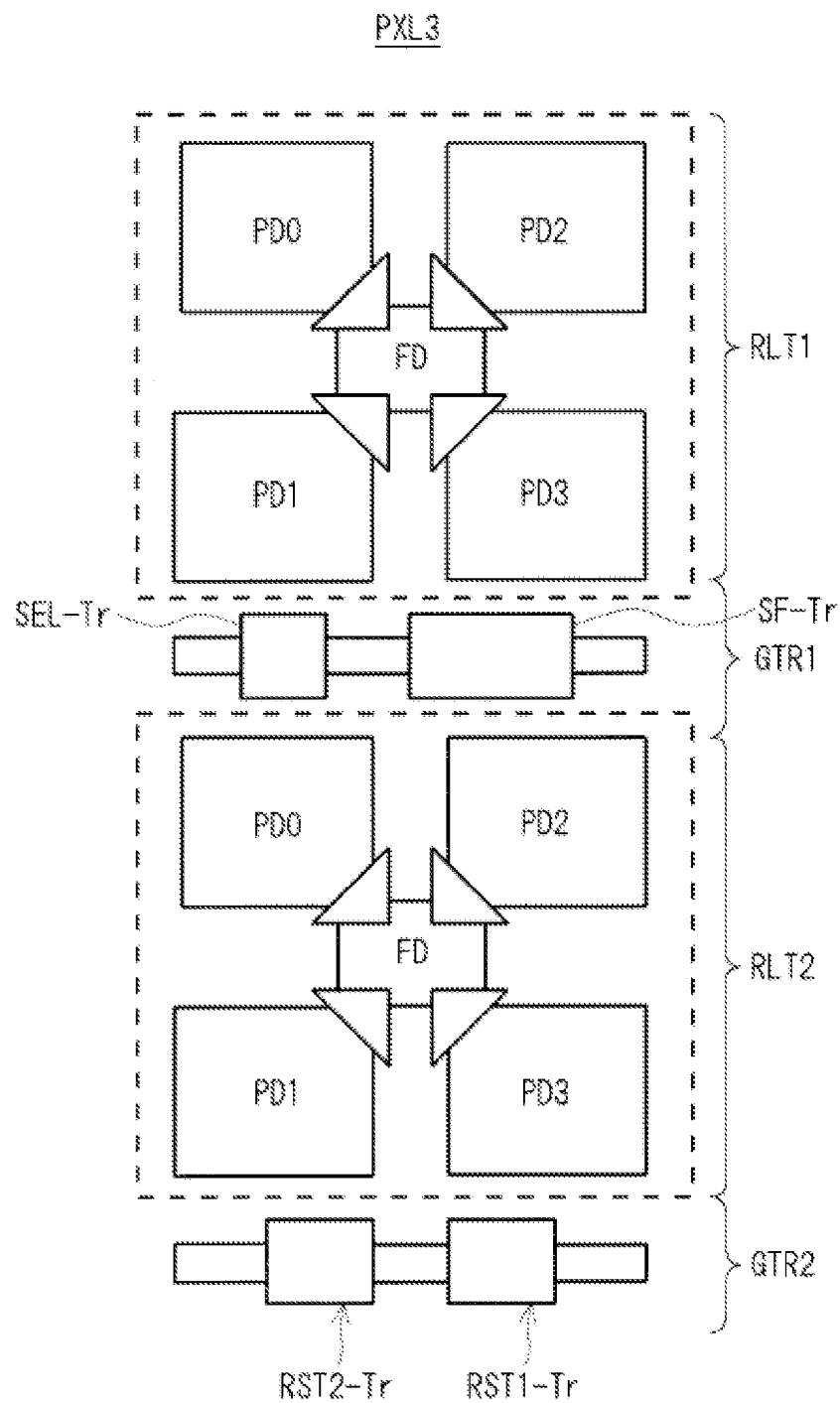
FIG. 5 is a simplified plan view showing a second example of the four-pixel sharing configuration, specifically showing how four sets of a photodiode and a transfer transistor, one floating diffusion FD, one reset transistor, one source follower transistor, and one selection transistor are arranged.

The following now simulates and compares, in terms of the capacitance of the floating diffusion FD, the wiring capacitance, their total capacitance, and the size of the pixels, the layout of the solid-state imaging device 10 shown in FIG. 10 relating to the first embodiment of the present invention, a first comparative example or the layout shown in FIG. 4, and a second comparative example or the layout shown in FIG. 5.

Figure 13A:
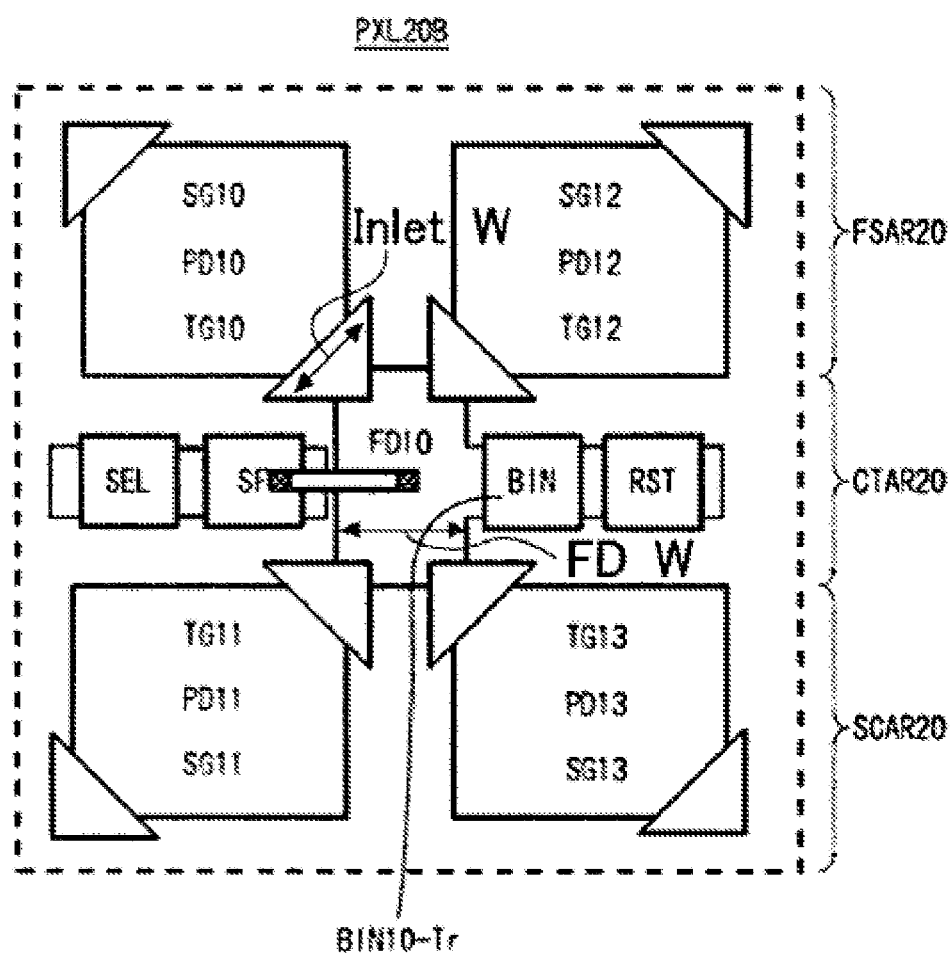
FIGS. 13A, 13B and 13C show the layout of the solid-state imaging device relating to the first embodiment of the present invention, the layout of a first comparative example, and the layout of a second comparative example, which are compared against each other in terms of the FD node capacitance, wiring capacitance, their total capacitance, and size of the pixels.
Figure 13B:
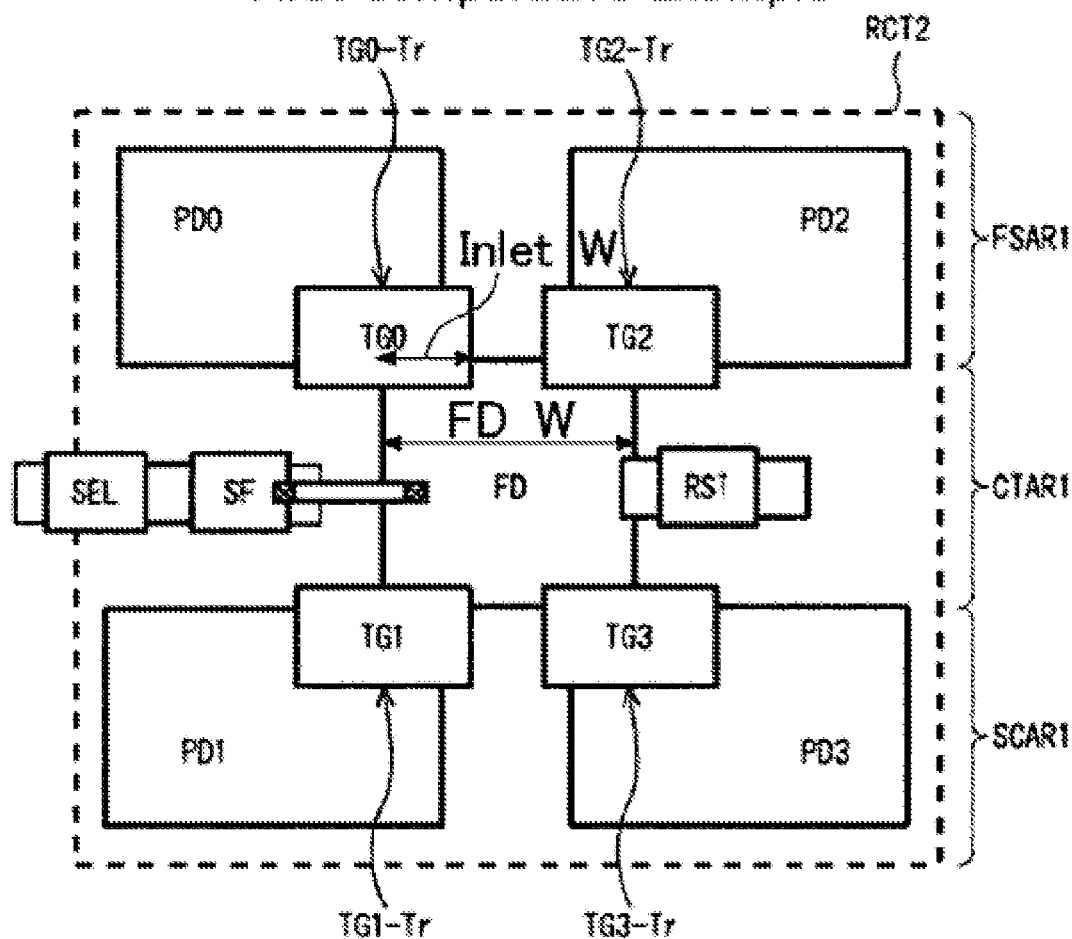
Figure 13C:
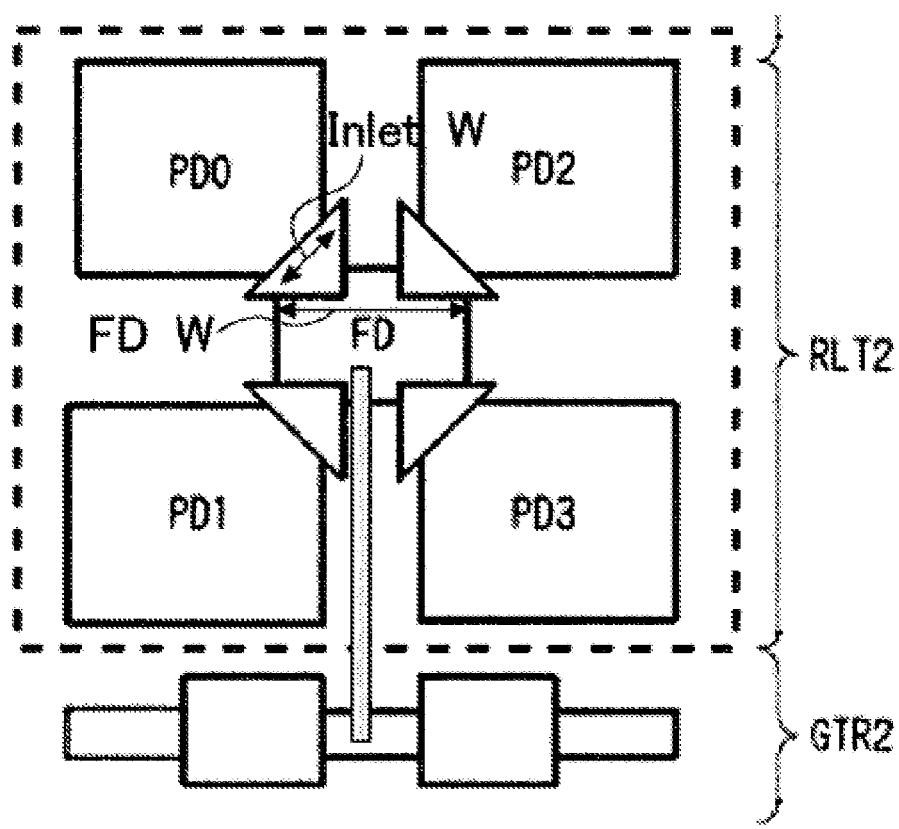

FIGS. 13A to 13C respectively show the layout of the solid-state imaging device relating to the first embodiment of the present invention, the layout of the first comparative example, and the layout of the second comparative example, which are compared against each other in terms of the FD node capacitance, wiring capacitance, their total capacitance, and size of the pixels. FIG. 14 is a table showing the FD node capacitance, wiring capacitance, their total capacitance, and size of the pixels observed when the layout of the solid-state imaging device relating to the first embodiment of the present invention, the layout of the first comparative example and the layout of the second comparative example are applied. In FIGS. 13A to 13C, the reference sign FD W indicates the junction area of the floating diffusion FD, and the letter "W" represents the inlet width of the transfer transistor TG0, TG10. In FIG. 14, the FD node capacitance NCAP, the wiring capacitance WCAP, and the total capacitance TCAP are expressed in relative ratios with the capacitance accomplished by the present invention being expressed as 1.

The simulations reveal that the node capacitance NCP of the floating diffusion FD is 0.5, the wiring capacitance WCAP is 0.5 and the total capacitance TCAP is 1 when the layout of the present invention is adopted. The size of the pixels PSZ is 1.5 μm. When the first comparative example is employed, the node capacitance NCP of the floating diffusion FD is 1, the wiring capacitance WCAP is 0.5 and the total capacitance TCAP is 1.5. The size of the pixels PSZ is 2 μm. When the second comparative example is employed, the node capacitance NCP of the floating diffusion FD is 0.5, the wiring capacitance WCAP is 1 and the total capacitance TCAP is 1.5. The size of the pixels PSZ is 1.5 μm.

These results indicate that the solid-state imaging device relating to the first embodiment of the present invention can have a significantly smaller junction area FD W for the floating diffusion FD than the solid-state imaging devices relating to the first and second comparative examples, thereby achieving reduction in the FD node capacitance NCAP and the wiring capacitance WCAP. This means that the first embodiment can advantageously reduce the total capacitance TCAP reliably, increase the conversion gain, and improve the noise characteristics. In addition, since the floating diffusion FD10 has a reduced area, the size of the pixels PSZ can be reliably reduced.

As described above, the first embodiment can allow four pixels to share their pixel components, so that the size of the photodiode PD per pixel can be maximized. This results in not only reducing the size of the pixels while the sensitivity and full well capacity remain unchanged but also simplifying the layout, significantly reducing the wiring WR20 for connecting the floating diffusion FD10 and the gate of the source follower transistor SF10-Tr and achieving a sufficiently reduced size for the floating diffusion FD10, so that the floating diffusion FD10 can keep high conversion gain. In other words, the first embodiment can not only reduce the size of the pixels while the sensitivity and full well capacity remain unchanged but also prevent an increase in junction capacitance and wiring capacitance and prevent an increase in the capacitance of the floating diffusion FD10 serving as an output node, to prevent a drop in conversion gain and eventually achieve improved noise characteristics.

Second Embodiment

Figure 15:
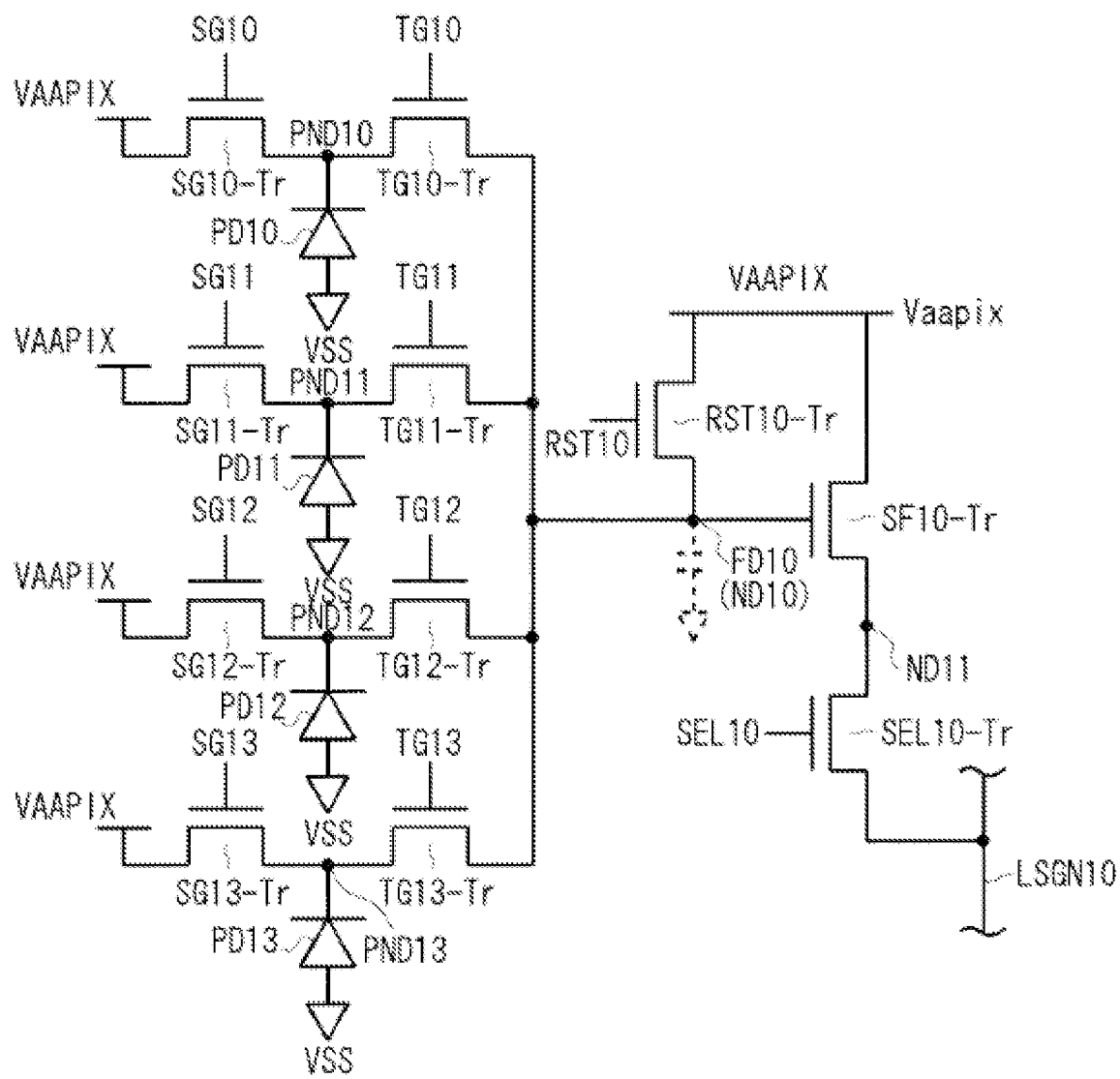
FIG. 15 is a circuit diagram showing an example of a sharing pixel of a solid-state imaging device relating to the second embodiment of the present invention.
Figure 16:
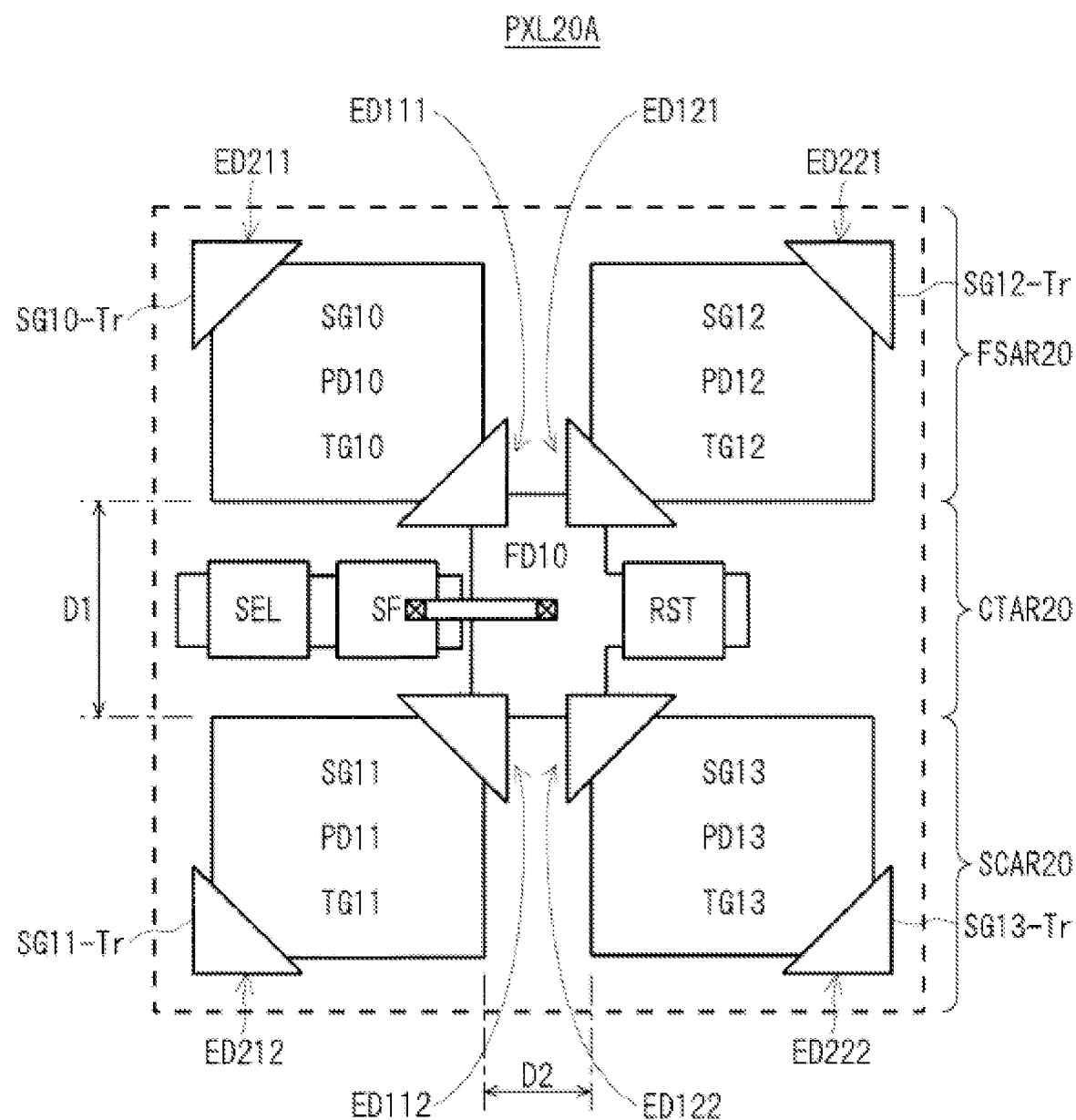
FIG. 16 is a simplified plan view showing, as an example, how four photodiodes, four transfer transistors, one floating diffusion FD, one reset transistor, one source follower transistor and one selection transistor are arranged in the sharing pixel relating to the second embodiment.

FIG. 15 is a circuit diagram showing an example of sharing pixels of a solid-state imaging device relating to a second embodiment of the present invention. FIG. 16 is a simplified plan view showing, as an example, how four photodiodes, four transfer transistors, one floating diffusion FD, one reset transistor, one source follower transistor and one selection transistor are arranged in a sharing pixel relating to the second embodiment.

A sharing pixel PXL20A of a solid-state imaging device 10A relating to the second embodiment differs from the sharing pixel PXL20 of the solid-state imaging device 10 relating to the above-described first embodiment in the following points.

The sharing pixel PXL20A of the solid-state imaging device 10A of the second embodiment includes shutter gate transistors SG10-Tr, SG11-Tr, SG12-Tr and SG13-Tr, which are connected between (i) the charge storage parts PND10, PND11, PND12, PND13 of the photodiodes PD10, PD11, PD12 and PD13 and (ii) the power supply line Vaapix of the power supply voltage VAAPIX and which are configured to serve as charge overflow gate elements for allowing the charges to overflow from the photodiodes PD10, PD11, PD12 and PD13 toward the floating diffusion region or a region other than the floating diffusion region. The shutter gate transistors SG10-Tr, SG11-Tr, SG 12-Tr and SG13-Tr serving as charge overflow gate elements are arranged such that they are connected to second edges ED211, ED212, ED221 and ED222 of the photodiodes PD10, PD11, PD12 and PD1. The second edges ED211, ED212, ED221 and ED222 are closer to an outer edge and separated away from the first edges ED111, ED112, ED121 and ED122 on which the transfer transistors TG10-Tr, TG11-Tr, TG2-Tr TG12-Tr and TG13-Tr are arranged.

Specifically, the first transfer transistor TG10-Tr, which serves as a first transfer element, is connected between the first photodiode PD10 and the floating diffusion FD10, and the first shutter gate transistor SG10-Tr, which serves as the first charge overflow gate element, is connected between the first photodiode PD10 and the predetermined fixed potential VAAPIX. The first shutter gate transistor SG10-Tr is arranged such that it is connected to the second edge ED211 of the first photodiode PD10, which is closer to an outer edge and separated away from the first edge ED111 on which the first transfer transistor TG10-Tr is arranged, as shown in FIG. 16.

The second transfer transistor TG11-Tr, which serves as the second transfer element, is connected between the second photodiode PD11 and the floating diffusion FD10, and the second shutter gate transistor SG11-Tr, which serves as a second charge overflow gate element, is connected between the second photodiode PD11 and the predetermined fixed potential VAAPIX. The second shutter gate transistor SG11-Tr is arranged such that it is connected to the second edge ED212 of the second photodiode PD11, which is closer to an outer edge and separated away from the first edge ED112 on which the second transfer transistor TG11-Tr is arranged, as shown in FIG. 16.

The third transfer transistor TG12-Tr, which serves as the third transfer element, is connected between the third photodiode PD12 and the floating diffusion FD10, and the third shutter gate transistor SG12-Tr, which serves as a third charge overflow gate element, is connected between the third photodiode PD12 and the predetermined fixed potential VAAPIX. The third shutter gate transistor SG12-Tr is arranged such that it is connected to the second edge ED221 of the third photodiode PD12, which is closer to an outer edge and separated away from the first edge ED121 on which the third transfer transistor TG12-Tr is arranged, as shown in FIG. 16.

The fourth transfer transistor TG13-Tr, which serves as the fourth transfer element, is connected between the fourth photodiode PD13 and the floating diffusion FD10, and the fourth shutter gate transistor SG13-Tr, which serves as a fourth charge overflow gate element, is connected between the fourth photodiode PD13 and the predetermined fixed potential VAAPIX. The fourth shutter gate transistor SG13-Tr is arranged such that it is connected to the second edge ED222 of the fourth photodiode PD13, which is closer to an outer edge and separated away from the first edge ED122 on which the fourth transfer transistor TG13-Tr is arranged, as shown in FIG. 16.

As described above, the first shutter gate transistor SG10-Tr serving as the first charge overflow gate element is connected between the first photodiode PD10 and the predetermined fixed potential VAAPIX and controlled by a control signal SG10 applied thereto through a control line. The first shutter gate transistor SG10-Tr remains selected and in the conduction state during the period in which the control signal SG10 is at the H level, to form a blooming path to release the charges generated at the first photodiode PD10 (to form an antiblooming path for the floating diffusion FD) between the first photodiode PD10 and the predetermined fixed potential VAAPIX. In this way, unnecessary charges are released to the fixed potential VAAPIX.

As described above, the first transfer transistor TG10-Tr and the first shutter gate transistor SG10-Tr are driven and controlled at individually selected timings.

The first transfer transistor TG10-Tr is connected between the first photodiode PD1 and the floating diffusion FD10 and controlled by a control signal TG10 applied to the gate thereof through a control line. The first transfer transistor TG10-Tr remains selected and in the conduction state during a transfer period PT in which the control signal TG10 is at the high (H) level, to transfer to the floating diffusion FD10 the charges (electrons) produced by the photoelectric conversion and then stored in the first photodiode PD10. After the first photodiode PD10 and the floating diffusion FD10 are reset to a predetermined reset potential, the first transfer transistor TG10-Tr enters the non-conduction state with the control signal TG10 being set to the low (L) level and the first photodiode PD10 enters an integration period PI. Under these circumstances, if the intensity of the incident light is very high (the amount of the incident light is very large), the charges above the full well capacity overflow into the fixed potential VAAPIX as overflow charges through the overflow path under the first shutter gate transistor SG10-Tr.

The second shutter gate transistor SG11-Tr serving as the second charge overflow gate element is connected between the second photodiode PD11 and the predetermined fixed potential VAAPIX and controlled by a control signal SG11 applied thereto through a control line. The second shutter gate transistor SG11-Tr remains selected and in the conduction state during the period in which the control signal SG11 is at the H level, to form a blooming path to release the charges generated at the second photodiode PD11 (to form an antiblooming path for the floating diffusion FD) between the second photodiode PD11 and the predetermined fixed potential VAAPIX. In this way, unnecessary charges are released to the fixed potential VAAPIX.

As described above, the second transfer transistor TG11-Tr and the second shutter gate transistor SG11-Tr are driven and controlled at individually selected timings. After the second photodiode PD11 and the floating diffusion FD10 are reset to a predetermined reset potential, the second transfer transistor TG11-Tr enters the non-conduction state with the control signal TG11 being set to the low (L) level and the second photodiode PD11 enters an integration period PI. Under these circumstances, if the intensity of the incident light is very high (the amount of the incident light is very large), the charges above the full well capacity overflow into the fixed potential VAAPIX as overflow charges through the overflow path under the second shutter gate transistor SG11-Tr.

The third shutter gate transistor SG12-Tr serving as the third charge overflow gate element is connected between the third photodiode PD12 and the predetermined fixed potential VAAPIX and controlled by a control signal SG12 applied thereto through a control line. The third shutter gate transistor SG12-Tr remains selected and in the conduction state during the period in which the control signal SG12 is at the H level, to form a blooming path to release the charges generated at the third photodiode PD12 (to form an antiblooming path for the floating diffusion FD) between the third photodiode PD12 and the predetermined fixed potential VAAPIX. In this way, unnecessary charges are released to the fixed potential VAAPIX.

As described above, the third transfer transistor TG12-Tr and the third shutter gate transistor SG12-Tr are driven and controlled at individually selected timings. After the third photodiode PD12 and the floating diffusion FD10 are reset to a predetermined reset potential, the third transfer transistor TG12-Tr enters the non-conduction state with the control signal TG12 being set to the low (L) level and the third photodiode PD12 enters an integration period PI. Under these circumstances, if the intensity of the incident light is very high (the amount of the incident light is very large), the charges above the full well capacity overflow into the fixed potential VAAPIX as overflow charges through the overflow path under the third shutter gate transistor SG12-Tr.

The fourth shutter gate transistor SG13-Tr serving as the fourth charge overflow gate element is connected between the fourth photodiode PD13 and the predetermined fixed potential VAAPIX and controlled by a control signal SG13 applied thereto through a control line. The fourth shutter gate transistor SG13-Tr remains selected and in the conduction state during the period in which the control signal SG13 is at the H level, to form a blooming path to release the charges generated at the fourth photodiode PD13 (to form an antiblooming path for the floating diffusion FD) between the fourth photodiode PD13 and the predetermined fixed potential VAAPIX. In this way, unnecessary charges are released to the fixed potential VAAPIX.

As described above, the fourth transfer transistor TG13-Tr and the fourth shutter gate transistor SG13-Tr are driven and controlled at individually selected timings. After the fourth photodiode PD13 and the floating diffusion FD10 are reset to a predetermined reset potential, the fourth transfer transistor TG13-Tr enters the non-conduction state with the control signal TG13 being set to the low (L) level and the fourth photodiode PD13 enters an integration period PI. Under these circumstances, if the intensity of the incident light is very high (the amount of the incident light is very large), the charges above the full well capacity overflow into the fixed potential VAAPIX as overflow charges through the overflow path under the fourth shutter gate transistor SG13-Tr.

In addition, for the first shutter gate transistor SG10-Tr serving as the first charge overflow gate element, the second shutter gate transistor SG11-Tr serving as the second charge overflow element, the third shutter gate transistor SG12-Tr serving as the third charge overflow element, and the fourth shutter gate transistor SG13-Tr serving as the fourth charge overflow element, their threshold values may be individually adjusted.

Figure 17:
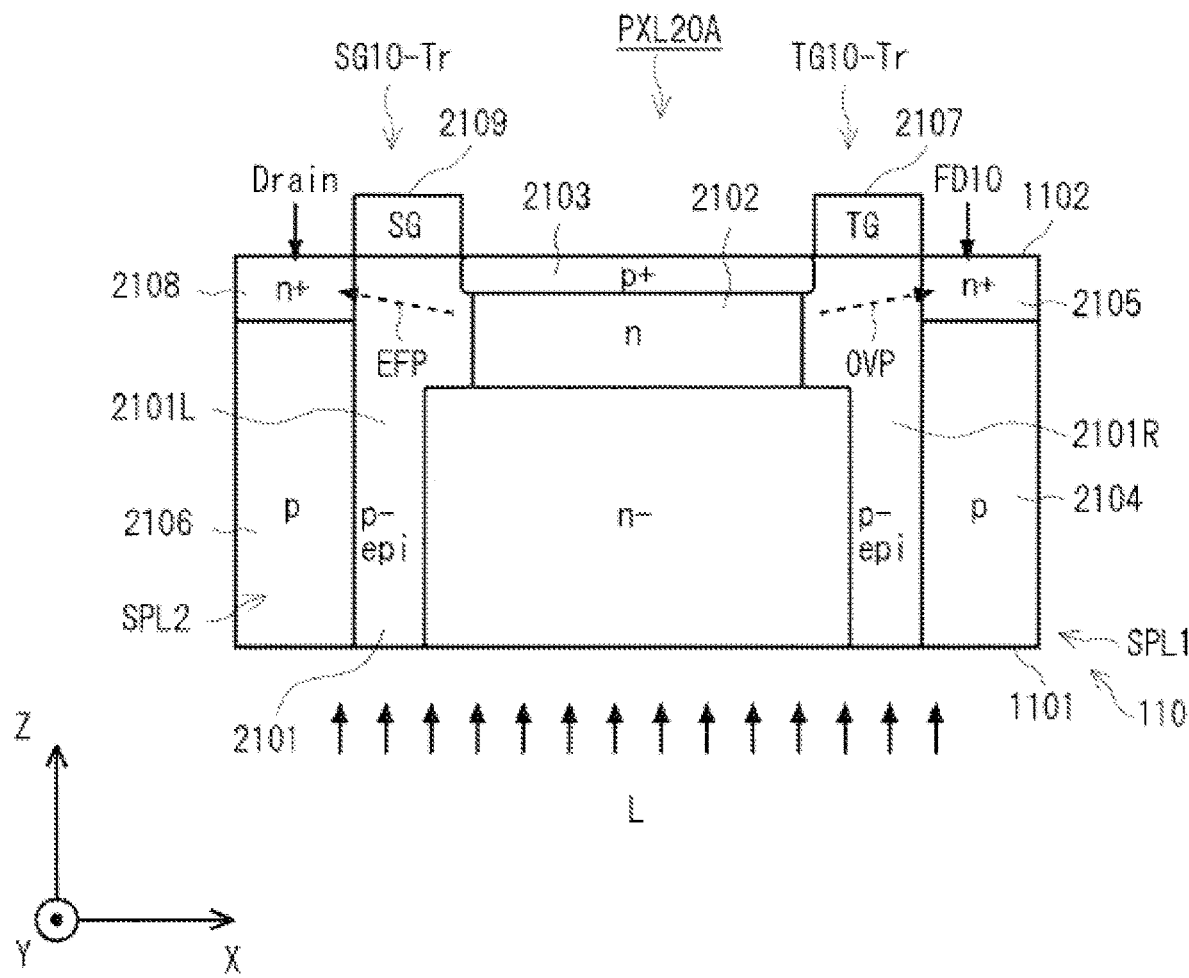
FIG. 17 is a simplified sectional view showing an example configuration of a charge integrating and transferring system including a shutter gate transistor, or the main part of the sharing pixel relating to the second embodiment of the present invention.

FIG. 17 is a simplified sectional view showing an example configuration of the main part of a sharing pixel relating to the second embodiment of the present invention or a charge integrating and transferring system including the shutter gate transistors.

The configuration shown in FIG. 17 differs from that shown in FIG. 9 in that the former has the shutter gate transistors.

<Configuration of Separation Layer in X direction (Column Direction)>

An n+ layer 2105 serving as the floating diffusion FD is formed on the p-type separation layer 2104 (SPL1), which is arranged on the right side in the X direction (column direction) in FIG. 17, on the second substrate surface 1102 side. An n+ layer 2108 serving as the drain of the shutter gate transistor SG10-Tr is formed on the p-type separation layer 2106 (SPL2), which is arranged on the left side in the X direction (column direction) in FIG. 17, on the second substrate surface 1102 side. A gate electrode 2107 of the first transfer transistor TG10-Tr is formed on the epitaxial layer (p-epi) 2101R on the second substrate surface 1102 side with a gate insulator sandwiched therebetween. Under the first transfer transistor TG10-Tr, an overflow path OVP is formed extending from the first photodiode PD10 to the floating diffusion FD10. The potential of the overflow path OVP can also be controlled through gate control, for example.

A gate electrode 2109 of the first shutter gate transistor SG10-Tr is formed on the epitaxial layer (p-epi) 2101L on the second substrate surface 1102 side with a gate insulator sandwiched therebetween. Under the first shutter gate transistor SG10-Tr, a blooming path EFP (an antiblooming path for the floating diffusion FD) is formed to extend between the first photodiode PD10 and the n+ layer 2108 to release the charges generated at the first photodiode PD10.

With the above-described structure, if the intensity of the incident light is very high (the amount of the incident light is very large), the charges above the full well capacity overflow into the floating diffusion FD as overflow charges through the overflow path OVP under the first transfer transistor TG10-Tr.

Irregular and intense light may enter the first photodiode PD10 while comparing is performed, e.g., while the AD conversion is performed. If such is the case, charges may overflow from the photodiode PD10 to the floating diffusion FD10 and the level of the floating diffusion FD10 serving as the output node may change. As a consequence, the AD conversion may possibly fail to be completed successfully. To address this issue, the present embodiment employs the first shutter gate transistor SG10-Tr. In this way, if irregular and intense light enters the first photodiode PD10 during comparing, unnecessary charges may be released from the first photodiode PD10 to a region outside the floating diffusion FD10 region. The first shutter gate transistor SG10-Tr thus prevents a change in the level of the floating diffusion FD10, which may be caused by the charges overflowing from the first photodiode PD10 to the floating diffusion FD10. In this way, the pixel is configured to be capable of successfully completing AD conversion by preventing a change in the FD level, which may be caused if irregular and intense light enters the first photodiode PD10 while comparing is performed, e.g., while the AD conversion is performed. The same applies to the other photodiodes PD11, PD12 and PD13.

As described above, the second embodiment includes the shutter gate transistors SG10-Tr, SG11-Tr, SG12-Tr and SG13-Tr, which are connected between (i) the charge storage parts of the photodiodes PD10, PD11, PD12 and PD13 and (ii) the power supply line Vaapix of the power supply voltage VAAPIX and which are configured to serve as charge overflow gate elements for allowing the charges to overflow from the photodiodes PD toward the floating diffusion region or a region other than the floating diffusion region. The second embodiment thus can not only produce the same effects as the above-described first embodiment but also produce the following effects.

The second embodiment can prevent mixing of charges (which can result in false signals), which is caused by the signals indicative of the charges exceeding the charges that can be stored on a given photodiode PD (overflow charges) flowing into adjacent pixels.

Third Embodiment

Figure 18:
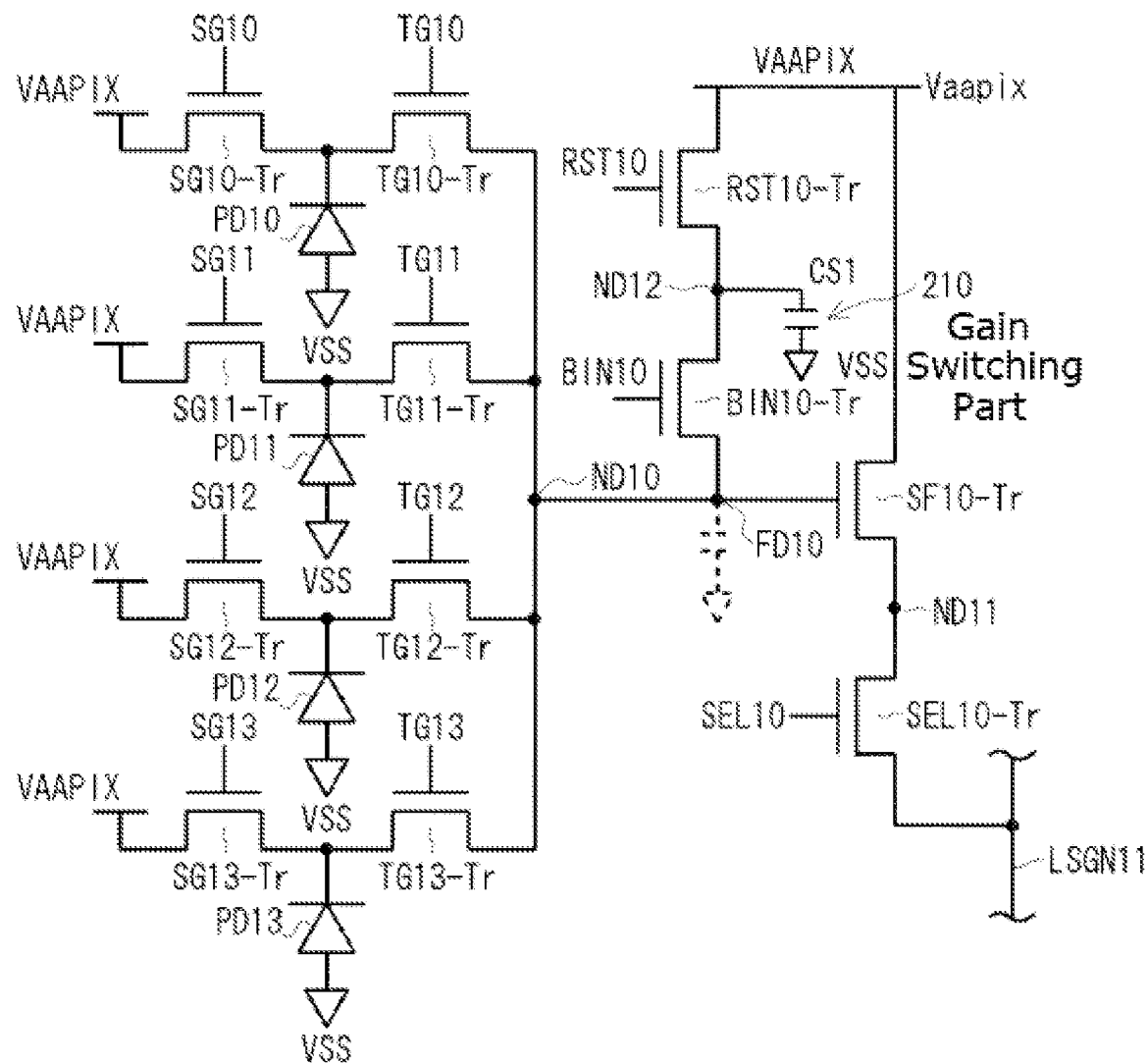
FIG. 18 is a circuit diagram showing an example of a sharing pixel of a solid-state imaging device relating to a third embodiment of the present invention.
Figure 19:
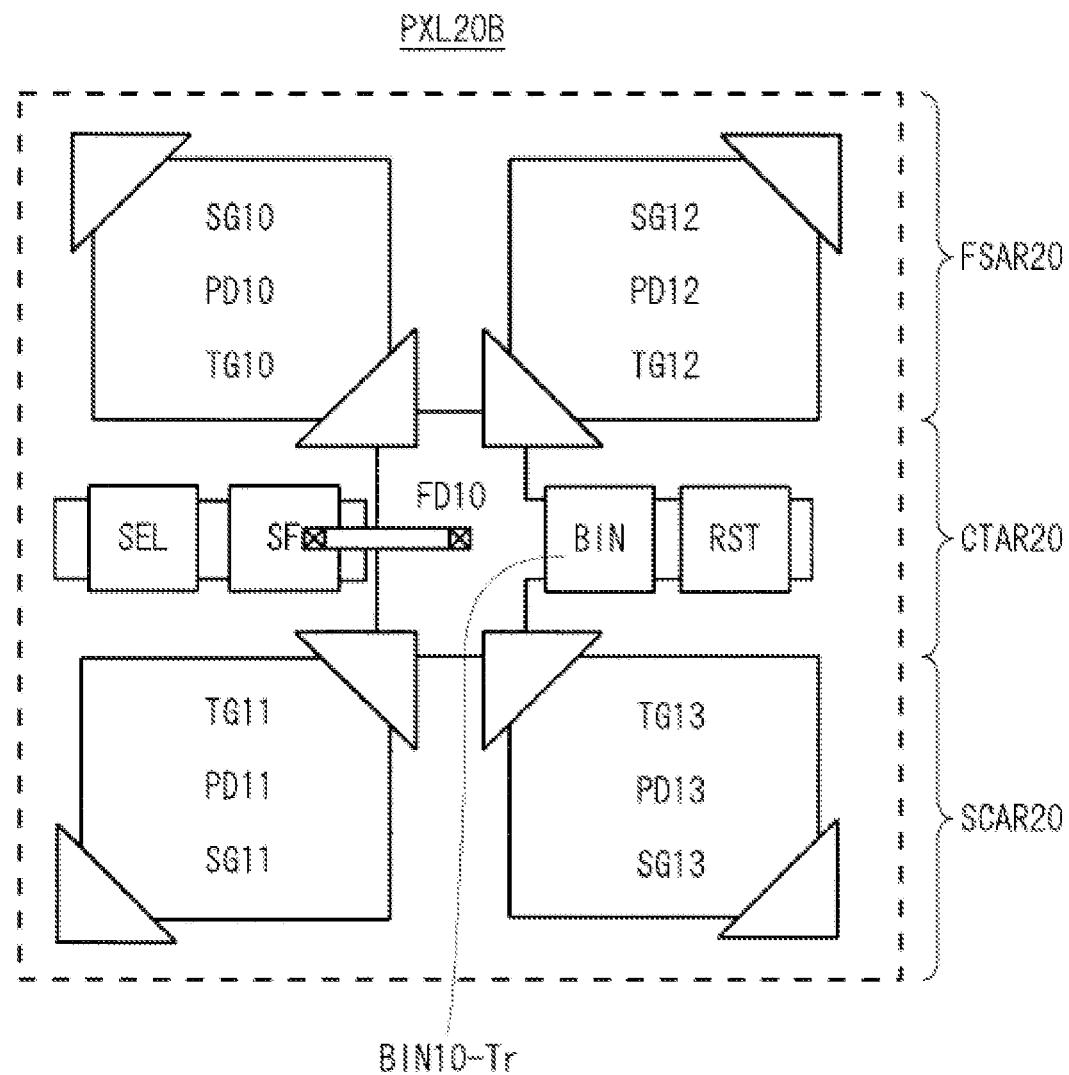
FIG. 19 is a simplified plan view showing, as an example, how four photodiodes, four transfer transistors, one floating diffusion FD, one reset transistor, one source follower transistor and one selection transistor are arranged in a sharing pixel relating to the third embodiment.

FIG. 18 is a circuit diagram showing an example of sharing pixels of a solid-state imaging device relating to a third embodiment of the present invention. FIG. 19 is a simplified plan view showing, as an example, how four photodiodes, four transfer transistors, one floating diffusion FD, one reset transistor, one source follower transistor and one selection transistor are arranged in the sharing pixel relating to the third embodiment.

A sharing pixel PXL20B of a solid-state imaging device 10B relating to the third embodiment implements a dual-gain scheme, which is configured in a less complicated manner since the solid-state imaging devices 10 and 10A relating to the first and second embodiments can achieve a reduced capacitance in the floating diffusion FD10. The sharing pixel 20B of the solid-state imaging device 10B relating to the third embodiment differs from the sharing pixel 20A of the solid-state imaging device 10A relating to the above-described second embodiment in the following points.

The sharing pixel PXL20B relating to the third embodiment has a gain switching part 210 for switching the conversion gain of the source follower transistor SF10-Tr serving as the output buffer part. The gain switching part 210 is configured to change the amount of charges in the floating diffusion FD10 serving as the output node between a first capacitance and a second capacitance, so that the conversion gain of the source follower transistor SF10-Tr serving as the output buffer part can be changed between a first conversion gain corresponding to the first capacitance (for example, high conversion gain: HCG) and a second conversion gain corresponding to the second capacitance (for example, low conversion gain: LCG). The third embodiment employs a dual read-out scheme, and one of the first and second conversion gains is selected by the amount of charges to be read and the selected conversion gain is used.

The gain switching part 210 includes a storage transistor BIN10-Tr serving as a storage element connected to the floating diffusion FD10, and a storage capacitor CS1 serving as a storage capacitance element configured to store the charges on the floating diffusion FD10 via the storage transistor BIN10-Tr.

The storage transistor BIN10-Tr is connected between the floating diffusion FD10 and the reset transistor RST10-Tr, and the storage capacitor C5 is connected between (i) a connection node ND12 between the reset transistor RST10-Tr and the storage transistor BIN10-Tr and (ii) the reference potential VSS. The storage transistor BIN10-Tr is controlled by a control signal BIN10 applied to the gate thereof through a control line. The storage transistor BIN10-Tr remains selected and in the conduction state during a reset period in which the control signal BIN10 is at the H level, to connect the floating diffusion FD10 and the storage capacitor CS1.

In the third embodiment, the storage transistor BIN10-Tr is arranged in the central region CTAR20 of the element formation region between the floating diffusion FD10 and the reset transistor RST10-Tr, as shown in FIG. 19.

In the third embodiment, a read-out operation with a changeable gain is performed in the following manner. A first-conversion-gain signal read-out operation HCGSRD is performed while the storage transistor BIN10-Tr remains in the non-conduction state, so that the charges in the floating diffusion FD10 serving as the output node ND10 are separated from the charges in the storage capacitor CS. A first-conversion-gain reset read-out operation HCGRRD is performed while the storage transistor BIN10-Tr remains in the non-conduction state, so that the charges in the floating diffusion FD10 serving as the output node ND10 are separated from the charges in the storage capacitor CS. A second-conversion-gain signal read-out operation LCGSRD is performed while the storage transistor BIN10-Tr remains in the conduction state, so that the charges in the floating diffusion FD10 serving as the output node ND10 are mixed with the charges in the storage capacitor CS. A second-conversion-gain reset read-out operation LCGRRD is performed while the reset transistor RST10-Tr and the storage transistor BIN10-Tr remain in the conduction state, so that the charges in the floating diffusion FD10 serving as the output node ND10 and the charges in the storage capacitor CS are cleared.

As described above, the third embodiment includes the gain switching part 210, which includes the storage transistor BIN10-Tr and the storage capacitor CS. The gain switching part 210 is configured to change the amount of charges in the floating diffusion FD10 serving as the output node between the first capacitance and the second capacitance, so that the conversion gain of the source follower transistor SF10-Tr serving as the output buffer part can be changed between the first conversion gain corresponding to the first capacitance (for example, high conversion gain: HCG) and the second conversion gain corresponding to the second capacitance (for example, low conversion gain: LCG). With such configurations, the full well capacity (FWC) is small when the conversion gain is set at the high conversion gain (HCG) and large when the conversion gain is set at the low conversion gain (LCG).

The following now describes, as an example, a sequence of operations performed to read signals from the sharing pixel in the solid-state-imaging device relating to the third embodiment.

Figure 20:
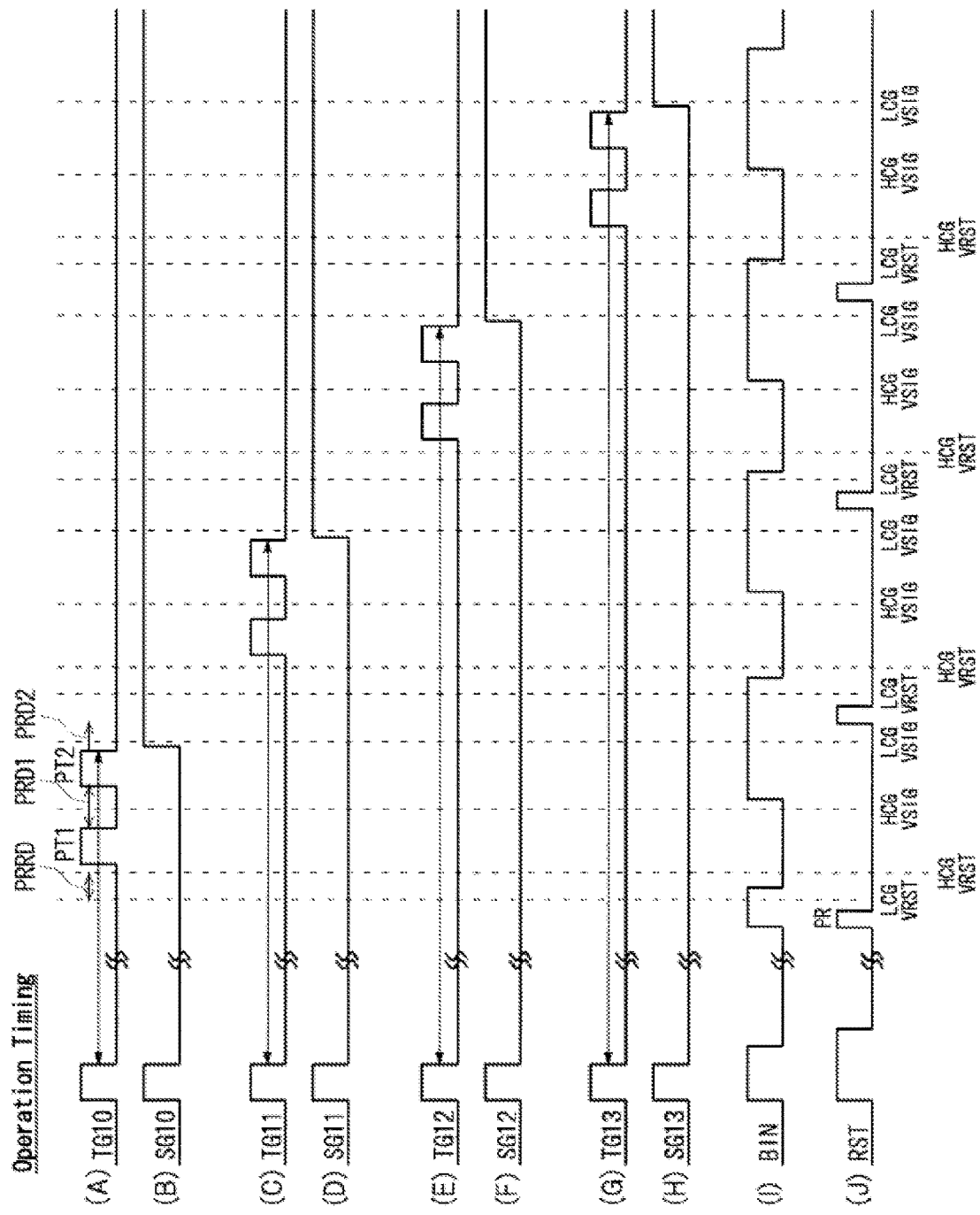
FIG. 20 is a timing chart to illustrate an example sequence of operations for read-out performed in a read-out mode on sharing pixels in the solid-state imaging device relating to the third embodiment of the present invention.

FIG. 20 is a timing chart including parts (A) to (J) to illustrate an example sequence of operations performed in a read-out mode on sharing pixels in the solid-state imaging device relating to the third embodiment of the present invention.

In FIG. 20, the part (A) presents the control signal TG10 for the first transfer transistor TG10-Tr, which is to be accessed in the read-out mode, the part (B) presents the control signal SG10 for the first shutter gate transistor SG10-Tr, the part (C) presents the control signal TG11 for the second transfer transistor TG11-Tr, which is to be accessed in the read-out mode, the part (D) presents the control signal SG11 for the second shutter gate transistor SG11-Tr, the part (E) presents the control signal TG12 for the third transfer transistor TG12-Tr, which is to be accessed in the read-out mode, the part (F) presents the control signal SG12 for the third shutter gate transistor SG12-Tr, the part (G) presents the control signal TG13 of the fourth transistor TG13-Tr, which is to be accessed in the read-out mode, the part (H) presents the control signal SG13 for the fourth shutter gate transistor SG13-Tr, the part (I) shows the control signal BIN10 for the storage transistor BIN10-Tr, and the part (J) shows the control signal RST10 for the reset transistor RST10-Tr.

In the read-out mode RMD, the control signals TG10, TG11, TG12 and TG13 are set at the low level so that the transfer transistors TG10-Tr, TG11-Tr, TG12-Tr and TG13-Tr remain in the non-conduction state, and the level of the control signals SG10, SG11, SG12 and SG13 is switched from the high level to the low level so that the state of the shutter gate transistors SG10-Tr, SG11-Tr, SG12-Tr and SG13-TR is switched from the conduction state to the non-conduction state. At the timing when the state of the shutter gate transistors SG10-Tr, SG11-Tr, SG12-Tr and SG13-Tr is switched from the conduction state to the non-conduction state, an exposure period starts. Additionally, the level of the control signal RST10 remains at the high level for a predetermined period of time, so that the reset transistor RST10-Tr remains in the conduction state, and the level of the control signal BIN10 remains at the high level for a predetermined period of time, so that the storage transistor BIN10-Tr remains in the conduction state. In this way, during a reset period RP, the floating diffusion FD10 serving as the output node ND10 remains in the reset state.

Under these circumstances, the charges stored in the first photodiode PD10 are read. To do so, the control signals RST10 and BIN10 are set at the high level, so that the floating diffusion FD10 serving as the output node ND10 is reset. The control signal BIN10 remains at the high level for a predetermined period of time, so that the storage transistor BIN10-Tr remains in the conduction state and the charges at the floating diffusion FD10 serving as the output node ND10 are combined with the charges at the storage capacitor CS serving as the storage capacitance element. Consequently, the amount of the charges at the floating diffusion FD10 is maintained at the second capacitance. This allows the second-conversion-gain reset read-out operation LCGRRD to be performed. Under these circumstances, in a reset read-out period PRRD following the reset period PR, the second-conversion-gain reset read-out operation LCGRRD is performed to read a read-out reset signal LCGVRST resulting from conversion performed with the second conversion gain corresponding to the second capacitance in the floating diffusion FD10 serving as the output node ND10 from the source follower transistor SF10-Tr serving as the output buffer and to process the read-out reset signal LCGVRST.

Following this, the control signal BIN10 is switched to the low level so that the storage transistor BIN10-Tr remains in the non-conduction state and the charges at the floating diffusion FD10 serving as the output node ND10 are separated from the charges at the storage capacitor CS serving as the storage capacitance element. Consequently, the amount of charges at the floating diffusion FD10 is maintained at the first capacitance. This allows the first-conversion-gain reset read-out operation HCGRRD to be performed. Under these circumstances, in another reset read-out period PRRD following the reset period PR, the first-conversion-gain reset read-out operation HCGRRD is performed to read a read-out reset signal HCGVRST resulting from conversion performed with the first conversion gain (high conversion gain: HCG) corresponding to the first capacitance in the floating diffusion FD10 serving as the output node ND10 from the source follower transistor SF10-Tr serving as the output buffer and to process the read-out reset signal HCGVRST.

After the reset read-out period PPRD, the control signal TG10 remains at the high level for a predetermined period of time, so that the charges stored in the photodiode PD10 are transferred to the floating diffusion FD10 in this first transfer period PT1. In a first read-out period PRD1 following the first transfer period PT1, the first-conversion-gain read-out operation HCGSRD is performed to read, from the source follower transistor SF10-Tr serving as the output buffer, a read-out signal HCGVSIG resulting from conversion performed with the first conversion gain corresponding to the first capacitance of the floating diffusion FD10 serving as the output node ND10 and process the read-out signal HCGVSIG.

After the first read-out period PRD1, the control signal BIN10 is switched to the high level, so that the storage transistor BIN10-Tr remains in the conduction state and the charges at the floating diffusion FD10 serving as the output node ND10 are combined with the charges at the storage capacitor CS serving as the storage capacitance element. Consequently, the amount of charges at the floating diffusion FD10 is maintained at the second charge amount. This allows the second-conversion gain reset read-out operation LCGRRD to be performed. Under these circumstances, the control signal TG10 is switched to the high level after the first read-out period PRD1 and remains at the high level for a predetermined period of time, so that the charges stored in the photodiode PD10 are transferred to the floating diffusion FD10 in this second transfer period PT2. After the second transfer period PT2, the control signal SG10 is switched to the high level so that the first shutter gate transistor SG10-Tr remains in the conduction state. In the subsequent second read-out period PRD2, the second-conversion-gain read-out operation LCGSRD is performed to read, from the source follower transistor SF10-Tr serving as the output buffer, a read-out signal LCGVSIG resulting from conversion performed with the second conversion gain corresponding to the second capacitance in the floating diffusion FD10 serving as the output node ND10 and process the read-out signal LCGVSIG.

Once the charges stored in the first photodiode PD10 have been read in the above-described manner, the charges stored in the second photodiode PD11 are subsequently read. To do so, while the control signal BIN10 remains at the high level, the control signal RST10 remains at the high level for a predetermined period of time, so that the reset transistor RST10-Tr remains in the conduction state. In this way, during a reset period RP, the floating diffusion FD10 serving as the output node ND10 remains in the reset state. After this, in the same manner as the charges stored in the first photodiode PD10 are processed, the charges stored in the second, third and fourth photodiodes PD11, PD12 and PD13 are sequentially processed. Therefore, the processing is not described in detail here.

The third embodiment can provide for a widened dynamic range by performing reading in a predetermined mode while the pixel achieves a small size. Additionally, the third embodiment is capable of substantially achieving a widened dynamic range and a raised frame rate, achieving reduced noise, and maximizing the effective pixel region and value per cost.

Fourth Embodiment

Figure 21:
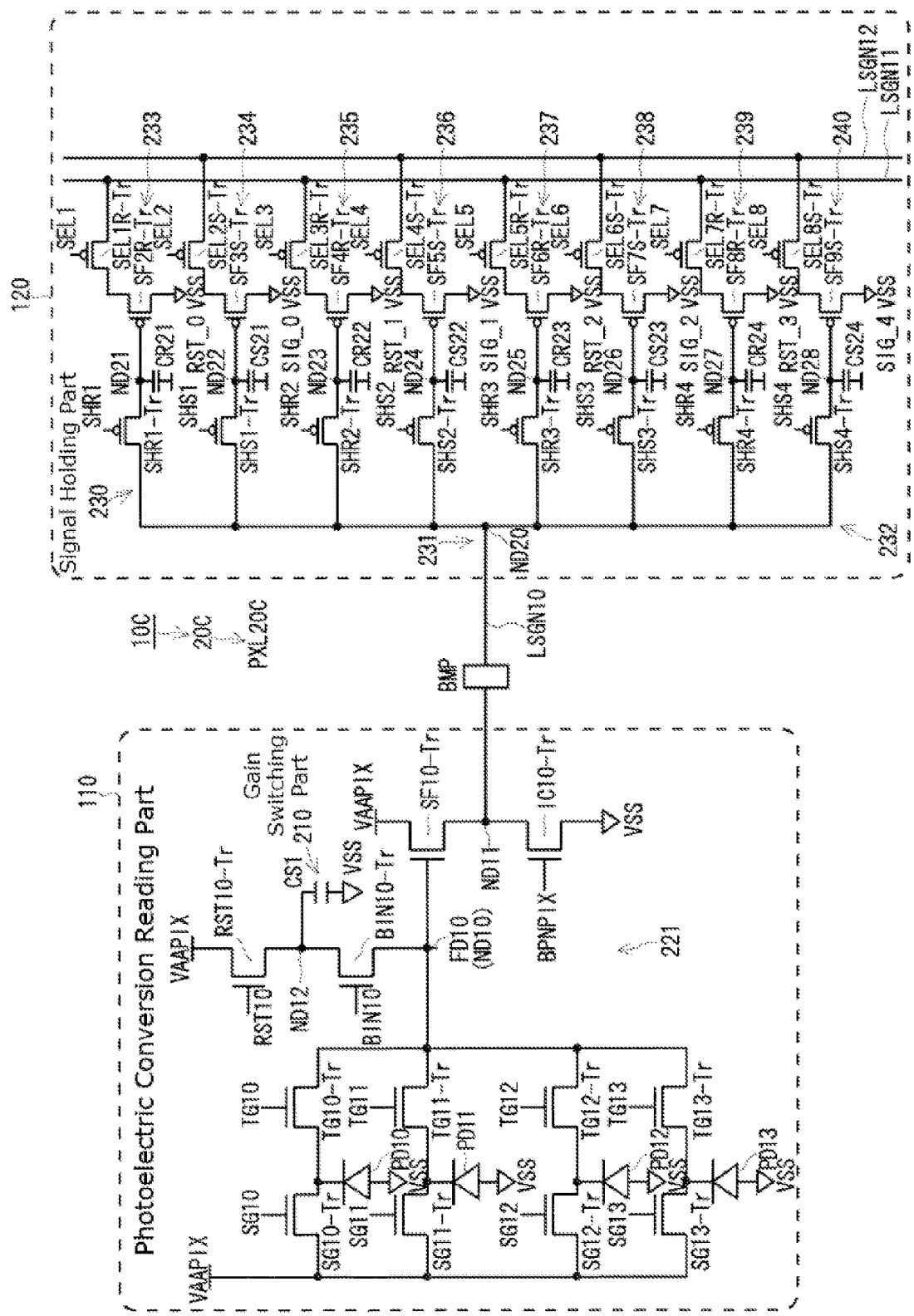
FIG. 21 is a circuit diagram showing an example configuration of a sharing pixel of a solid-state imaging device 10C relating to a fourth embodiment of the present invention.

FIG. 21 is a circuit diagram showing an example configuration of the sharing pixels of a solid-state imaging device 10C relating to a fourth embodiment of the present invention.

In the solid-state imaging device 10C relating to the fourth embodiment, a pixel part 20C includes unit pixels PXLC, and each unit pixel PXLC includes a photoelectric conversion reading part 220 and a signal holding part 230. The solid-state imaging device 10C is configured, for example, as a stacked CMOS image sensor capable of operating in a global shutter mode and substantially achieving a widened dynamic range and an enhanced frame rate.

In the stacked structure, reading nodes ND11 of the photoelectric conversion reading parts 220 of the pixel array in a first substrate 110 are electrically connected to input nodes ND20 of the signal holding parts 230 of sharing pixels PXL20C in a second substrate 120 through via microbumps BMP (die-to-die vias) or the like as shown in FIG. 21, for example.

As will be described in detail below, in the solid-state imaging device 10C relating to the fourth embodiment, in a voltage mode, a pixel signal is sampled into the signal holding part serving as a pixel signal storage, which takes place in all of the pixels at the same time and in parallel. The signal obtained by converting the read-out signal held in first to eighth signal holding capacitors is read out to a predetermined signal line, and the signal obtained by converting the read-out reset signal is read out to a predetermined signal line. The signals are read out to the respective signal lines simultaneously and in parallel, and fed to the column reading circuit 40.

The following describes the configurations and functions of the pixel part 20C of the solid-state imaging device 10C.

Configuration of Unit Pixel PXLC and Pixel Part 20C

The sharing pixels PXL20C arranged in the pixel part 20C each include the photoelectric conversion reading part 220 and the signal holding part 230, as shown in FIG. 21. The pixel part 20C relating to the fourth embodiment is configured as a stacked CMOS image sensor made up by the first substrate 110 and the second substrate 120. In the present example, as shown in FIG. 21, the photoelectric conversion reading part 220 is formed in the first substrate 110, and the signal holding part 230 is formed in the second substrate 120.

The photoelectric conversion reading part 220 includes a photodiode (a photoelectric conversion element) and an in-pixel amplifier. In the example shown in FIG. 21, the photoelectric conversion reading part 220 is based on a modification example of the sharing pixel PXL20B relating to the third embodiment shown in FIG. 18, for example.

Specifically, the photoelectric conversion reading part 220 differs from the sharing pixel PXL20B of FIG. 18 in the following ways. In the photoelectric conversion reading part 220, an output buffer part 221 includes the source follower transistor SF10-Tr, a current transistor IC10-Tr, and the reading node ND11. In other words, the photoelectric conversion reading part 220 includes the current transistor IC10-Tr, instead of the selection transistor SEL10-Tr of the sharing pixel PXL20B shown in FIG. 18. The drain and source of the current transistor IC10-Tr serving as a current source element are connected between the reading node ND11 and the reference potential VSS (for example, GND). The gate of the current transistor IC10-Tr is connected to the feeding line of a control signal VBNPIX. A signal line LSGN10 between the reading node ND11 and the input part of the signal holding part 230 is driven by the current transistor IC10-Tr serving as the current source element.

In the photoelectric conversion reading part 220 relating to the fourth embodiment, the reading node ND11 of the output buffer part 221 is connected to the input part of the signal holding part 230. The photoelectric conversion reading part 220 is configured to convert the charges in the floating diffusion FD10 serving as the output node ND10 into a voltage signal at a level corresponding to the amount of charges and outputs the voltage signal VSL to the signal holding part 230.

Furthermore, the photoelectric conversion reading part 220 outputs, in a transfer period PT following the integration period PI, a voltage signal VSL corresponding to the charges stored in the photodiodes PD10, PD11, PD12 and PD13 that are transferred to the floating diffusion FD10 serving as the output node. The photoelectric conversion reading part 220 outputs a read-out reset signal (signal voltage) (VRST) and a read-out signal (signal voltage) (VSIG), as a pixel signal, to the signal holding part 230.

The signal holding part 230 of the sharing pixel 20C basically includes an input part 231 including the input node ND20, a sample-and-hold part 232, a first output part 233, a second output part 234, a third output part 235, a fourth output part 236, a fifth output part 237, a sixth output part 238, a seventh output part 239, an eighth output part 240, and holding nodes ND21, ND22, ND23, ND24, ND25, ND26, ND27 and ND28.

The input part 231 is connected to the reading node ND11 of the photoelectric conversion reading part 220 via the signal line LSGN10 and inputs, into the sample-and-hold part 232, the read-out signal (VSIG1) and the read-out reset signal (VRST1) output from the reading node ND11. s The sample-and-hold part 232 includes a first sampling transistor SHR1-Tr serving as a first switch element, a second sampling transistor SHS1-Tr serving as a second switch element, a third sampling transistor SHR2-Tr serving as a third switch element, a fourth sampling transistor SHS2-Tr serving as a fourth switch element, a fifth sampling transistor SHR3-Tr serving as a fifth switch element, a sixth sampling transistor SHS3-Tr serving as a sixth switch element, a fourth sampling transistor SHR4-Tr serving as a seventh switch element, and an eighth sampling transistor SHS4-Tr serving as an eighth switch element. The sample-and-hold part 232 further includes a first signal holding capacitor CR21, a second signal holding capacitor CS21, a third signal holding capacitor CR22, a fourth signal holding capacitor CS22, a fifth signal holding capacitor CR23, a sixth signal holding capacitor CS23, a seventh signal holding capacitor CR24, and an eighth signal holding capacitor CS24.

The first sampling transistor SHR1-Tr is connected between the holding node ND21 and the input node ND20 connected to the signal line LSGN10. The first sampling transistor SHR1-Tr keeps the first signal holding capacitor CR21 of the sample-and-hold part 232 selectively connected to the reading node ND11 of the photoelectric conversion reading part 220 via the holding node ND21 during a global shutter period or signal holding capacitor clear period. The first sampling transistor SHR1-Tr is in the conduction state during a period in which, for example, a control signal SHR1 is at the high level. The first signal holding capacitor CR21 is connected between the holding node ND21 and the reference potential VSS.

The second sampling transistor SHS1-Tr is connected between the holding node ND22 and the input node ND20 connected to the signal line LSGN10. The second sampling transistor SHS1-Tr keeps the second signal holding capacitor CS21 of the sample-and-hold part 232 selectively connected to the reading node ND11 of the photoelectric conversion reading part 220 via the holding node ND22 during a global shutter period or signal holding capacitor clear period. The second sampling transistor SHS1-Tr is in the conduction state during a period in which, for example, a control signal SHS1 is at the high level. The second signal holding capacitor CS21 is connected between the holding node ND22 and the reference potential VSS.

The third sampling transistor SHR2 Tr is connected between the holding node ND23 and the input node ND20 connected to the signal line LSGN10. The third sampling transistor SHR2-Tr keeps the third signal holding capacitor CR22 of the sample-and-hold part 232 selectively connected to the reading node ND11 of the photoelectric conversion reading part 220 via the holding node ND23 during a global shutter period or signal holding capacitor clear period. The third sampling transistor SHR2-Tr is in the conduction state during a period in which, for example, a control signal SHR2 is at the high level. The third signal holding capacitor CR22 is connected between the holding node ND23 and the reference potential VSS.

The fourth sampling transistor SHS2-Tr is connected between the holding node ND24 and the input node ND20 connected to the signal line LSGN10. The fourth sampling transistor SHS2-Tr keeps the fourth signal holding capacitor CS22 of the sample-and-hold part 232 selectively connected to the reading node ND11 of the photoelectric conversion reading part 220 via the holding node ND24 during a global shutter period or signal holding capacitor clear period. The fourth sampling transistor SHS2-Tr is in the conduction state during a period in which, for example, a control signal SHS2 is at the high level. The fourth signal holding capacitor CS22 is connected between the holding node ND24 and the reference potential VSS.

The fifth sampling transistor SHR3-Tr is connected between the holding node ND25 and the input node ND20 connected to the signal line LSGN10. The fifth sampling transistor SHR3-Tr keeps the fifth signal holding capacitor CR23 of the sample-and-hold part 232 selectively connected to the reading node ND11 of the photoelectric conversion reading part 220 via the holding node ND25 during a global shutter period or signal holding capacitor clear period. The fifth sampling transistor SHR3-Tr is in the conduction state during a period in which, for example, a control signal SHR3 is at the high level. The fifth signal holding capacitor CR23 is connected between the holding node ND25 and the reference potential VSS.

The sixth sampling transistor SHS3-Tr is connected between the holding node ND26 and the input node ND20 connected to the signal line LSGN10. The sixth sampling transistor SHS3-Tr keeps the sixth signal holding capacitor CS23 of the sample-and-hold part 232 selectively connected to the reading node ND11 of the photoelectric conversion reading part 220 via the holding node ND26 during a global shutter period or signal holding capacitor clear period. The sixth sampling transistor SHS3-Tr is in the conduction state during a period in which, for example, a control signal SHS3 is at the high level. The sixth signal holding capacitor CS23 is connected between the holding node ND26 and the reference potential VSS.

The seventh sampling transistor SHR4-Tr is connected between the holding node ND27 and the input node ND20 connected to the signal line LSGN10. The seventh sampling transistor SHR4-Tr keeps the third signal holding capacitor CR24 of the sample-and-hold part 232 selectively connected to the reading node ND11 of the photoelectric conversion reading part 220 via the holding node ND27 during a global shutter period or signal holding capacitor clear period. The seventh sampling transistor SHR4-Tr is in the conduction state during a period in which, for example, a control signal SHR4 is at the high level. The seventh signal holding capacitor CR24 is connected between the holding node ND27 and the reference potential VSS.

The eighth sampling transistor SHS4-Tr is connected between the holding node ND28 and the input node ND20 connected to the signal line LSGN10. The eighth sampling transistor SHS4-Tr keeps the eighth signal holding capacitor CS24 of the sample-and-hold part 232 selectively connected to the reading node ND112 of the photoelectric conversion reading part 220 via the holding node ND28 during a global shutter period or signal holding capacitor clear period. The eighth sampling transistor SHS4-Tr is in the conduction state during a period in which, for example, a control signal SHS4 is at the high level. The eighth signal holding capacitor CS24 is connected between the holding node ND28 and the reference potential VSS.

Note that the first, second, third, fourth, fifth, sixth, seventh and eighth sampling transistors SHR1-Tr, SHS1-Tr, SHR2-Tr, SHS2-Tr, SHR3-Tr, SHS3-Tr, SHR4-Tr and SHS4-Tr are formed by MOS transistors, such as p-channel MOS (PMOS) transistors.

The first output part 233 includes a source follower transistor SF2R-Tr serving as a second source follower element for basically outputting the signal held in the first signal holding capacitor CR21 as a signal at a level determined by the held voltage in a global shutter period, and outputs the held signal to the vertical signal line LSGN11 selectively through a selection transistor SEL1R-Tr.

The source follower transistor SF2R-Tr and the selection transistor SEL1R-Tr are connected in series between the reference potential VSS and the vertical signal line LSGN11.

The gate of the source follower transistor SF2R-Tr is connected to the holding node ND21, and the selection transistor SEL1R-Tr is controlled by a control signal SEL1 applied to the gate thereof through a control line. The selection transistor SEL1R-Tr remains selected and in the conduction state during a selection period in which the control signal SEL1 is at the L level. In this way, the source follower transistor SF2R-Tr outputs, to the vertical signal line LSGN11, read-out voltage (VRST) of a column output corresponding to the voltage held in the first signal holding capacitor CR21.

The second output part 234 includes a source follower transistor SF3S-Tr serving as a third source follower element for basically outputting the signal held in the second signal holding capacitor CS21 as a signal at a level determined by the held voltage in a global shutter period, and outputs the held signal to the vertical signal line LSGN12 selectively through a selection transistor SEL2S-Tr.

The source follower transistor SF3S-Tr and the selection transistor SEL2S-Tr are connected in series between the reference potential VSS and the vertical signal line LSGN12.

The gate of the source follower transistor SF3S-Tr is connected to the holding node ND22, and the selection transistor SEL2S-Tr is controlled by a control signal SEL2 applied to the gate thereof through a control line. The selection transistor SEL2S-Tr remains selected and in the conduction state during a selection period in which the control signal SEL2 is at the L level. In this way, the source follower transistor SF3S-Tr outputs, to the vertical signal line LSGN12, read-out voltage (VSIG) of a column output corresponding to the voltage held in the second signal holding capacitor CS21.

The third output part 235 includes a source follower transistor SF4R-Tr serving as a fourth source follower element for basically outputting the signal held in the third signal holding capacitor CR22 at a level determined by the held voltage in a global shutter period, and outputs the held signal to the vertical signal line LSGN11 selectively through the selection transistor SEL3R-Tr.

The source follower transistor SF4R-Tr and the selection transistor SEL3R-Tr are connected in series between the reference potential VSS and the vertical signal line LSGN11.

The gate of the source follower transistor SF4R-Tr is connected to the holding node ND23, and the selection transistor SEL3R-Tr is controlled by a control signal SEL3 applied to the gate thereof through a control line. The selection transistor SEL3R-Tr remains selected and in the conduction state during a selection period in which the control signal SEL3 is at the L level. In this way, the source follower transistor SF4R-Tr outputs, to the vertical signal line LSGN11, read-out voltage (VRST) of a column output corresponding to the voltage held in the third signal holding capacitor CR22.

The fourth output part 236 includes a source follower transistor SF5S-Tr serving as a fifth source follower element for basically outputting the signal held in the fourth signal holding capacitor CS22 at a level determined by the held voltage in a global shutter period, and outputs the held signal to the vertical signal line LSGN12 selectively through the selection transistor SEL4S-Tr.

The source follower transistor SF5S-Tr and the selection transistor SEL4S-Tr are connected in series between the reference potential VSS and the vertical signal line LSGN12.

The gate of the source follower transistor SFSS-Tr is connected to the holding node ND24, and the selection transistor SEL4S-Tr is controlled by a control signal SEL4 applied to the gate thereof through a control line. The selection transistor SEL4S-Tr remains selected and in the conduction state during a selection period in which the control signal SEL4 is at the L level. In this way, the source follower transistor SF5S-Tr outputs, to the vertical signal line LSGN12, read-out voltage (VSIG) of a column output corresponding to the voltage held in the fourth signal holding capacitor CS22.

The fifth output part 237 includes a source follower transistor SF6R-Tr serving as a sixth source follower element for basically outputting the signal held in the fifth signal holding capacitor CR23 at a level determined by the held voltage in a global shutter period, and outputs the held signal to the vertical signal line LSGN11 selectively through the selection transistor SEL5R-Tr.

The source follower transistor SF6R-Tr and the selection transistor SEL5R-Tr are connected in series between the reference potential VSS and the vertical signal line LSGN11.

The gate of the source follower transistor SF6R-Tr is connected to the holding node ND25, and the selection transistor SEL5R-Tr is controlled by a control signal SEL5 applied to the gate thereof through a control line. The selection transistor SEL5R-Tr remains selected and in the conduction state during a selection period in which the control signal SEL5 is at the L level. In this way, the source follower transistor SF6R-Tr outputs, to the vertical signal line LSGN11, read-out voltage (VRST) of a column output corresponding to the voltage held in the fifth signal holding capacitor CR23.

The sixth output part 238 includes a source follower transistor SF7S-Tr serving as a seventh source follower element for basically outputting the signal held in the sixth signal holding capacitor CS23 at a level determined by the held voltage in a global shutter period, and outputs the held signal to the vertical signal line LSGN12 selectively through the selection transistor SEL6S-Tr.

The source follower transistor SF7S-Tr and the selection transistor SEL6S-Tr are connected in series between the reference potential VSS and the vertical signal line LSGN12.

The gate of the source follower transistor SF7S-Tr is connected to the holding node ND26, and the selection transistor SEL6S-Tr is controlled by a control signal SEL6 applied to the gate thereof through a control line. The selection transistor SEL6S-Tr remains selected and in the conduction state during a selection period in which the control signal SEL6 is at the L level. In this way, the source follower transistor SF7S-Tr outputs, to the vertical signal line LSGN12, read-out voltage (VSIG) of a column output corresponding to the voltage held in the sixth signal holding capacitor CS23.

The seventh output part 239 includes a source follower transistor SF8R-Tr serving as an eighth source follower element for basically outputting the signal held in the seventh signal holding capacitor CR24 at a level determined by the held voltage in a global shutter period, and outputs the held signal to the vertical signal line LSGN11 selectively through the selection transistor SEL7R-Tr.

The source follower transistor SF8R-Tr and the selection transistor SEL7R-Tr are connected in series between the reference potential VSS and the vertical signal line LSGN11.

The gate of the source follower transistor SF8R-Tr is connected to the holding node ND27, and the selection transistor SEL7R-Tr is controlled by a control signal SEL7 applied to the gate thereof through a control line. The selection transistor SEL7R-Tr remains selected and in the conduction state during a selection period in which the control signal SEL7 is at the L level. In this way, the source follower transistor SF6R-Tr outputs, to the vertical signal line LSGN11, read-out voltage (VRST) of a column output corresponding to the voltage held in the seventh signal holding capacitor CR24.

The eighth output part 240 includes a source follower transistor SF9S-Tr serving as a ninth source follower element for basically outputting the signal held in the eighth signal holding capacitor CS24 at a level determined by the held voltage in a global shutter period, and outputs the held signal to the vertical signal line LSGN12 selectively through the selection transistor SEL8S-Tr.

The source follower transistor SF9S-Tr and the selection transistor SEL8S-Tr are connected in series between the reference potential VSS and the vertical signal line LSGN12.

The gate of the source follower transistor SF9S-Tr is connected to the holding node ND28, and the selection transistor SEL8S-Tr is controlled by a control signal SEL8 applied to the gate thereof through a control line. The selection transistor SEL8S-Tr remains selected and in the conduction state during a selection period in which the control signal SEL8 is at the L level. In this way, the source follower transistor SF9S-Tr outputs, to the vertical signal line LSGN12, read-out voltage (VSIG) of a column output corresponding to the voltage held in the eighth signal holding capacitor CS24.

As described above, in the solid-state imaging device 10C relating to the fourth embodiment, in the voltage mode, the pixel signal is sampled by the signal holding part 230 serving as a pixel signal storage, which takes place in all of the pixels at the same time, and the signals obtained by converting the read-out signals held in the first, second, third, fourth, fifth, sixth, seventh and eighth signal holding capacitors CR21, CS21, CR22, CS22, CR23, CS23, CR24 and CS24 are read out to the vertical signal lines LSGN11 and LSGN12 and fed to the column reading circuit 40.

In the solid-state imaging device 10C relating to the fourth embodiment, one photoelectric conversion reading part 220 has charge storage parts of a plurality of photodiodes PD, and one signal holding part 230 serves as a memory part configured to hold the signals from the respective photodiodes PD globally. The signals held in the signal holding part 230 globally are read out sequentially (rolling read-out).

Figure 22A:
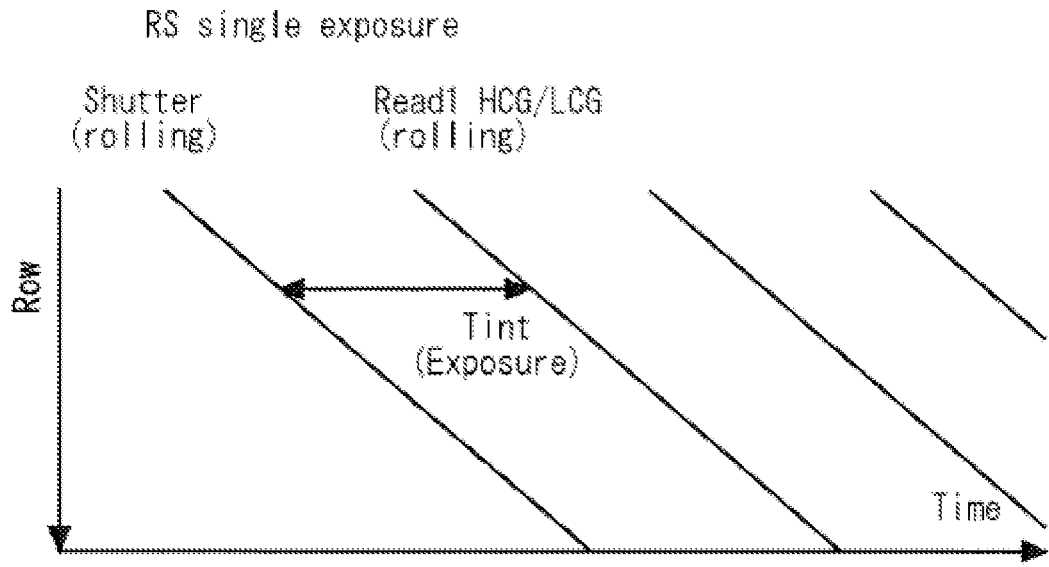
FIGS. 22A and 22B show sequences of operations to illustrate a global shutter read-out operation performed by the solid-state imaging device relating to the fourth embodiment, in comparison with a rolling shutter read-out operation.
Figure 22B:
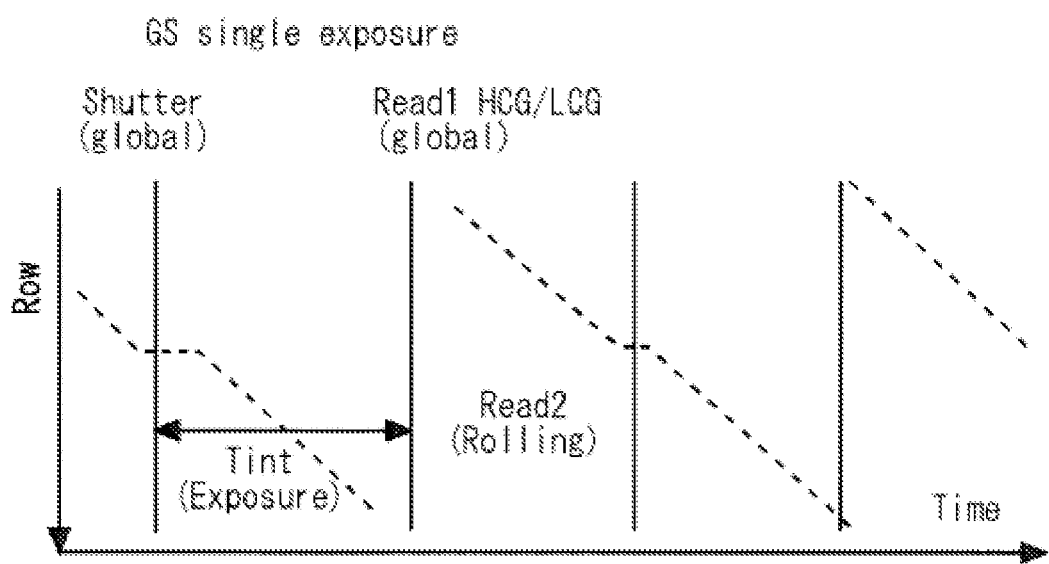
Figure 23B:
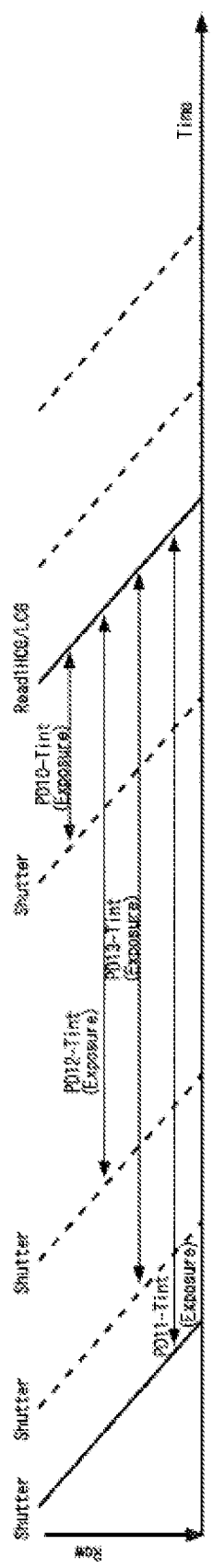
Figure 23C:
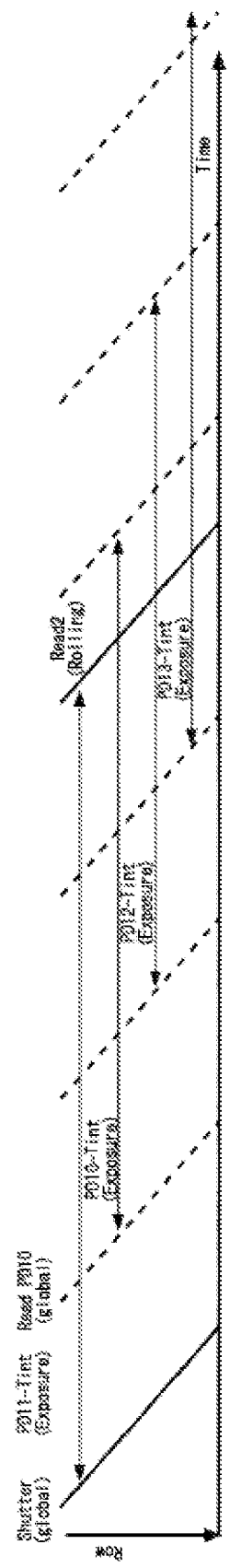
Figure 24A:
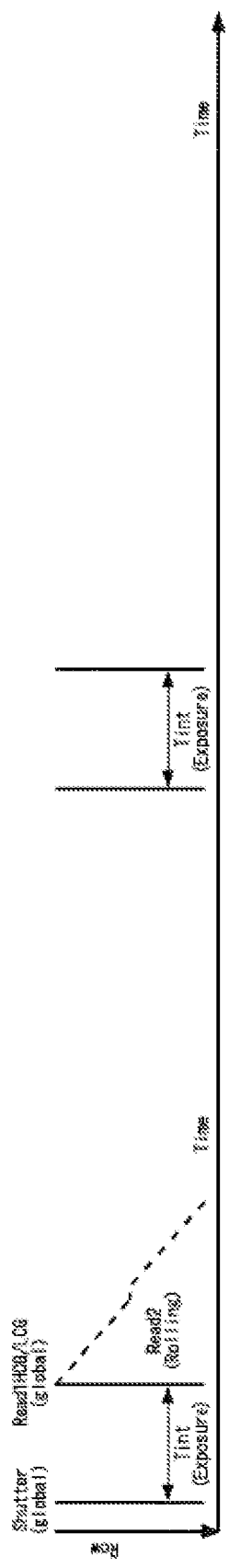
FIGS. 24A, 24B and 24C show example timing charts to illustrate a global shutter read-out operation.
Figure 24B:
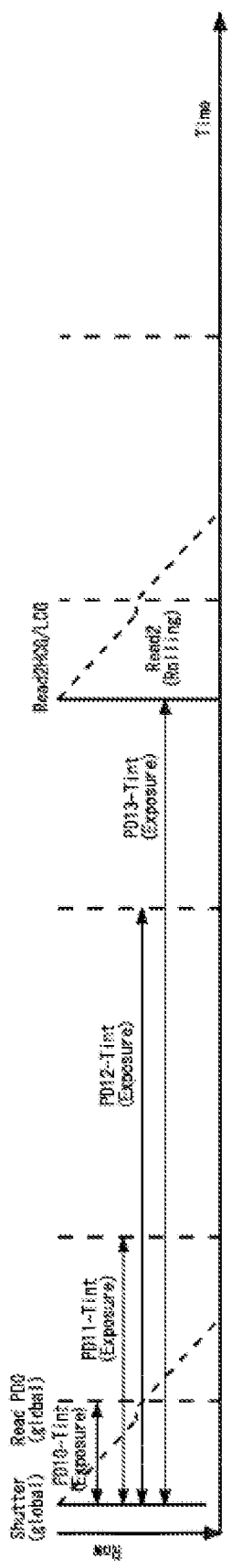
Figure 24C:
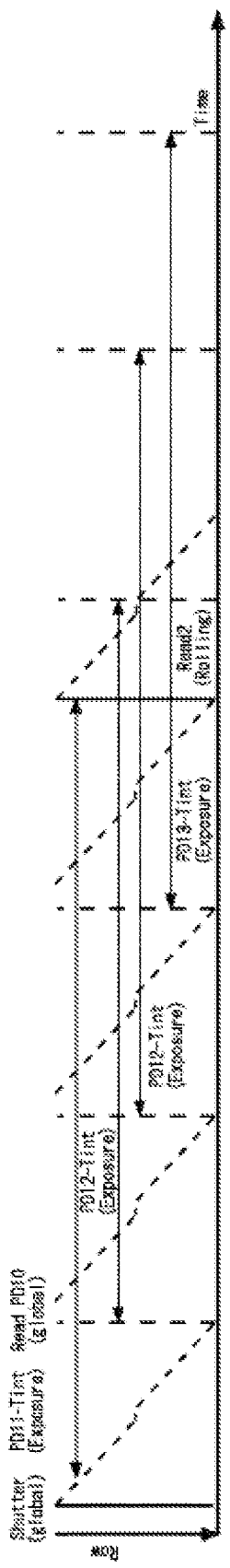

FIGS. 22A and 22B show sequences of operations to illustrate a global shutter read-out operation performed by the solid-state imaging device 10C relating to the fourth embodiment, in comparison with a rolling shutter read-out operation. FIGS. 23A, 23B and 23C show example timing charts to illustrate a rolling shutter read-out operation. FIGS. 24A, 24B and 24C show example timing charts to illustrate a global shutter read-out operation.

FIGS. 23A and 24A show, as an example, timings of operations performed when the four photodiodes PD10, PD11, PD12 and PD13 are exposed under a single condition and signals are read simultaneously and in parallel. FIGS. 23B and 24B show, as an example, timings of operations performed when the four photodiodes PD10, PD11, PD12 and PD13 are exposed under different conditions and signals are read simultaneously and in parallel. FIGS. 23C and 24C show, as an example, timings of operations performed when the four photodiodes PD10, PD11, PD12 and PD13 are exposed under different conditions and signals are read simultaneously and in parallel while the read-out period can be taken care of by a single pair of memory capacitances.

When the example circuit configuration shown in FIG. 21 is employed, the charges stored in the first photodiode PD10 serving as a first photoelectric conversion element, the charges stored in the second photodiode PD11 serving as a second photoelectric conversion element, the charges stored in the third photodiode PD12 serving as a third photoelectric conversion element and the charges stored in the fourth photodiode PD13 serving as a fourth photoelectric conversion element are respectively read out independently from each other. To begin with, the reset level of the floating diffusion FD10 of the photoelectric conversion reading part 220 is read out, and is held in the signal holding capacitors CR21, CR22, CR23 and CR24 of the signal holding part 230. Subsequently, a signal corresponding to the charges stored in the first photodiode PD10 is read out and held in the signal holding capacitor CS21 of the signal holding part 240.

Subsequently, for example, the column reading circuit 40 amplifies and AD converts the read-out reset signal VRST and the read-out signal VSIG of the pixel signal pixout, which are differential signals and fed simultaneously and in parallel, and additionally calculates the difference between the signals {VRST−VSIG} and performs the CDS.

Similarly, a signal corresponding to the charges stored in the second photodiode PD11 is read out, and held in the signal holding capacitor CS22 of the signal holding part 230. In other words, the signal from the second photodiode PD11 is read, held, subjected to the CDS and AD conversion in the same manner. Similarly, a signal corresponding to the charges stored in the third photodiode PD12 is read out and held in the signal holding capacitor CS23 of the signal holding part 230. In other words, the signal from the third photodiode PD12 is read, held, subjected to the CDS and AD conversion in the same manner. Similarly, the signal corresponding to the charges stored in the fourth photodiode PD13 is read out, and held in the signal holding capacitor CS24 of the signal holding part 230. In other words, the signal from the fourth photodiode PD13 is read, held, subjected to the CDS and AD conversion in the same manner. As a result, the pixel signals read from the first, second, third and fourth photodiodes PD10, PD11, PD12 and PD13 including low noise can be processed as, for example, phase difference information without distortion.

The pixel gain can be controlled by controlling the storage transistor BIN10-Tr (BIN switch) in accordance with the level of the signal from the PD (illuminance), so that PDAF signal processing can be performed with a widened range, in other words, phase detection auto focus (PDAF) with HDR can be achieved.

As shown in FIGS. 22A, 23A to 23C, the starting time of the integration period depends on the position of the target pixel in the row direction (Y direction) in the existing rolling read-out. Therefore, the phase difference information also depends on the vertical coordinate. This is particularly problematic when a subject is moving at a high speed. The signals from the pixels at the upper and lower edges of the pixel array are read out at different timings. The phase difference information varies depending on the position of the subject, thereby distorting the phase difference information. In the case of a global shutter, on the other hand, this issue is solved as shown in FIGS. 22B and 24A to 24C, and no distortion is caused in the phase difference information even in video images.

In the fourth embodiment, the signal holding part 230 is provided in each pixel to serve as a memory part. This allows read-out information corresponding to the charges stored in the first photodiode PD10 serving as the first photoelectric conversion element, the charges stored in the second photodiode PD11 serving as the second photoelectric conversion element, the charges stored in the third photodiode PD12 serving as the third photoelectric conversion element, and the charges stored in the fourth photodiode PD13 serving as the fourth photoelectric conversion element to be captured substantially simultaneously. Since the photodiodes PD include the shutter gate transistors SG10-Tr, SG11-Tr, SG12-Tr and SG13-Tr serving as AB (anti-blooming) gates, a signal (for example, PD11) can be saved from being mixed with another signal (PD10) while being read out. This can contribute to achieving intended photoelectric conversion characteristics.

As described above, in the solid-state imaging device 10C relating to the fourth embodiment, the pixel part 20C includes pixels, and each pixel includes the photoelectric conversion reading part 220 and the signal holding part 230. The solid-state imaging device 10C is configured, for example, as a stacked CMOS image sensor capable of operating in a global shutter mode and substantially achieving a widened dynamic range and an enhanced frame rate.

More specifically, the solid-state imaging device 10C relating to the fourth embodiment is capable of not only achieving a global shutter but also achieving a widened dynamic range and a raised frame rate since the charges overflowing from the photodiodes in the integration period can be used real time. Additionally, the fourth embodiment is capable of substantially achieving a widened dynamic range and a raised frame rate, achieving reduced noise, and maximizing the effective pixel region and value per cost.

Additionally, the solid-state imaging device 10C relating to the fourth embodiment can prevent an increase in configuration complexity and reduction in area efficiency from the perspective of layout.

The solid-state imaging device 10C relating to the fourth embodiment has a stacked structure of the first substrate (upper substrate) 110 and the second substrate (lower substrate) 120. Accordingly, the fourth embodiment can maximize the value per cost since the first substrate 110 is basically formed only with NMOS elements and the pixel array can achieve a maximized effective pixel region.

The above has described the stacked solid-state imaging device capable of performing an analog global shutter. The present invention can be also applied to solid-state imaging devices having digital pixel (pixel) sensors (DPS). In the digital pixel sensors, for example, each pixel may additionally have an ADC including a comparator (and additionally a memory part). In this way, the sensors can realize a global shutter according to which the exposure to light can start and end at the same timing in all of the pixels of the pixel array part.

The solid-state imaging devices 10, 10A, 10B, 10C described above can be applied, as an imaging device, to electronic apparatuses such as digital cameras, video cameras, mobile terminals, surveillance cameras, and medical endoscope cameras.

Figure 25:
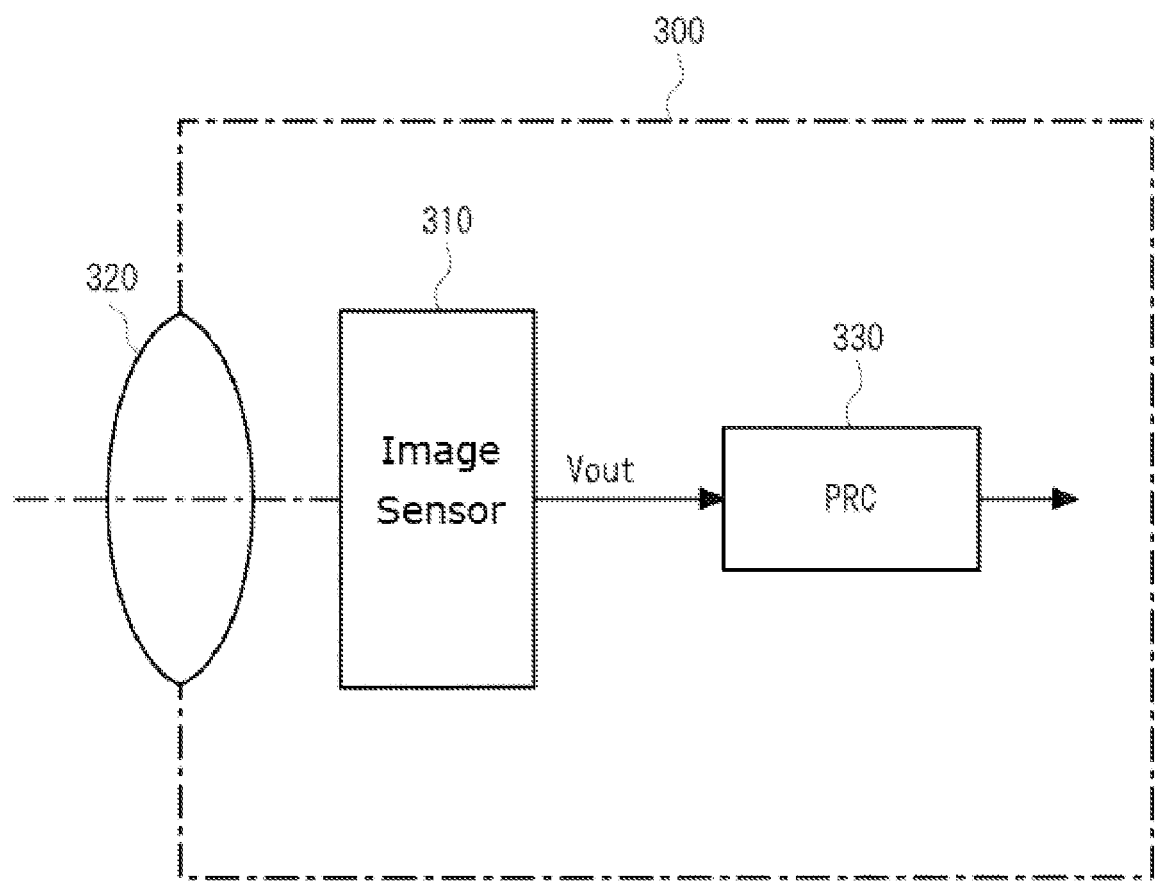
FIG. 25 shows an example configuration of an electronic apparatus to which the solid-state imaging devices relating to the embodiments of the present invention can be applied.

FIG. 25 shows an example configuration of an electronic apparatus including a camera system to which the solid-state imaging devices according to the embodiments of the present invention can be applied.

As shown in FIG. 25, the electronic apparatus 300 includes a CMOS image sensor 310 that can be constituted by the solid-state imaging devices 10, 10A, 10B and 10C relating to the embodiments of the present invention. The electronic apparatus 300 further includes an optical system (such as a lens) 320 for redirecting the incident light to the pixel region of the CMOS image sensor 310 (to form a subject image). The electronic apparatus 300 includes a signal processing circuit (PRC) 330 for processing output signals of the CMOS image sensor 310.

The signal processing circuit 330 performs predetermined signal processing on the output signals from the CMOS image sensor 310. The image signals resulting from the processing in the signal processing circuit 330 can be handled in various manners. For example, the image signals can be displayed as a video image on a monitor having a liquid crystal display, printed by a printer, or recorded directly on a storage medium such as a memory card.

As described above, a high-performance, compact, and low-cost camera system can be provided that includes the solid-state imaging device 10, 10A, 10B, 10C as the CMOS image sensor 310. Accordingly, the embodiments of the present invention can provide for electronic apparatuses such as surveillance cameras and medical endoscope cameras, which are used for applications where the cameras are installed under restricted conditions from various perspectives such as the installation size, the number of connectable cables, the length of cables and the installation height.

LIST OF REFERENCE NUMBERS 10, 10A, 10B, 10C . . . solid-state imaging device
20 . . . pixel part
PD10 . . . first photodiode
PD11 . . . second photodiode
PD12 . . . third photodiode
PD13 . . . fourth photodiode
TG10-Tr . . . first transfer transistor
TG11-Tr . . . second transfer transistor
TG12-Tr . . . third transfer transistor
TG13-Tr . . . fourth transfer transistor
SG10-Tr . . . first shutter gate transistor
SG11-Tr . . . second shutter gate transistor
SF12-Tr . . . third shutter gate transistor
SG13-Tr . . . fourth shutter gate transistor
FD10 . . . floating diffusion
RST10-Tr . . . reset transistor
SF10-Tr . . . source follower transistor
BIN10-Tr . . . storage transistor
CS . . . storage capacitor
220 . . . photoelectric conversion reading part
230 . . . signal holding part
30 . . . vertical scanning circuit
40 . . . output circuit
50 . . . timing control circuit
60 . . . reading part
300 . . . electronic apparatus
310 . . . . CMOS image sensor
320 . . . optical system
330 . . . signal processing circuit (PRC)

What is claimed is:

1. A solid-state imaging device comprising:
a pixel part having sharing pixels arranged therein, each sharing pixel being configured to perform photoelectric conversion; and
a reading part for reading a pixel signal from the each sharing pixel in the pixel part,
wherein the each sharing pixel has:
  at least three photoelectric conversion elements for storing therein, in an integration period, charges generated by photoelectric conversion;
  a plurality of transfer elements for individually transferring, in a transfer period following the integration period, the charges stored in the photoelectric conversion elements;
  a floating diffusion serving as an output node to which the charges stored in each of the photoelectric conversion elements are transferred through a corresponding one of the transfer elements;
  a reset element for resetting, in a reset period, the floating diffusion to a predetermined potential;
  a source follower element serving as an output buffer part for converting the charges in the floating diffusion into a voltage signal at a level determined by an amount of the charges and outputting the voltage signal;
  a storage element connected to the floating diffusion;
  a storage capacitance element for storing the charges received from the floating diffusion via the storage element; and
  a plurality of charge overflow gate elements connected to the photoelectric conversion elements, each of the charge overflow gate elements being configured to allow charges to overflow from a connected one of the photoelectric conversion elements toward a region where the floating diffusion is formed or toward a region other than the region where the floating diffusion is formed,
wherein the storage element is arranged between the floating diffusion and the reset element,
wherein the each sharing pixel has a gain switching part for switching the amount of charges in the floating diffusion serving as the output node between a first capacitance and a second capacitance to change a conversion gain of the source follower element serving as the output buffer part between (i) a first conversion gain corresponding to the first capacitance and (ii) a second conversion gain corresponding to the second capacitance,
wherein one floating diffusion and one source follower element are shared between the photoelectric conversion elements and between the transfer elements,
wherein the floating diffusion is arranged at a center of an element formation region, and the photoelectric conversion elements are radially arranged around the floating diffusion,
wherein the floating diffusion has a first lateral part and a second lateral part facing each other, the source follower element is adjacent to the first lateral part of the floating diffusion in a first direction orthogonal to the first lateral part, and the reset element is adjacent to the second lateral part of the floating diffusion in the first direction,
wherein the floating diffusion and the source follower element are connected together via a wiring,
wherein any ones of the photoelectric conversion elements that are adjacent to each other in a second direction orthogonal to the first direction are spaced away from each other with a first spacing therebetween that allows at least the source follower element and the reset element to be formed,
wherein any ones of the photoelectric conversion elements that are adjacent to each other in the first direction are spaced away from each other with a second spacing therebetween that is less than the first spacing,
wherein the transfer elements are provided to establish connection between (i) first-lateral-part edges of the floating diffusion at which the first lateral part terminates in the second direction and (ii) first edges of the photoelectric conversion elements facing the first-lateral-part edges, and between (I) second-lateral-part edges of the floating diffusion at which the second lateral part terminates in the second direction and (II) first edges of the photoelectric conversion elements facing the second-lateral-part edges,
wherein each of the charge overflow gate elements is connected to a second edge of the connected photoelectric conversion element that is separated from the first edge and closer to an outer edge,
wherein the reading part having a circuitry configured to, on the charges stored in at least two of the photoelectric conversion elements of the each sharing pixel:
  in a reset read-out period following the reset period, perform a second-conversion-gain reset read-out operation of reading, from the source follower element serving as the output buffer part, a second read-out reset signal resulting from conversion performed with the second conversion gain corresponding to the second capacitance of the floating diffusion serving as the output node and performing a predetermined operation on the second read-out reset signal;

cause the gain switching part to switch the gain and perform a first-conversion-gain reset read-out operation of reading, from the source follower element serving as the output buffer part, a first read-out reset signal resulting from conversion performed with the first conversion gain corresponding to the first capacitance of the floating diffusion serving as the output node and performing a predetermined operation on the first read-out reset signal;

in a first read-out period following a first transfer period following the reset read-out period, perform a first-conversion-gain read-out operation of reading, from the source follower element serving as the output buffer part, a first read-out signal resulting from conversion performed with the first conversion gain corresponding to the first capacitance of the floating diffusion serving as the output node and performing a predetermined operation on the first read-out signal; and cause the gain switching part to switch the gain after the first read-out period and perform, in a second read-out period following a second transfer period following the first read-out period, a second-conversion-gain read-out operation of reading, from the source follower element serving as the output buffer part, a second read-out signal resulting from conversion performed with the second conversion gain corresponding to the second capacitance of the floating diffusion serving as the output node and performing a predetermined operation on the second read-out signal, and wherein the circuitry of the reading part is configured to:
perform the second-conversion-gain reset read-out operation while the transfer elements, the charge overflow gate elements and the reset element remain in a non-conduction state and the storage element remains in a conduction state so that the charges in the floating diffusion serving as the output node are combined with the charges in the storage capacitance element;

perform the first-conversion-gain reset read-out operation and the first-conversion-gain read-out operation while the transfer elements, the charge overflow gate elements and the reset element remain in a non-conduction state and the storage element remains in a non-conduction state so that the charges in the floating diffusion serving as the output node are separated from the charges in the storage capacitance element; and perform the second-conversion-gain read-out operation while the transfer elements and the reset element remain in a non-conduction state, and the charge overflow gate elements and the storage element remain in a conduction state, so that the charges in the floating diffusion serving as the output node are mixed with the charges in the storage capacitance element.

2. The solid-state imaging device of claim 1, wherein an overflow path is formed in the transfer elements in a layer at least deeper than a channel formation region.

3. The solid-state imaging device of claim 2, wherein a potential of the overflow path is controllable by adjusting a gate potential of the transfer elements.

4. The solid-state imaging device according to claim 1, wherein an overflow path is formed in the charge overflow gate elements at least under a channel formation region.

5. The solid-state imaging device of claim 1, wherein the charge overflow gate elements each serve as a shutter gate for transferring the charges stored in the connected photoelectric conversion element toward the region other than the region where the floating diffusion serving as the output node is formed.

6. The solid-state imaging device of claim 5, wherein each of the transfer elements and a corresponding one of the charge overflow gate elements are driven and controlled at independently selected timings.

7. The solid-state imaging device of claim 1, wherein the charge overflow gate elements respectively have individually adjusted threshold values.

8. The solid-state imaging device of claim 1,
wherein the each sharing pixel at least has:
a first photoelectric conversion element for storing therein, in an integration period, charges generated by photoelectric conversion;
a first transfer element for transferring, in a transfer period following the integration period, the charges stored in the first photoelectric conversion element;
a second photoelectric conversion element for storing therein, in an integration period, charges generated by photoelectric conversion;
a second transfer element for transferring, in a transfer period following the integration period, the charges stored in the second photoelectric conversion element;
a third photoelectric conversion element for storing therein, in an integration period, charges generated by photoelectric conversion;
a third transfer element for transferring, in a transfer period following the integration period, the charges stored in the third photoelectric conversion element;
a fourth photoelectric conversion element for storing therein, in an integration period, charges generated by photoelectric conversion; and
a fourth transfer element for transferring, in a transfer period following the integration period, the charges stored in the fourth photoelectric conversion element, wherein, to the floating diffusion,
the charges stored in the first photoelectric conversion element are transferred through the first transfer element,
the charges stored in the second photoelectric conversion element are transferred through the second transfer element,
the charges stored in the third photoelectric conversion element are transferred through the third transfer element, and
the charges stored in the fourth photoelectric conversion element are transferred through the fourth transfer element, wherein the floating diffusion is arranged at the center of the element formation region, and the first, second, third and fourth photoelectric conversion elements are radially arranged around the floating diffusion, wherein the source follower element is adjacent to the first lateral part of the floating diffusion in the first direction orthogonal to the first lateral part, and the reset element is adjacent to the second lateral part of the floating diffusion in the first direction, wherein the floating diffusion and the source follower element are connected together via a wiring, wherein the first and second photoelectric conversion elements, and the third and fourth photoelectric conversion elements that are adjacent to each other in the second direction are spaced away from each other with the first spacing therebetween that allows at least the source follower element and the reset element to be formed, wherein the first and third photoelectric conversion elements, and the second and fourth photoelectric conversion elements that are adjacent to each other in the first direction are spaced away from each other with the second spacing that is less than the first spacing, wherein the first and second transfer elements are provided to establish connection between (i) the first-lateral-part edges of the floating diffusion at which the first lateral part terminates in the second direction and (ii) first edges of the first and second photoelectric conversion elements facing the first-lateral-part edges, and wherein the third and fourth transfer elements are provided to establish connection between (i) the second-lateral-part edges of the floating diffusion at which the second lateral part terminates in the second direction and (ii) first edges of the third and fourth photoelectric conversion elements facing the second-lateral-part edges.

9. The solid-state imaging device of claim 8, wherein the each sharing pixel has:
a first charge overflow gate element connected to the first photoelectric conversion element, the first charge overflow gate element being configured to allow charges to overflow from the connected first photoelectric conversion element toward the region where the floating diffusion is formed or toward a region other than the region where the floating diffusion is formed, a second charge overflow gate element connected to the second photoelectric conversion element, the second charge overflow gate element being configured to allow charges to overflow from the connected second photoelectric conversion element toward the region where the floating diffusion is formed or toward a region other than the region where the floating diffusion is formed, a third charge overflow gate element connected to the third photoelectric conversion element, the third charge overflow gate element being configured to allow charges to overflow from the connected third photoelectric conversion element toward the region where the floating diffusion is formed or toward a region other than the region where the floating diffusion is formed, and a fourth charge overflow gate element connected to the fourth photoelectric conversion element, the fourth charge overflow gate element being configured to allow charges to overflow from the connected fourth photoelectric conversion element toward the region where the floating diffusion is formed or toward a region other than the region where the floating diffusion is formed, wherein the first charge overflow gate element is connected to a second edge of the first photoelectric conversion element that is separated from the first edge and closer to an outer edge, wherein the second charge overflow gate element is connected to a second edge of the second photoelectric conversion element that is separated from the first edge and closer to an outer edge, wherein the third charge overflow gate element is connected to a second edge of the third photoelectric conversion element that is separated from the first edge and closer to an outer edge, and wherein the fourth charge overflow gate element is connected to a second edge of the fourth photoelectric conversion element that is separated from the first edge and closer to an outer edge.

10. The solid-state imaging device of claim 8, wherein the each sharing pixel includes:
a photoelectric conversion reading part including at least the first, second, third and fourth photoelectric conversion elements, the photoelectric conversion reading part being configured such that the charges stored in the first, second, third and fourth photoelectric conversion elements are read out to the floating diffusion serving as the output node, the source follower element serving as the output buffer converts the charges in the floating diffusion into a voltage signal at a level determined by the amount of the charges and the voltage signal is output; and a signal holding part for holding pixel signals corresponding to the charges stored in the first, second, third and fourth photoelectric conversion elements read by the photoelectric conversion reading part.

11. The solid-state imaging device of claim 10, wherein the signal holding part includes:
an input node;
a plurality of signal holding capacitors for, when the charges stored in the first, second, third or fourth photoelectric conversion element are read out, holding a read-out reset signal and a read-out signal output from a reading node of the photoelectric conversion reading part of the each sharing pixel and input into the input node;

a plurality of signal holding capacitors for, when the charges stored in the first, second, third or fourth photoelectric conversion element are read out, holding a read-out signal output from the reading node of the photoelectric conversion reading part of the each sharing pixel and input into the input node;

a plurality of switch elements for selectively connecting the signal holding capacitors to the reading node of the photoelectric conversion reading part; and a plurality of output parts each including a source follower element for converting the signal held in a corresponding one of the signal holding capacitors into a signal at a level corresponding to a held voltage, each output part being configured to selectively output the signal resulting from the conversion to a signal line.

12. The solid-state imaging device of claim 11, wherein the signal holding part includes:
an input node;
a first signal holding capacitor for, when the charges stored in the first photoelectric conversion element are read out, holding a first read-out reset signal output from the reading node of the photoelectric conversion reading part of the each sharing pixel and input into the input node;

a second signal holding capacitor for, when the charges stored in the first photoelectric conversion element are read out, holding a first read-out signal output from the reading node of the photoelectric conversion reading part of the each sharing pixel and input into the input node;

a third signal holding capacitor for, when the charges stored in the second photoelectric conversion element are read out, holding a second read-out reset signal output from the reading node of the photoelectric conversion reading part of the each sharing pixel and input into the input node;
a fourth signal holding capacitor for, when the charges stored in the second photoelectric conversion element are read out, holding a second read-out signal output from the reading node of the photoelectric conversion reading part of the each sharing pixel and input into the input node;
a fifth signal holding capacitor for, when the charges stored in the third photoelectric conversion element are read out, holding a third read-out reset signal output from the reading node of the photoelectric conversion reading part of the each sharing pixel and input into the input node;
a sixth signal holding capacitor for, when the charges stored in the third photoelectric conversion element are read out, holding a third read-out signal output from the reading node of the photoelectric conversion reading part of the each sharing pixel and input into the input node;
a seventh signal holding capacitor for, when the charges stored in the fourth photoelectric conversion element are read out, holding a fourth read-out reset signal output from the reading node of the photoelectric conversion reading part of the each sharing pixel and input into the input node;
an eighth signal holding capacitor for, when the charges stored in the fourth photoelectric conversion element are read out, holding a fourth read-out signal output from the reading node of the photoelectric conversion reading part of the each sharing pixel and input into the input node;
a first switch element for selectively connecting the first signal holding capacitor to the reading node of the photoelectric conversion reading part;
a second switch element for selectively connecting the second signal holding capacitor to the reading node of the photoelectric conversion reading part;
a third switch element for selectively connecting the third signal holding capacitor to the reading node of the photoelectric conversion reading part;
a fourth switch element for selectively connecting the fourth signal holding capacitor to the reading node of the photoelectric conversion reading part;
a fifth switch element for selectively connecting the fifth signal holding capacitor to the reading node of the photoelectric conversion reading part;
a sixth switch element for selectively connecting the sixth signal holding capacitor to the reading node of the photoelectric conversion reading part;
a seventh switch element for selectively connecting the seventh signal holding capacitor to the reading node of the photoelectric conversion reading part;
an eighth switch element for selectively connecting the eighth signal holding capacitor to the reading node of the photoelectric conversion reading part;
a first output part including a source follower element for converting the signal held in the first signal holding capacitor into a signal at a level corresponding to a held voltage, the first output part being configured to selectively output the signal resulting from the conversion to a signal line;
a second output part including a source follower element for converting the signal held in the second signal holding capacitor into a signal at a level corresponding to a held voltage, the second output part being configured to selectively output the signal resulting from the conversion to a signal line;
a third output part including a source follower element for converting the signal held in the third signal holding capacitor into a signal at a level corresponding to a held voltage, the third output part being configured to selectively output the signal resulting from the conversion to a signal line;
a fourth output part including a source follower element for converting the signal held in the fourth signal holding capacitor into a signal at a level corresponding to a held voltage, the fourth output part being configured to selectively output the signal resulting from the conversion to a signal line;
a fifth output part including a source follower element for converting the signal held in the fifth signal holding capacitor into a signal at a level corresponding to a held voltage, the fifth output part being configured to selectively output the signal resulting from the conversion to a signal line;
a sixth output part including a source follower element for converting the signal held in the sixth signal holding capacitor into a signal at a level corresponding to a held voltage, the sixth output part being configured to selectively output the signal resulting from the conversion to a signal line;
a seventh output part including a source follower element for converting the signal held in the seventh signal holding capacitor into a signal at a level corresponding to a held voltage, the seventh output part being configured to selectively output the signal resulting from the conversion to a signal line; and
an eighth output part including a source follower element for converting the signal held in the eighth signal holding capacitor into a signal at a level corresponding to a held voltage, the eighth output part being configured to selectively output the signal resulting from the conversion to a signal line.

13. An electronic apparatus comprising:
a solid-state imaging device; and
an optical system for forming a subject image on the solid-state imaging device,
wherein the solid-state imaging device includes:
a pixel part having sharing pixels arranged therein, each sharing pixel being configured to perform photoelectric conversion; and
a reading part for reading a pixel signal from the each sharing pixel in the pixel part,
wherein the each sharing pixel has:
at least three photoelectric conversion elements for storing therein, in an integration period, charges generated by photoelectric conversion;
a plurality of transfer elements for individually transferring, in a transfer period following the integration period, the charges stored in the photoelectric conversion elements;
a floating diffusion serving as an output node to which the charges stored in each of the photoelectric conversion elements are transferred through a corresponding one of the transfer elements;
a reset element for resetting, in a reset period, the floating diffusion to a predetermined potential;
a source follower element serving as an output buffer part for converting the charges in the floating diffusion into a voltage signal at a level determined by an amount of the charges and outputting the voltage signal;
a storage element connected to the floating diffusion;
a storage capacitance element for storing the charges received from the floating diffusion via the storage element; and
a plurality of charge overflow gate elements connected to the photoelectric conversion elements, each of the charge overflow gate elements being configured to allow charges to overflow from a connected one of the photoelectric conversion elements toward a region where the floating diffusion is formed or toward a region other than the region where the floating diffusion is formed,
wherein the storage element is arranged between the floating diffusion and the reset element,
wherein the each sharing pixel has a gain switching part for switching the amount of charges in the floating diffusion serving as the output node between a first capacitance and a second capacitance to change a conversion gain of the source follower element serving as the output buffer part between (i) a first conversion gain corresponding to the first capacitance and (ii) a second conversion gain corresponding to the second capacitance,
wherein one floating diffusion and one source follower element are shared between the photoelectric conversion elements and between the transfer elements,
wherein the floating diffusion is arranged at a center of an element formation region, and the photoelectric conversion elements are radially arranged around the floating diffusion,
wherein the floating diffusion has a first lateral part and a second lateral part facing each other, the source follower element is adjacent to the first lateral part of the floating diffusion in a first direction orthogonal to the first lateral part, and the reset element is adjacent to the second lateral part of the floating diffusion in the first direction,
wherein the floating diffusion and the source follower element are connected together via a wiring,
wherein any ones of the photoelectric conversion elements that are adjacent to each other in a second direction orthogonal to the first direction are spaced away from each other with a first spacing therebetween that allows at least the source follower element and the reset element to be formed,
wherein any ones of the photoelectric conversion elements that are adjacent to each other in the first direction are spaced away from each other with a second spacing therebetween that is less than the first spacing,
wherein the transfer elements are provided to establish connection between (i) first-lateral-part edges of the floating diffusion at which the first lateral part terminates in the second direction and (ii) first edges of the photoelectric conversion elements facing the first-lateral-part edges, and between (I) second-lateral-part edges of the floating diffusion at which the second lateral part terminates in the second direction and (II) first edges of the photoelectric conversion elements facing the second-lateral-part edges,
wherein each of the charge overflow gate elements is connected to a second edge of the connected photoelectric conversion element that is separated from the first edge and closer to an outer edge,
wherein the reading part is configured to, on the charges stored in at least two of the photoelectric conversion elements of the each sharing pixel:
in a reset read-out period following the reset period, perform a second-conversion-gain reset read-out operation of reading, from the source follower element serving as the output buffer part, a second read-out reset signal resulting from conversion performed with the second conversion gain corresponding to the second capacitance of the floating diffusion serving as the output node and performing a predetermined operation on the second read-out reset signal;
cause the gain switching part to switch the gain and perform a first-conversion-gain reset read-out operation of reading, from the source follower element serving as the output buffer part, a first read-out reset signal resulting from conversion performed with the first conversion gain corresponding to the first capacitance of the floating diffusion serving as the output node and performing a predetermined operation on the first read-out reset signal;
in a first read-out period following a first transfer period following the reset read-out period, perform a first-conversion-gain read-out operation of reading, from the source follower element serving as the output buffer part, a first read-out signal resulting from conversion performed with the first conversion gain corresponding to the first capacitance of the floating diffusion serving as the output node and performing a predetermined operation on the first read-out signal; and
cause the gain switching part to switch the gain after the first read-out period and perform, in a second read-out period following a second transfer period following the first read-out period, a second-conversion-gain read-out operation of reading, from the source follower element serving as the output buffer part, a second read-out signal resulting from conversion performed with the second conversion gain corresponding to the second capacitance of the floating diffusion serving as the output node and performing a predetermined operation on the second read-out signal, and
wherein the reading part:
performs the second-conversion-gain reset read-out operation while the transfer elements, the charge overflow gate elements and the reset element remain in a non-conduction state and the storage element remains in a conduction state so that the charges in the floating diffusion serving as the output node are combined with the charges in the storage capacitance element;
performs the first-conversion-gain reset read-out operation and the first-conversion-gain read-out operation while the transfer elements, the charge overflow gate elements and the reset element remain in a non-conduction state and the storage element remains in a non-conduction state so that the charges in the floating diffusion serving as the output node are separated from the charges in the storage capacitance element; and
performs the second-conversion-gain read-out operation while the transfer elements and the reset element remain in a non-conduction state, and the charge overflow gate elements and the storage element remain in a conduction state, so that the charges in the floating diffusion serving as the output node are mixed with the charges in the storage capacitance element.

\* \* \* \* \*